(12) United States Patent
Yoshinaga et al.

(10) Patent No.: US 8,014,224 B2
(45) Date of Patent: *Sep. 6, 2011

(54) SEMICONDUCTOR DEVICE

(75) Inventors: Kenji Yoshinaga, Hyogo (JP); Fukashi Morishita, Tokyo (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 315 days.

This patent is subject to a terminal disclaimer.

(21) Appl. No.: 12/201,024

(22) Filed: Aug. 29, 2008

(65) Prior Publication Data
US 2009/0003091 A1 Jan. 1, 2009

Related U.S. Application Data

(63) Continuation of application No. 11/503,941, filed on Aug. 15, 2006, now Pat. No. 7,430,149.

(30) Foreign Application Priority Data

Sep. 1, 2005 (JP) .................................. 2005-253508

(51) Int. Cl.
*G11C 5/14* (2006.01)

(52) U.S. Cl. ......... 365/226; 365/227; 365/228; 365/229

(58) Field of Classification Search .................. 365/226, 365/227, 228, 229
See application file for complete search history.

(56) References Cited

U.S. PATENT DOCUMENTS

| 6,154,396 | A | 11/2000 | Yabe et al. |
| 6,307,801 | B1 | 10/2001 | Ogawa et al. |
| 6,418,067 | B1 | 7/2002 | Watanabe et al. |
| 7,408,818 | B2 * | 8/2008 | Yoshinaga et al. ........ 365/189.09 |
| 7,430,149 | B2 * | 9/2008 | Yoshinaga et al. ............ 365/226 |
| 7,656,738 | B2 * | 2/2010 | Namekawa .............. 365/230.04 |
| 2002/0011883 | A1 | 1/2002 | Yamazaki |
| 2007/0216467 | A1 | 9/2007 | Akiyama et al. |

FOREIGN PATENT DOCUMENTS

JP 6-224648 8/1994

(Continued)

OTHER PUBLICATIONS

Japanese Office Action mailed Feb. 8, 2011 in counterpart Application JP 2005-253508, 3 pages with English language translation.

*Primary Examiner* — Pho M Luu
(74) *Attorney, Agent, or Firm* — Buchanan Ingersoll & Rooney PC

(57) ABSTRACT

There is provided a semiconductor device supplied with internal power generated by an internal power generation circuit to perform a stable operation and, also, suppress power consumption. A control circuit, a row/column decoder and a sense amplifier are driven by an internal buck voltage. On the other hand, a data path with high power consumption is driven by an external power supply voltage. A level conversion circuit receives an address signal or a command signal having a voltage level of the external power supply voltage, converts the voltage level to the internal buck voltage, and outputs a resultant signal to the control circuit. A level conversion circuit receives a control signal having a voltage level of the internal buck voltage from the control circuit, converts the voltage level to the external power supply voltage, and outputs a resultant signal to the data path.

8 Claims, 37 Drawing Sheets

FOREIGN PATENT DOCUMENTS

| | | |
|---|---|---|
| JP | 11-135729 | 5/1999 |
| JP | 2000-011671 A | 1/2000 |
| JP | 2001-084791 | 3/2001 |
| JP | 2002-0042459 | 2/2002 |
| JP | 2002-074967 A | 3/2002 |
| JP | 2003-279420 A | 10/2003 |
| JP | 2004-187150 A | 7/2004 |
| JP | 2004-318235 A | 11/2004 |

\* cited by examiner

FIG.15

| | | STANDBY MODE | DEEP STANDBY 1 (EXTERNAL POWER DIRECT-CONNECTION) | DEEP STANDBY 2 (POWER-OFF) |
|---|---|---|---|---|
| INTERNAL POWER | VddT | 1.5V | VddL(1.5V) | FLOATING (Hi-Z) |
| | Vpp | 2.0V | VddL(1.5V) | FLOATING (Hi-Z) |
| | Vneg | -0.5V | Gnd | FLOATING (Hi-Z) |
| | Vbl, Vcp | 0.75V | FLOATING (Hi-Z) | FLOATING (Hi-Z) |
| REFERENCE VOLTAGE | VrefS | 1.5V | VddT | FLOATING (Hi-Z) |
| | VrefP | 2.0V | VddT | FLOATING (Hi-Z) |
| | VrefN | 0.75V | FLOATING (Hi-Z) | FLOATING (Hi-Z) |
| CONSTANT CURRENT | ICONST | 1.8V | VddH | VddH |
| | BIASL | 0.6V | Gnd | Gnd |
| RECOVERY TIME TO STANDBY MODE | | — | ABOUT 15 $\mu$s | ABOUT 200 $\mu$s |
| STANDBY DC CURRENT AT POWER SUPPLY MODULE | | <9$\mu$A | ONLY OFF LEAK | ONLY OFF LEAK |
| STANDBY DC CURRENT AT MEMORY MACRO | | ONLY OFF LEAK (~200 $\mu$A) | ONLY OFF LEAK (~180 $\mu$A) | WITHOUT OFF LEAK |

REFERENCE VOLTAGE
GENERATION CIRCUIT (VrefN)

SEMICONDUCTOR DEVICE

CROSS REFERENCE TO RELATED APPLICATION

This application is a Continuation Application of application Ser. No. 11/503,941, filed Aug. 15, 2006, now issued as U.S. Pat. No. 7,430,149.

BACKGROUND OF THE INVENTION

1. Field of the Invention

The present invention relates to a semiconductor device. In particular, the present invention relates to a logic integrated memory device in which a logic circuit and a memory are mounted on a single chip. More specifically, the present invention relates to generation of internal power to be supplied to a logic integrated memory device.

2. Description of the Background Art

Recent advancement of a semiconductor fabrication technique makes it possible to realize a logic integrated memory device in which a logic circuit and a memory capable of accessing data in the logic circuit are mounted on a single chip. This logic integrated memory device can enhance a transfer rate between the logic circuit and the memory and, therefore, makes it possible to realize processing at a higher speed. In addition, this logic integrated memory device can be reduced in size and, therefore, is positively applied to a portable telephone and the like.

As described above, the logic integrated memory device is applied to a portable telephone and, therefore, must be stably operated even when a battery with a relatively large variation in voltage is used as an external power supply. For this reason, a general logic integrated memory device includes an internal power generation circuit supplied with external power to generate stable internal power with a small variation in voltage. The internal power generation circuit generates internal power based on a reference voltage generated by a reference voltage generation circuit.

Therefore, the reference voltage generation circuit is configured to generate a reference voltage with a small variation with respect to various stationary disturbances and dynamic disturbances such as a variation in voltage of external power, a variation in process, a change in ambient temperature, and an intrusion of noise. For example, Japanese Patent Laying-Open Publication No. 2004-318235 discloses a reference voltage generation circuit capable of changing temperature dependence of a reference voltage from a predetermined positive temperature characteristic to a predetermined negative temperature characteristic in order to prevent internal power from being varied due to a change in ambient temperature.

On the other hand, a logic integrated memory device to be applied to a portable telephone or the like must suppress its power consumption to reduce a consumption amount of power in a battery and to prolong an operation time. In order to reduce conversion loss in an internal power generation circuit, therefore, such a logic integrated memory device may be directly driven with an external power supply (a battery).

However, if the logic integrated memory device is directly driven with an external power supply, a variation in voltage becomes large. Consequently, there arises a problem that a stable operation can not be ensured. Accordingly, it is difficult to realize a configuration capable of achieving both a stable operation and lower power consumption.

SUMMARY OF THE INVENTION

An object of the present invention is to provide a semiconductor device supplied with internal power generated by an internal power generation circuit to realize a stable operation and, also, suppress power consumption.

According to a first aspect of the present invention, a semiconductor device includes a power supply module for bucking a first external voltage, supplied externally, to supply an internal buck voltage, a logic circuit portion for performing a logical operation based on data to be input, and a memory macro. Herein, the memory macro includes a memory array having a plurality of memory cells, each holding data to be used in the logic circuit portion, arranged in a matrix, a first load circuit having a sense amplifier for sensing data on a bit line connected to a memory cell, the first load circuit being supplied with the internal buck voltage, and a second load circuit having a data input/output circuit for performing data input/output between the logic circuit portion and a memory cell, the second load circuit being supplied with a second external voltage, supplied externally, lower than the first external voltage.

According to a second aspect of the present invention, a semiconductor device includes a logic circuit portion for performing a logical operation based on data to be input, a memory macro, and a power supply module. Herein, the memory macro includes a memory array having a plurality of memory cells, each holding data used in the logic circuit portion, arranged in a matrix, a data input/output circuit supplied with an external low voltage externally, and performing data input/output between the logic circuit portion and a memory cell, a refresh circuit for refreshing data of a memory cell, and a control circuit for stopping input/output of data to/from the logic circuit portion via the input/output circuit, on receiving a first standby instruction signal indicating activation of the refresh circuit, and outputting an activation signal to the refresh circuit. Further, the power supply module includes an internal buck voltage circuit for supplying an internal buck voltage, supplied externally and obtained by bucking an external high voltage higher than the external low voltage, to an internal power supply line provided in the memory macro, and a standby circuit for receiving a second standby instruction signal for stopping the input/output of data to/from the logic circuit portion via the input/output circuit and instructing deactivation of the refresh circuit, deactivating the internal buck voltage circuit, and supplying the external low voltage to the internal power supply line.

According to a third aspect of the present invention, a semiconductor device includes a reference voltage generation circuit for generating a reference voltage, a plurality of internal power generation circuits each generating an internal voltage from an external voltage in accordance with the reference voltage generated by the reference voltage generation circuit, a plurality of memory macros corresponding to the plurality of internal power generation circuits, each memory macro supplied with the internal voltage to be driven, and a standby circuit shifting to a standby state to suppress power consumption in accordance with an external instruction. Herein, each of the plurality of memory macros includes a memory array having a plurality of memory cells, each holding data, arranged in a matrix, and a sense amplifier for sensing data on a bit line connected to a memory cell, wirings for the internal voltages output from the plurality of internal power generation circuits are connected in common, and the standby circuit in the standby mode suppresses drive currents in a predetermined number of internal power generation circuits from among the plurality of internal power generation circuits.

According to a fourth aspect of the present invention, a semiconductor device includes a power supply module for bucking an external voltage supplied externally to supply an internal buck voltage, a logic circuit portion for performing a logical operation based on data to be input, and a memory macro including a memory array having a plurality of memory cells, each holding data, arranged in a matrix, and a sense amplifier for sensing data on a bit line connected to a memory cell. Herein, the power supply module includes a reference voltage generation circuit for supplying a first reference voltage used as a reference in order to supply the internal buck voltage, a pump circuit supplied with the external voltage as a positive voltage for generating an internal voltage as a negative voltage, and a detector circuit for controlling the pump circuit, and the detector circuit generates the negative voltage by using a voltage obtained by distributing the internal buck voltage at a predetermined ratio to generate a second reference voltage used as a reference, and generates a control signal for controlling the pump circuit by comparing the second reference voltage with the negative voltage output from the pump circuit.

According to a fifth aspect of the present invention, a semiconductor device includes a power supply module for bucking an external voltage supplied externally to supply a plurality of internal voltages, a logic circuit portion for performing a logical operation based on data to be input, and a memory macro including a memory array having a plurality of memory cells, each holding data, arranged in a matrix, and a sense amplifier for sensing data on a bit line connected to a memory cell. Herein, the power supply module includes an internal buck voltage circuit for bucking the external voltage to generate first and second internal voltages, a pump circuit supplied with the external voltage as a positive voltage for generating an internal voltage as a negative voltage, and a detector circuit for controlling the pump circuit, the second internal voltage has a voltage value between the first internal voltage and the external voltage, and the detector circuit compares a first intermediate voltage generated from the first internal voltage and a ground voltage with a second intermediate voltage generated from the second internal voltage and a negative voltage output from the pump circuit, and generates a control signal for controlling the pump circuit.

In the semiconductor device according to the first aspect of the present invention, a first load circuit having a sense amplifier is supplied with an internal buck voltage from a power supply module, and a data input/output circuit for performing input/output of data to/from a logic circuit portion is supplied with a second external voltage. Thus, it is possible to stably operate a sense amplifier supplied with an internal buck voltage and, also, to suppress power consumption in a second load circuit.

In the semiconductor device according to the second aspect of the present invention, a standby circuit receives a second standby instruction and, then, supplies an external low voltage to an internal power supply line in place of an internal buck voltage. Thus, it is possible to stably operate a memory macro supplied with an external low voltage and, also, to suppress power consumption in a case that the memory macro receives a second standby instruction.

In the semiconductor device according to the third aspect of the present invention, in a standby mode, from among a plurality of internal power generation circuits for supplying internal voltages to a plurality of memory macros, driving currents for a predetermined number of internal power generation circuits are suppressed and internal voltages are supplied from the remaining internal power supply generation circuits. Thus, an internal voltage is supplied to a memory macro, so that it is possible to stably operate the memory macro and, also, to suppress power consumption in the standby mode.

In the semiconductor device according to the fourth aspect of the present invention, a detector circuit generates a second reference voltage used as a reference for generating a negative voltage with an internal buck voltage, and controls a pump circuit based on a relation among the second reference voltage, a first reference voltage and a negative voltage output from the pump circuit. Thus, it is unnecessary to use a dedicated circuit for generating a voltage used as a reference for generating a negative voltage. Therefore, it is possible to suppress power consumption.

In the semiconductor device according to the fifth aspect of the present invention, a detector circuit compares a first intermediate voltage generated from a first internal voltage and a ground voltage with a second intermediate voltage generated from a second internal voltage and a negative voltage output from a pump circuit, and generates a control signal for controlling the pump circuit. Thus, it is unnecessary to use a dedicated circuit for generating a voltage used as a reference for generating a negative voltage. Therefore, it is possible to suppress power consumption.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 15 shows transition statuses of internal power and a reference voltage in deep standby modes 1 and 2;

DESCRIPTION OF THE PREFERRED EMBODIMENTS

Hereinafter, detailed description will be given of embodiments of the present invention with reference to the drawings. In the following description, the same reference symbols refer to the same or corresponding components in the respective drawings; therefore, detailed description thereof will not be repeated here.

First Embodiment

Figure 1:
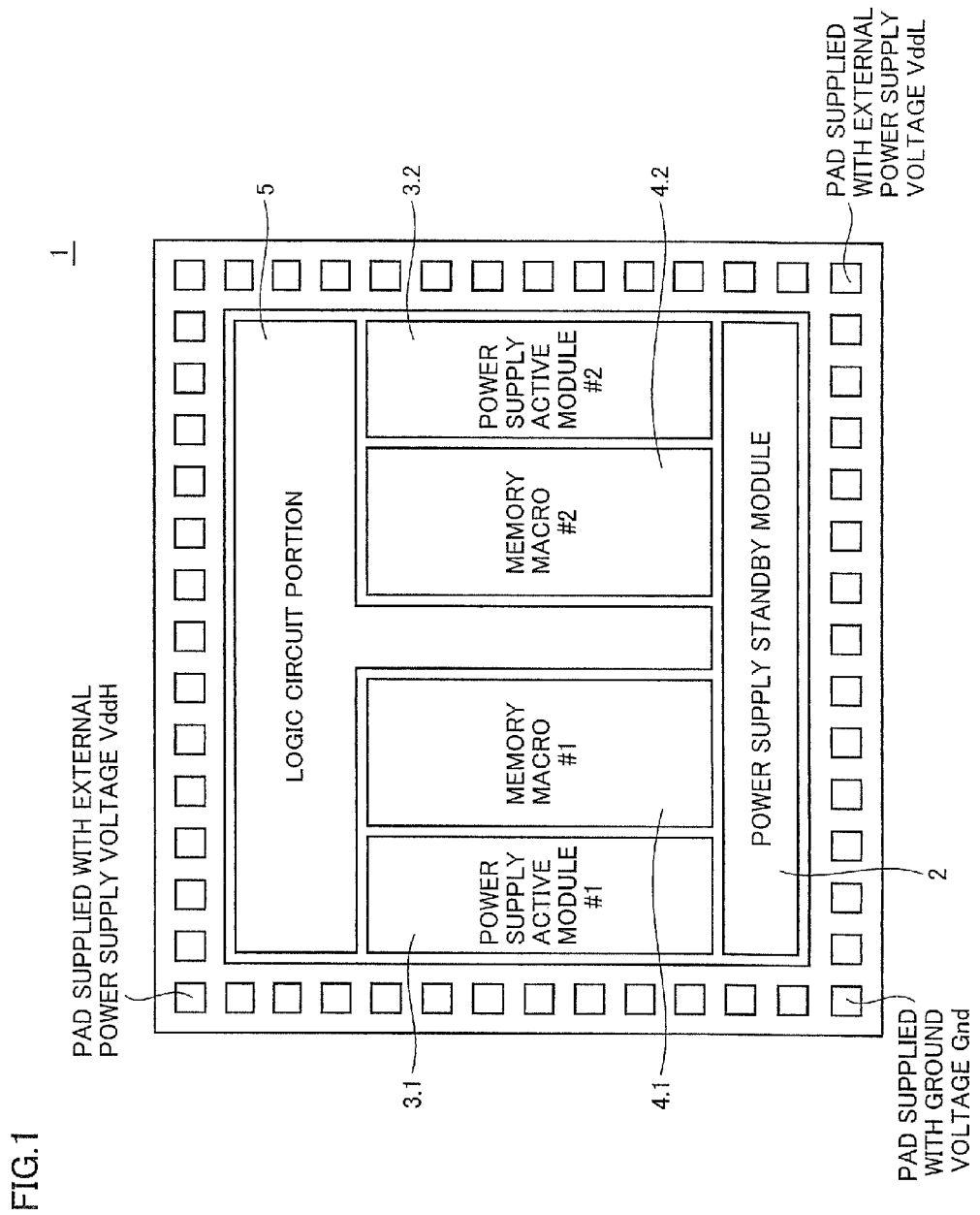
FIG. 1 is a schematic layout diagram illustrating a semiconductor device according to a first embodiment.

With reference to FIG. 1, a semiconductor device 1 according to a first embodiment is a logic integrated memory device including a logic circuit portion 5, memory macros 4.1 and 4.2, power supply active modules 3.1 and 3.2, and a power supply standby module 2, each mounted on a single chip. Further, pads for supplying external power to semiconductor device 1 are successively arranged so as to surround the aforementioned components. Examples of the external power to be supplied to semiconductor device 1 include external power supply voltages VddH and VddL, and a ground voltage Gnd.

Logic circuit portion 5 includes a CPU (Central Processing Unit), an analog-to-digital converter, a digital-to-analog converter, and the like, and performs a logical operation based on data to be input. Logic circuit portion 5 is supplied with an external power supply voltage VddL to be driven.

Each of memory macros 4.1 and 4.2 is mounted so as to be adjacent to logic circuit portion 5, holds data received from logic circuit portion 5 and the like, and outputs the data to logic circuit portion 5 and the like.

Power supply active modules 3.1 and 3.2 are mounted in correspondence with memory macros 4.1 and 4.2 to supply internal power to memory macros 4.1 and 4.2, respectively.

Power supply standby module 2 outputs a reference voltage used by power supply active modules 3.1 and 3.2 for generating internal power.

Figure 2:
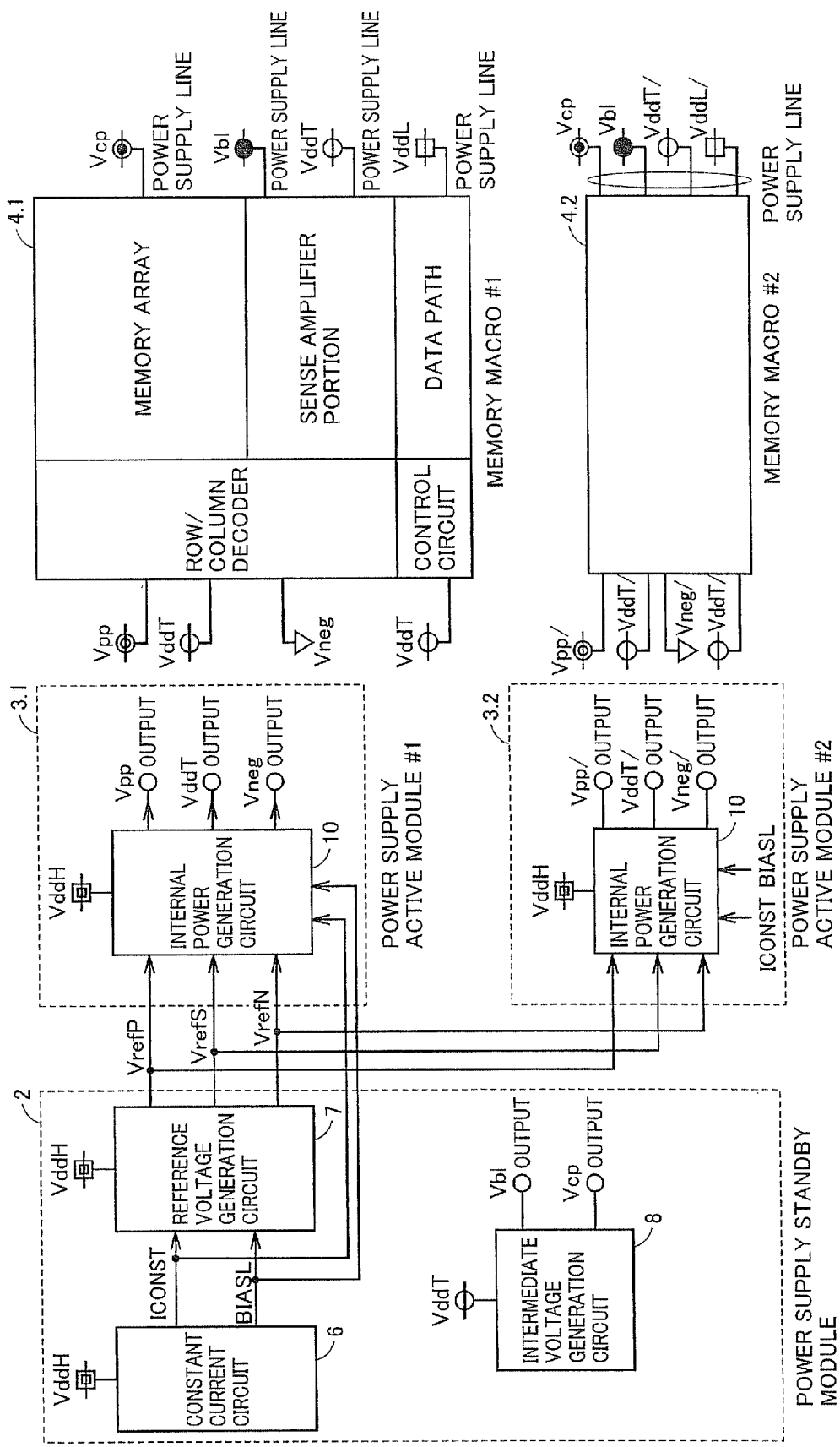
FIG. 2 is a schematic configuration diagram illustrating substantial portion of the semiconductor device according to the first embodiment.

With reference to FIG. 2, power supply standby module 2 includes a constant current circuit 6, a reference voltage generation circuit 7 and an intermediate voltage generation circuit 8.

Constant current circuit 6 is supplied with an external power supply voltage VddH (e.g., 2.5 V), generates a constant current ICONST, outputs constant current ICONST to reference voltage generation circuit 7 and an internal power generation circuit 10, generates a bias voltage BIASL, and outputs bias voltage BIASL to reference voltage generation circuit 7 and internal power generation circuit 10. Herein, external power supply voltage VddH is I/O power for driving the analog-to-digital converter and the digital-to-analog converter included in logic circuit portion 5.

In place of external power supply voltage VddH, there may be used an external power supply voltage VddL (e.g., 1.5 V) which is used for driving a logic transistor included in logic circuit portion 5 and is lower than external power supply voltage VddH. Alternatively, there may be used internal power to be described later.

Reference voltage generation circuit 7 is supplied with a constant current ICONST and a bias voltage BIASL from constant current circuit 6, generates reference voltages VrefP (e.g., 2.0 V), VrefS (e.g., 1.5 V) and VrefN (e.g., 0.75 V) from an external power supply voltage VddH, and outputs these reference voltages to power supply active modules 3.1 and 3.2.

Intermediate voltage generation circuit 8 is supplied with an internal buck voltage VddT generated by each of power supply active modules 3.1 and 3.2 and, herein, generates intermediate voltages Vbl and Vcp each corresponding to a half of internal buck voltage VddT.

Power supply active module 3.1 includes internal power generation circuit 10.

In accordance with reference voltages VrefP, VrefS and VrefN supplied from reference voltage generation circuit 7, internal power generation circuit 10 generates a boost voltage Vpp (e.g., 2.0 V), an internal buck voltage VddT (e.g., 1.5 V) and a negative voltage Vneg (e.g., −0.5 V) from an external power supply voltage VddH. Herein, boost voltage Vpp is a voltage for driving a transistor which equalizes a bit line pair of a memory array to be described later. Internal buck voltage VddT is a voltage for writing H (high voltage) to a memory cell in a memory array. Negative voltage Vneg is a voltage for writing L (low voltage) to the memory cell. As will be described later, since a memory array is formed of a thin-film transistor, a boost voltage Vpp is generated by bucking an external power supply voltage VddH. Therefore, a boost voltage Vpp has a voltage value between an external power supply voltage VddH and an internal buck voltage VddT. An internal buck voltage VddT is generated by bucking an external power supply voltage VddH.

Power supply active module 3.2 is similar to power supply active module 3.1; therefore, detailed description thereof will not be repeated here.

Each of memory macros 4.1 and 4.2 is driven supplied with an external power supply voltage VddL supplied externally and a boost voltage Vpp, an internal buck voltage VddT, a negative voltage Vneg, and an intermediate voltage Vbl/Vcp each output from internal power generation circuit 10.

Figure 3:
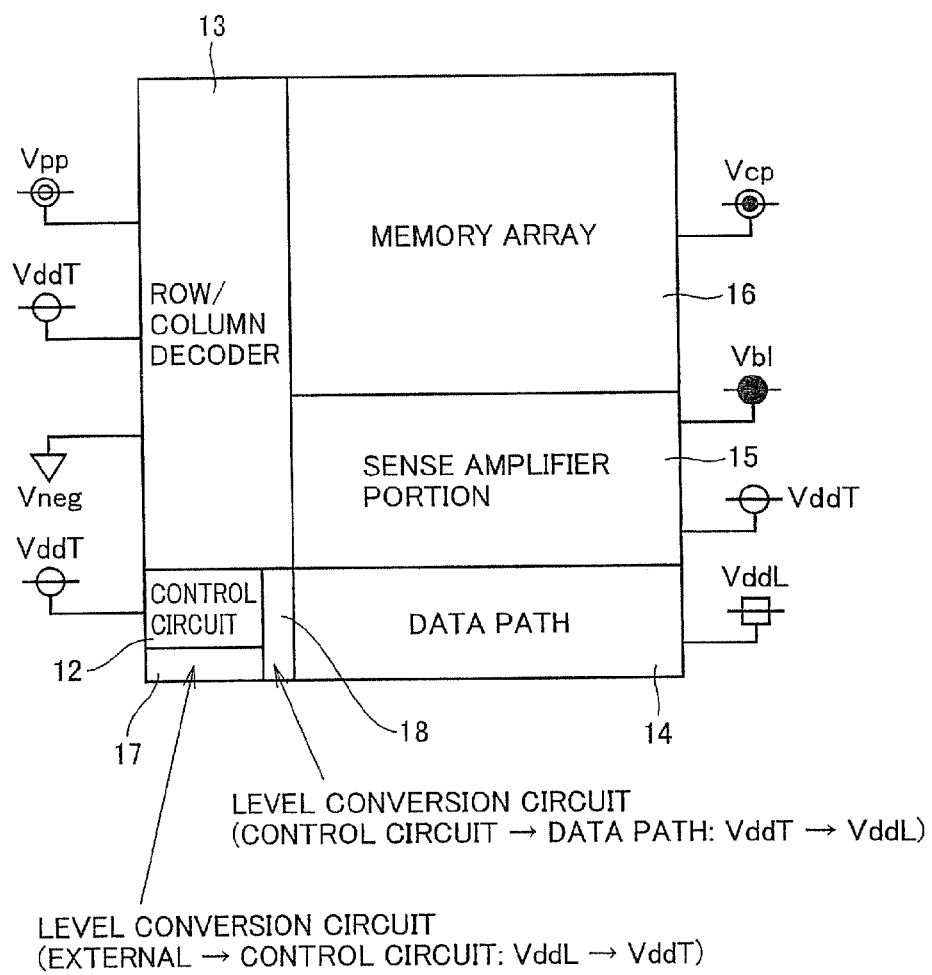
FIG. 3 is a schematic configuration diagram illustrating a memory macro according to the first embodiment.

With reference to FIG. 3, memory macro 4.1 according to the first embodiment includes a control circuit 12, a row/column decoder 13, a data path 14, a sense amplifier portion 15, a memory array 16, and level conversion circuits 17 and 18.

Memory array 16 is configured by a plurality of memory cells arranged in a matrix. Herein, a memory cell is selected in accordance with an address signal for specifying a row address and a column address in memory array 16, and data is written to or read from the selected memory cell.

In accordance with a control signal from control circuit 12, row/column decoder 13 selects a memory cell, to which or from which data is written or read, from the memory cells configuring memory array 16. Row/column decoder 1.3 supplied with an internal buck voltage VddT to be driven.

In accordance with a selection signal from control circuit 12, sense amplifier portion 15 selects a column of a specific memory cell in memory array 16, and detects a minute potential difference generated at both ends of a bit line pair. Sense amplifier portion 15 is supplied with an internal buck voltage VddT to be driven.

In accordance with a control signal from control circuit 12, data path 14 gives a data value, received from an external logic circuit and the like, to a bit line pair or outputs a data value, corresponding to a voltage detected by sense amplifier portion 15, to an external logic circuit and the like. Data path 14 is supplied with an external power supply voltage VddL to be driven.

Control circuit 12 receives an address signal indicating a memory cell to which or from which data is written or read and a command signal indicating operations of memory macro 4.1, such as data write and data read, and transmits control signals to row/column decoder 13 and data path 14, respectively. Control circuit 12 is supplied with an internal buck voltage VddT to be driven.

Level conversion circuit 17 is interposed on an input side of control circuit 12 where control circuit 12 receives the address signal and a command signal. Level conversion circuit 17 receives the address signal and the command signal, converts signal levels of these signals from an external power supply voltage VddL to an internal buck voltage VddT, and outputs resultant signals to control circuit 12.

Level conversion circuit 18 is interposed between an output side of control circuit 12 and data path 14. Level conversion circuit 18 receives a control signal output from control circuit 12, converts a signal level of the control signal from an internal buck voltage VddT to an external power supply voltage VddL, and outputs a resultant signal to data path 14.

From among constituent elements of memory macro 4.1, as described above, each row/column decoder 13, sense amplifier portion 15 and control circuit 12 is supplied with an internal buck voltage VddT serving as internal power to be driven; however, data path 14 is supplied with an external power supply voltage VddL to be driven serving as external power.

Figure 4:
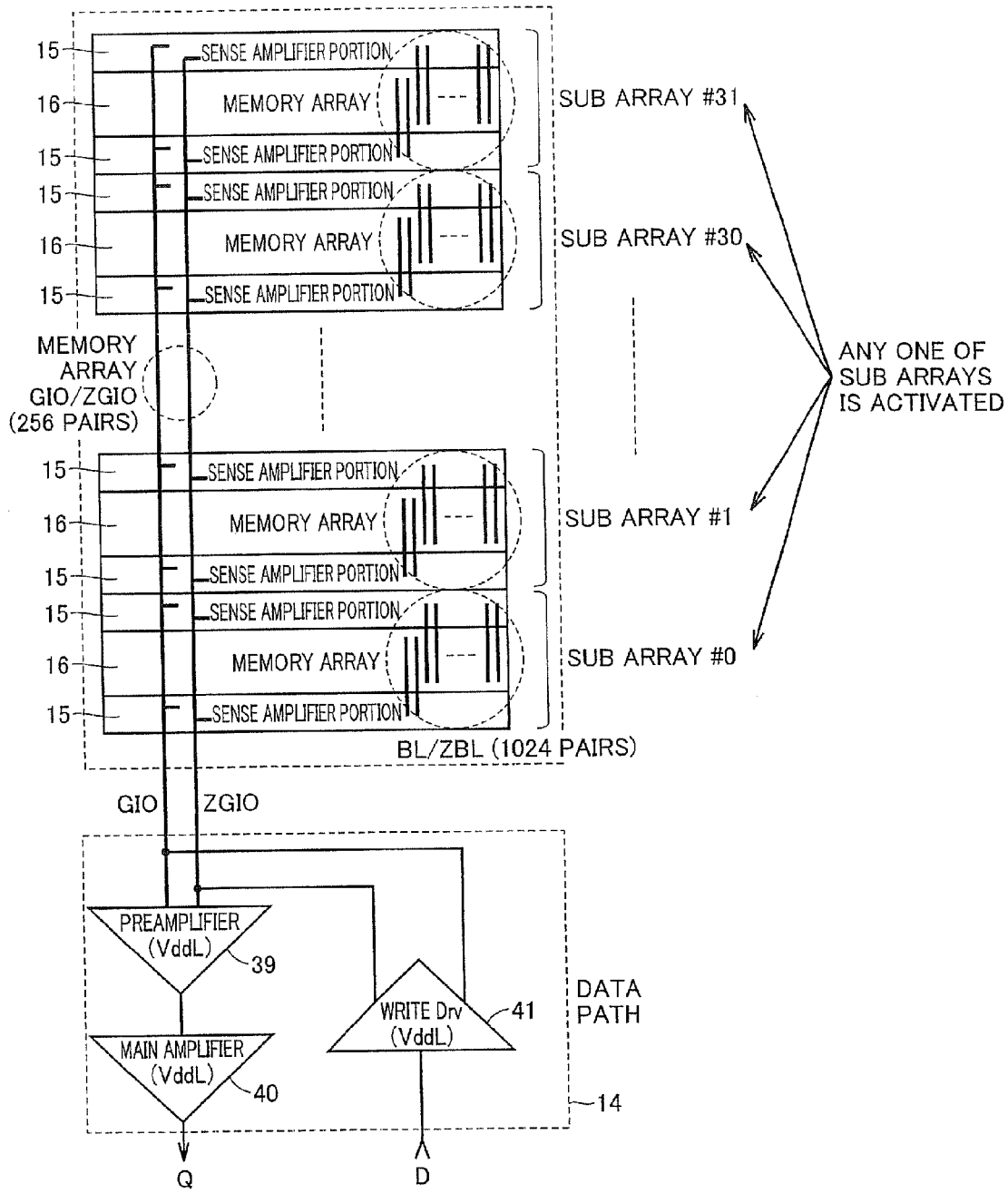
FIG. 4 illustrates global IO line pairs each connected to a data path.

With reference to FIG. 4, in an actual circuit layout, there are arranged a plurality of sub arrays each including memory array 16 and sense amplifier portions 15. Data path 14 is connected to the respective sub arrays via global IO line pairs GIO, ZGIO. In each of the sub arrays, memory array 16 is connected to sense amplifier portion 15 via bit line pairs BL, ZBL.

Therefore, global IO line pairs GIO, ZGIO are much longer in wiring distance than bit line pairs BL, ZBL. Moreover, global IO line pairs GIO, ZGIO are larger in wiring capacity than bit line pairs BL, ZBL. If I/Os increase in number, a charge/discharge current as a result of charge/discharge of wiring capacities of global IO line pairs GIO, ZGIO becomes large. For example, if the number of I/Os is 128, an operation current for memory array 16 is about 2.5 mA; in contrast, an operation current for data path 14 is about 30 mA which is ten times larger than the operation current for memory array 16. Accordingly, in order to suppress power consumption of the entire circuits, it is effective to suppress the operation current for data path 14.

Hence, data path 14 is driven by external power and row/column decoder 13, sense amplifier portion 15 and control circuit 12 are driven by stable internal power; thus, it is possible to improve control stability of the entire circuits and suppress power consumption of the entire circuits.

However, an internal buck voltage VddT is different in potential from an external power supply voltage VddL; therefore, voltage levels of control signals to be input to or output from respective components are not coincident with each other. Hence, each of level conversion circuits 17 and 18 converts a voltage level of a control signal, and connects between the respective components driven by different powers.

Figure 5:
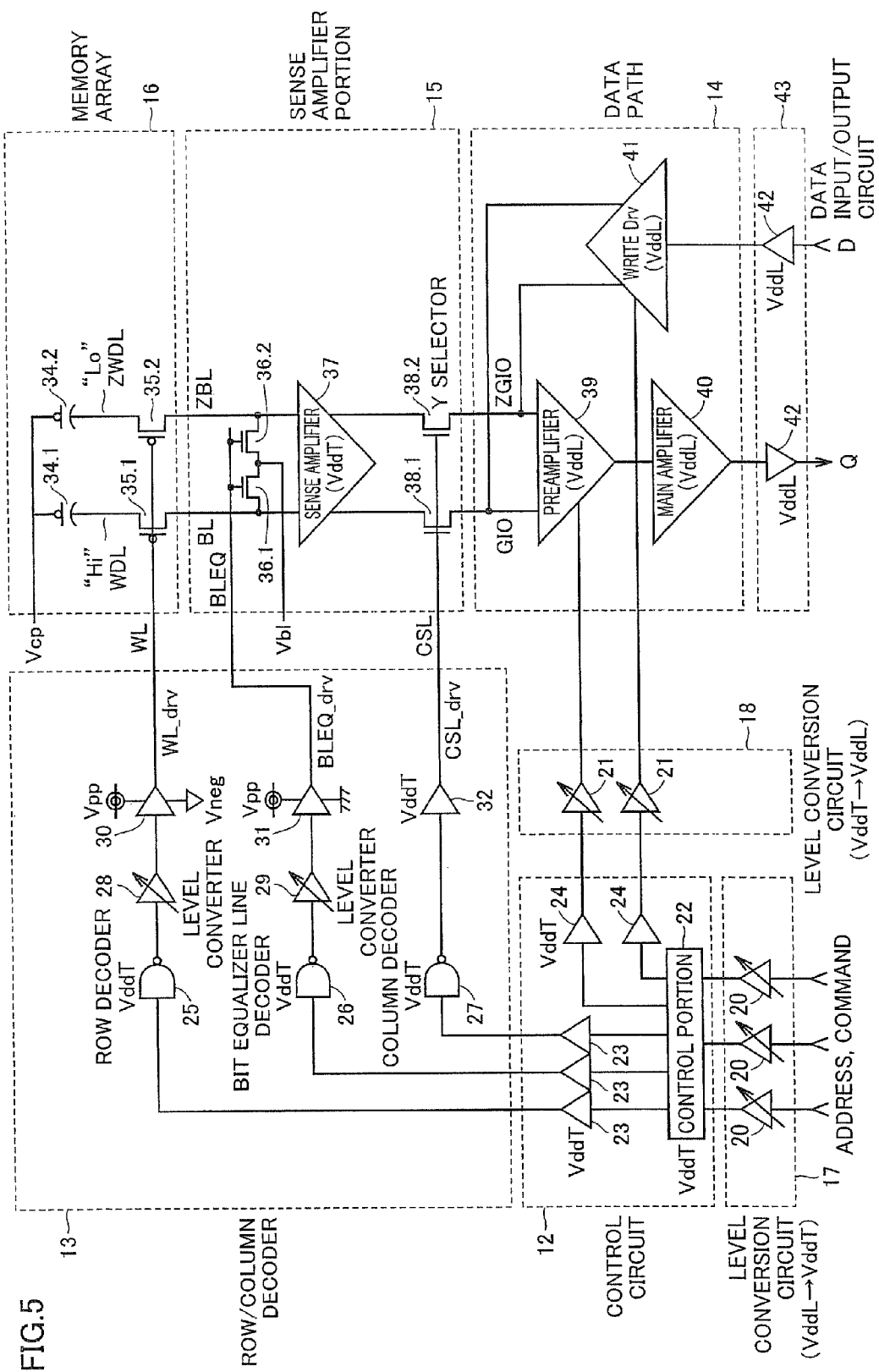
FIG. 5 is a detailed configuration diagram illustrating the memory macro according to the first embodiment.

With reference to FIG. 5, level conversion circuit 17 includes a plurality of level converters 20. Each level converter 20 receives an address signal or a command signal, having a voltage level of an external power supply voltage VddL, converts the voltage level of the received signal to an internal buck voltage VddT, and outputs a resultant signal to control circuit 12.

Control circuit 12 includes a control portion 22 and a plurality of buffer circuits 23 and 24, each driven by an internal buck voltage VddT.

Control portion 22 receives an address signal and a command signal, each having a signal level converted by level conversion circuit 17, and generates control signals for row/column decoder 13 and data path 14.

Buffer circuit 23 amplifies a current capacity of a control signal output from control portion 22, and outputs a resultant signal to row/column decoder 1.3. Buffer circuit 24 amplifies a current capacity of a control signal output from control portion 22, and outputs a resultant signal to level conversion circuit 18.

Level conversion circuit 18 includes a plurality of level converters 21. Each level converter 21 receives a control signal having a voltage level of an internal buck voltage VddT, converts the voltage level to an external power supply voltage VddL, and outputs a resultant signal to data path 14.

Row/column decoder 13 includes a row decoder 25, level converters 28 and 29, a word line driver (WL_drv) 30, a bit equalizer line decoder 26, a bit equalizer line driver (BLEQ_drv) 31, a column decoder 27, and a column driver (CSL_drv) 32.

In accordance with a control signal received from control circuit 12, row decoder 25 outputs a selection signal to word line driver 30 corresponding to a designated address. Row decoder 25 is driven by an internal buck voltage VddT.

Level converter 28 converts a voltage level of the selection signal to be output from row decoder 25, and outputs a resultant signal to word line driver 30.

In accordance with the level of the selection signal received from level converter 28, word line driver 30 supplies a boost voltage Vpp (H level) or a negative voltage Vneg (L level) to a word line WL.

In accordance with a control signal received from control circuit 12, bit equalizer line decoder 26 outputs a selection signal to bit equalizer line driver 31 corresponding to a designated address signal. Bit equalizer line decoder 26 is driven by an internal buck voltage VddT.

Level converter 29 converts a voltage level of the selection signal output from bit equalizer line decoder 23, and outputs a resultant signal to bit equalizer line driver 31.

In accordance with the level of the selection signal received from level converter 29, bit equalizer line driver 31 supplies a boost voltage Vpp (H level) or a ground voltage Gnd (L level) to a bit equalizer line BLEQ.

In accordance with a control signal received from control circuit 12, column decoder 27 outputs a selection signal to column line driver 32 corresponding to a designated address signal.

Column line driver 32 amplifies the selection signal received from column decoder 27, and supplies a resultant signal to a column selection line CSL.

Each of column decoder 27 and column line driver 32 is driven by an internal buck voltage VddT.

In the first embodiment, for example, description will be given of a memory array 16 including a so-called twin cell configured by two P-channel MOS transistors and two capacitors. More specifically, memory array 16 includes P-channel MOS transistors (insulating gate-type field effect transistors) 35.1 and 35.2, capacitors 34.1 and 34.2, and write data line pair WDL, ZWDL. In the first embodiment, memory array 16 is formed by a thin-film transistor in order to realize high speed operation and low power consumption. Further, memory array 1.6 is formed by P-type transistors lower in power consumption than N-type transistors about one-third.

P-channel MOS transistor 35.1 and capacitor 34.1 are connected in series to write data line WDL. P-channel MOS transistor 35.2 and capacitor 34.2 are connected in series to write data line ZWDL. Capacitors 34.1 and 34.2 have gates each connected in common to an intermediate voltage Vcp. P-channel MOS transistors 35.1 and 35.2 have gates each connected in common to word line W.

Write data line WDL is supplied with a voltage of H level, and write data line ZWDL is supplied with a voltage of L level.

Sense amplifier portion 15 includes N-channel MOS transistors 36.1, 36.2, 38.1 and 38.2, a sense amplifier 37, and bit line pair BL, ZBL.

N-channel MOS transistors 36.1 and 36.2 are connected in series between bit line BL and bit line ZBL. A node between N-channel MOS transistors 36.1 and 36.2 is supplied with an intermediate voltage Vbl. N-channel MOS transistors 36.1 and 36.2 have gates each connected in common to bit equalizer line BLEQ.

Sense amplifier 37 amplifies a minute potential difference generated between bit line pairs BL, ZBL to an internal buck voltage VddT.

N-channel MOS transistor 38.1 is interposed between sense amplifier 37 and global IO line GIO, and N-channel MOS transistor 38.2 is interposed between sense amplifier 37 and global IO line ZGIO. N-channel MOS transistors 38.1 and 38.2 have gates each connected in common to column selection line CSL.

Data path 14 is connected to a data input/output circuit 43, receives data from logic circuit portion 5 (see FIG. 1) via data input/output circuit 43, and outputs data, read from memory array 16, to logic circuit portion 5 via data input/output circuit 43.

Data path 14 includes a preamplifier 39, a main amplifier 40 and a write driver (write Drv) 41.

Upon reception of an activation signal via level conversion circuit 18, preamplifier 39 detects a voltage level generated between global IO line pairs GIO, ZGIO, and outputs a result of the detection to main amplifier 40.

Main amplifier 40 receives the detection signal from preamplifier 39, and outputs "0" or "1" to data input/output circuit 43 in accordance with H level or L level.

Upon reception of an activation signal via level conversion circuit 18, write driver 41 supplies a voltage of H level or L level between global IO line pairs GIO, ZGIO in accordance with the data signal received from data input/output circuit 43.

Data input/output circuit 43 includes a buffer circuit 42, and performs data input/output between logic circuit portion 5 (see FIG. 1) and memory array 16.

In accordance with "0" or "1" supplied externally, buffer circuit 42 outputs a write data signal of H level or L level to write driver 41. Further, in accordance with a read data signal of H level or L level output from main amplifier 40, buffer circuit 42 outputs data of "0" or "1". Buffer circuit 42 is driven by an external power supply voltage VddL.

Memory macro 4.2 is similar to memory macro 4.1; therefore, detailed description thereof will not be repeated here.

In the first embodiment, sense amplifier portion 15, row/column decoder 13 and control circuit 12 correspond to a first load circuit, and data path 14 and data input/output circuit 43 correspond to a second load circuit. In addition, level conversion circuit 17 corresponds to a first level conversion circuit, and level conversion circuit 18 corresponds to a second level conversion circuit. Further, an external power supply voltage VddH corresponds to a first external voltage, and an external power supply voltage VddL corresponds to a second external voltage.

Figure 6:
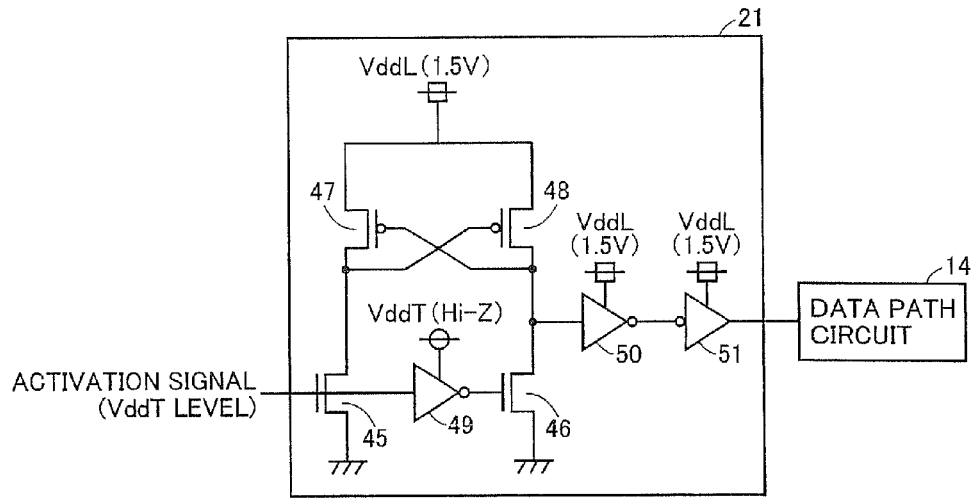
FIG. 6 is a schematic configuration diagram illustrating a level converter.

With reference FIG. 6, level converter 21 includes N-channel MOS transistors 45 and 46, P-channel MOS transistors 47 and 48, and inverters (inversion amplifiers) 49, 50 and 51.

N-channel MOS transistor 45 and P-channel MOS transistor 47 are connected in series between an external power supply voltage VddL and a ground voltage Gnd. N-channel MOS transistor 46 and P-channel MOS transistor 48 are connected in series between external power supply voltage VddL and a ground voltage Gnd. N-channel MOS transistor 45 has a gate receiving an activation signal output from control circuit 12. N-channel MOS transistor 46 has a gate receiving a signal output from inverter 49. P-channel MOS transistor 47 has a gate connected to a drain of P-channel MOS transistor 48. P-channel MOS transistor 48 has a gate connected to a drain of P-channel MOS transistor 47.

Inverters 50 and 51, connected in series, are connected to a node between N-channel MOS transistor 46 and P-channel MOS transistor 48, and function as output buffers. Each of inverters 50 and 51 is driven by an external power supply voltage VddL.

Hereinafter, description will be given of operations of level converter 21. Upon reception of an activation signal of H level (internal buck voltage VddT), N-channel MOS transistor 45 is activated and enters a conductive state, and N-channel MOS transistor 46 enters a non-conductive state without being activated. Since N-channel MOS transistor 45 enters a conductive state, the gate of P-channel MOS transistor 48 is supplied with a ground voltage Gnd, so that P-channel MOS transistor 48 is activated and enters a conductive state. Further, since P-channel MOS transistor 48 enters a conductive state, the gate of P-channel MOS transistor 47 is supplied with an external power supply voltage VddL, so that P-channel MOS transistor 47 enters a non-conductive state without being activated.

Accordingly, since an external power supply voltage VddL is applied at the drain of P-channel MOS transistor 48, an activation signal of H level, converted to an internal buck voltage VddT, is output to data path 14 via inverters 50 and 51.

On the other hand, upon reception of an activation signal of L level (ground voltage Gnd), N-channel MOS transistor 45 enters a non-conductive state without being activated, and N-channel MOS transistor 46 is activated and enters a conductive state. Since N-channel MOS transistor 46 enters a conductive state, the gate of P-channel MOS transistor 47 is supplied with a ground voltage Gnd, so that P-channel MOS transistor 47 is activated and enters a conductive state. Further, since P-channel MOS transistor 47 enters a conductive state, the gate of P-channel MOS transistor 48 is supplied with an external power supply voltage VddL, so that P-channel MOS transistor 48 enters a non-conductive state without being activated.

Accordingly, since a ground voltage Gnd is applied at the drain of P-channel MOS transistor 48, an activation signal of L level is output to data path 14 via inverters 50 and 51.

Further, level converter 20 is similar to level converter 21 illustrated in the schematic configuration diagram of FIG. 6 except that internal buck voltage VddT is replaced with an external power supply voltage VddL and external power supply voltage VddL is replaced with an internal buck voltage VddT; therefore, detailed description thereof will not be repeated here.

According to the first embodiment of the present invention, it is possible to drive a data path with high consumption of power by external power to thereby suppress conversion loss and to achieve low consumption of power. Further, it is also possible to drive each of a control circuit and a row/column decoder by internal power to thereby achieve control stability. Thus, it is possible to realize a semiconductor device capable of achieving a stable operation and, also, suppressing power consumption.

Second Embodiment

In the first embodiment, the description is given of a case that each of a control circuit and a row/column decoder is driven by internal power in a memory macro. On the other hand, in a second embodiment, description will be given of a case that a data path is also driven by internal power.

Figure 7:
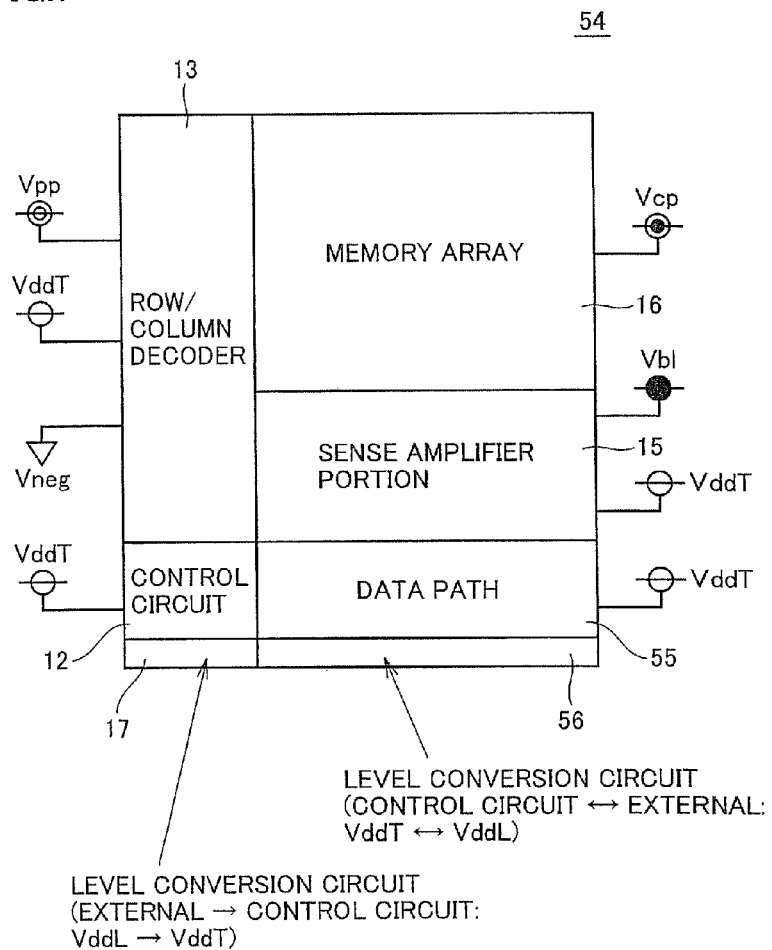
FIG. 7 is a schematic configuration diagram illustrating a memory macro according to a second embodiment.

With reference to FIG. 7, a memory macro 54 according to the second embodiment includes a control circuit 12, a row/column decoder 13, a data path 55, a sense amplifier portion 15, a memory array 16, and level conversion circuits 17 and 56.

In accordance with a control signal from control circuit 12, data path 55 transmits data, received from an external logic circuit portion 5 (see FIG. 1) and the like, to a bit line pair via level conversion circuit 56 or outputs data, read by sense amplifier portion 15, to an external logic circuit and the like via level conversion circuit 56. Data path 55 is supplied with an internal buck voltage VddT to be driven.

Level conversion circuit 56 is interposed on an input/output side of data path 55 where data path 55 performs data input/output. Level conversion circuit 56 receives data externally, converts a signal level of the received data from an external power supply voltage VddL to an internal buck voltage VddT, and outputs resultant data to data path 55. Moreover, level conversion circuit 56 receives data output from data path 55, converts a signal level of the received data from an internal buck voltage VddT to an external power supply voltage VddL, and externally outputs resultant data.

Control circuit 1.2, row/column decoder 13, sense amplifier portion 15, memory array 16, level conversion circuit 17 and data input/output circuit 43 are similar to those in the first embodiment; therefore, detailed description thereof will not be repeated here.

From among the constituent elements of memory macro 54, as described above, each of control circuit 12, row/column decoder 13, sense amplifier portion 15 and data path 55 is supplied with an internal buck voltage VddT to be driven serving as internal power. Thus, it is possible to improve control stability.

On the other hand, each of an address signal, a command signal and data supplied externally has a voltage level of an external power supply voltage VddL; therefore, a level of a voltage supplied to control circuit 12 and data path 55 is not coincident with a level of a voltage supplied from data path 55. Hence, level conversion circuits 17 and 56 convert voltage levels of an address signal, a command signal and data to supply resultants to respective components driven by internal power.

Figure 8:
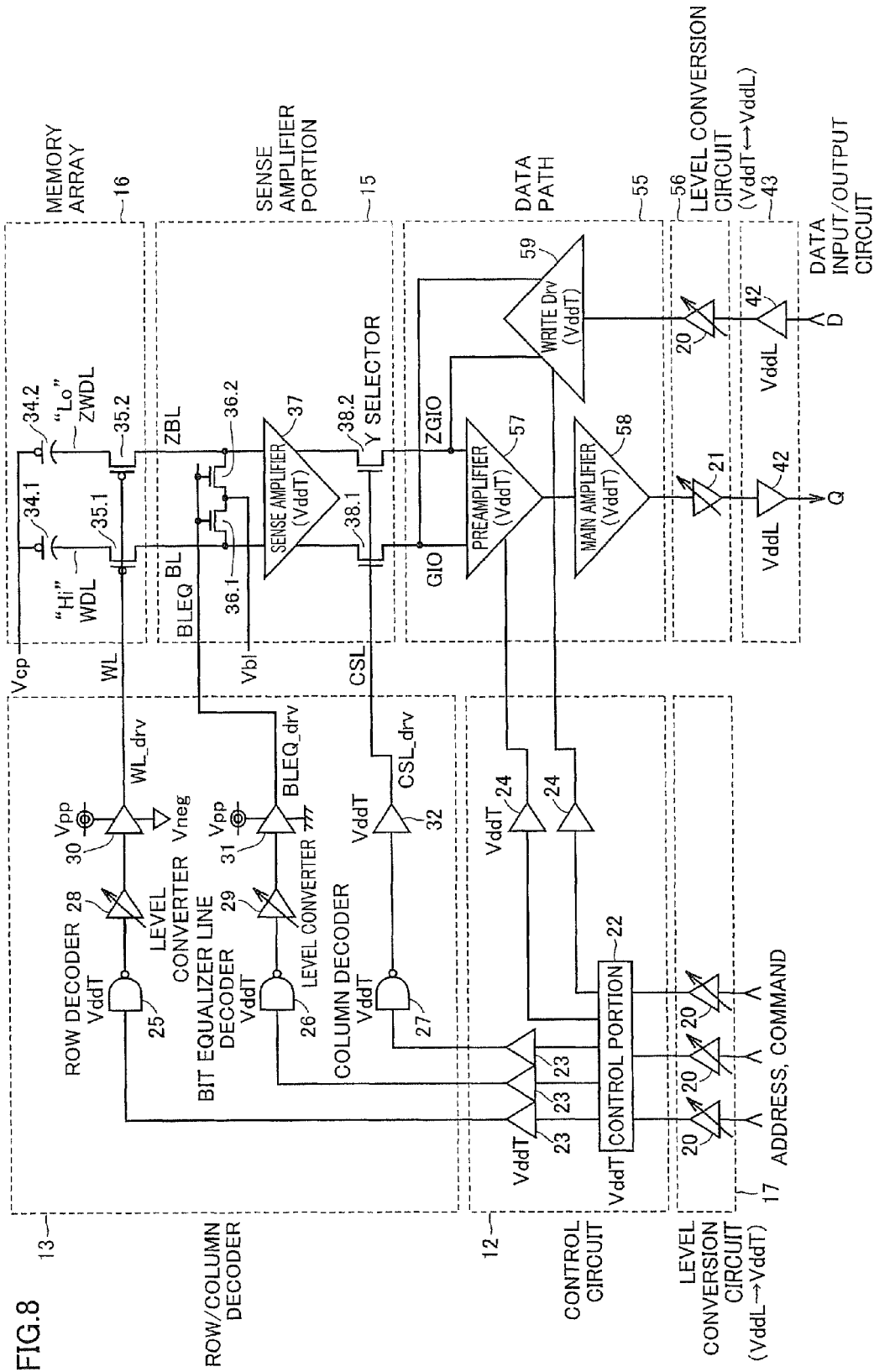
FIG. 8 is a detailed configuration diagram illustrating the memory macro according to the second embodiment.

With reference to FIG. 8, data path 55 includes a preamplifier 57, a main amplifier 58 and a write driver 59.

Preamplifier 57, main amplifier 58 and write driver 59 are similar to preamplifier 39, main amplifier 40 and write driver 41 each illustrated in FIG. 5, except that each of preamplifier 57, main amplifier 58 and write driver 59 is driven by an internal buck voltage VddT; therefore, detailed description thereof will not be repeated here.

Level conversion circuit 56 is placed on an input/output side of data path 55 where data path 55 performs data input/output. Level conversion circuit 56 includes level converters 20 and 21.

Level converter 20 receives data externally, converts a signal level of the received data from an external power supply voltage VddL to an internal buck voltage VddT, and outputs resultant data to data path 55.

Level converter 21 receives data from data path 55, converts a signal level of the received data from an internal buck voltage VddT to an external power supply voltage VddL, and externally outputs resultant data.

Level conversion circuit 17, control circuit 12, row/column decoder 13, sense amplifier portion 15, memory array 16 and data input/output circuit 43 are similar to those in memory macro 4.1 illustrated in FIG. 5; therefore, detailed description thereof will not be repeated here.

In the second embodiment, sense amplifier portion 15, row/column decoder 13, control circuit 12 and data path 14 correspond to a first load circuit, and data input/output circuit 43 corresponds to a second load circuit. Level conversion circuit 56 corresponds to a third level conversion circuit. Further, an external power supply voltage VddH corresponds to a first external voltage, and an external power supply voltage VddL corresponds to a second external voltage.

The second embodiment is superior to the first embodiment in the following point: a data path is driven by internal power with less variation in voltage; therefore, control stability can be further enhanced. Thus, it is possible to realize a semiconductor device with improved stable operation.

Third Embodiment

In the first embodiment, the description is given of a case that each of a control circuit and a row/column decoder is driven by internal power in a memory macro. On the other hand, in a third embodiment, description will be given of a case that only each a sense amplifier portion and a row/column decoder is driven by internal power.

Figure 9:
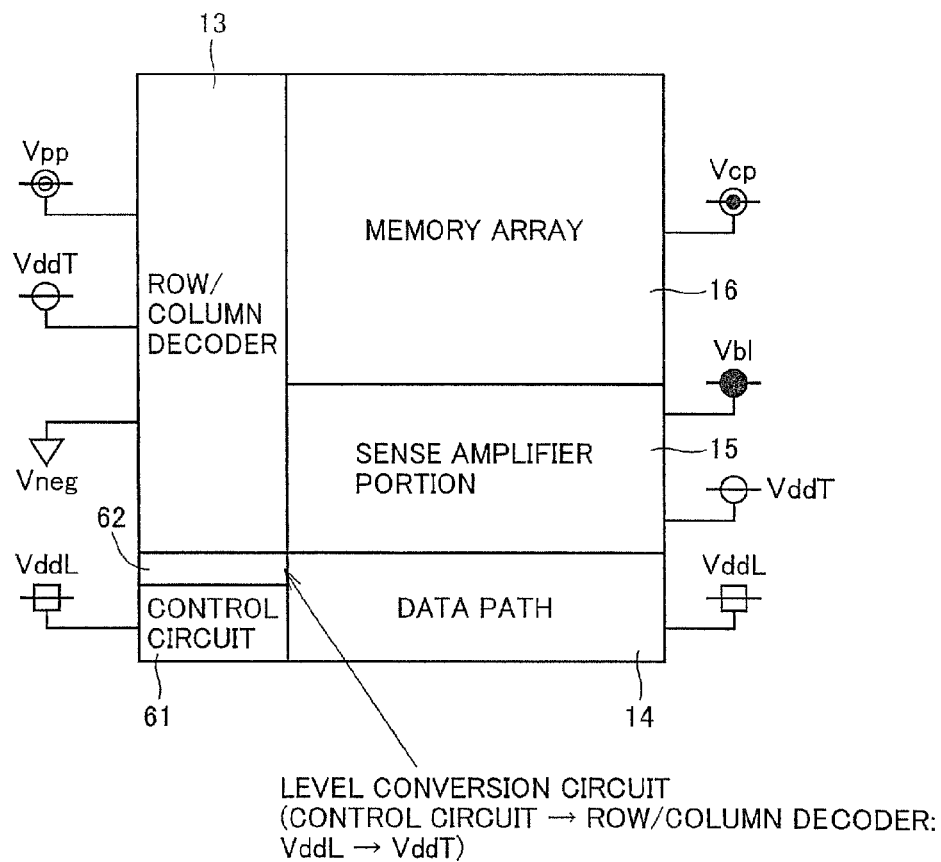
FIG. 9 is a schematic configuration diagram illustrating a memory macro according to a third embodiment.

With reference to FIG. 9, a memory macro 64 according to the third embodiment includes a control circuit 61, a row/column decoder 13, a data path 14, a sense amplifier portion 15, a memory array 16, and a level conversion circuit 62.

Control circuit 61 receives an address signal indicating a memory cell, to which or from which data is written or read, and a command signal indicating data write or data read, and transmits control signals to row/column decoder 13 and data path 14. Control circuit 61 is supplied with an external power supply voltage VddL to be driven.

Level conversion circuit 62 is interposed between an output side of control circuit 61 and row/column decoder 13. Level conversion circuit 62 receives a control signal output from control circuit 61, converts a signal level of the received control signal from an external power supply voltage VddL to an internal buck voltage VddT, and outputs a resultant signal to row/column decoder 13.

Row/column decoder 13, data path 1.4, sense amplifier portion 15 and memory array 16 are similar to those in the first embodiment; therefore, detailed description thereof will not be repeated here.

From among the constituent elements of memory macro 64, as described above, each of row/column decoder 13 and sense amplifier portion 15 is supplied with an internal buck voltage VddT to be driven serving as internal power, but each of control circuit 61 and data path 14 is supplied with an external power supply voltage VddL to be driven serving as external power.

Figure 10:
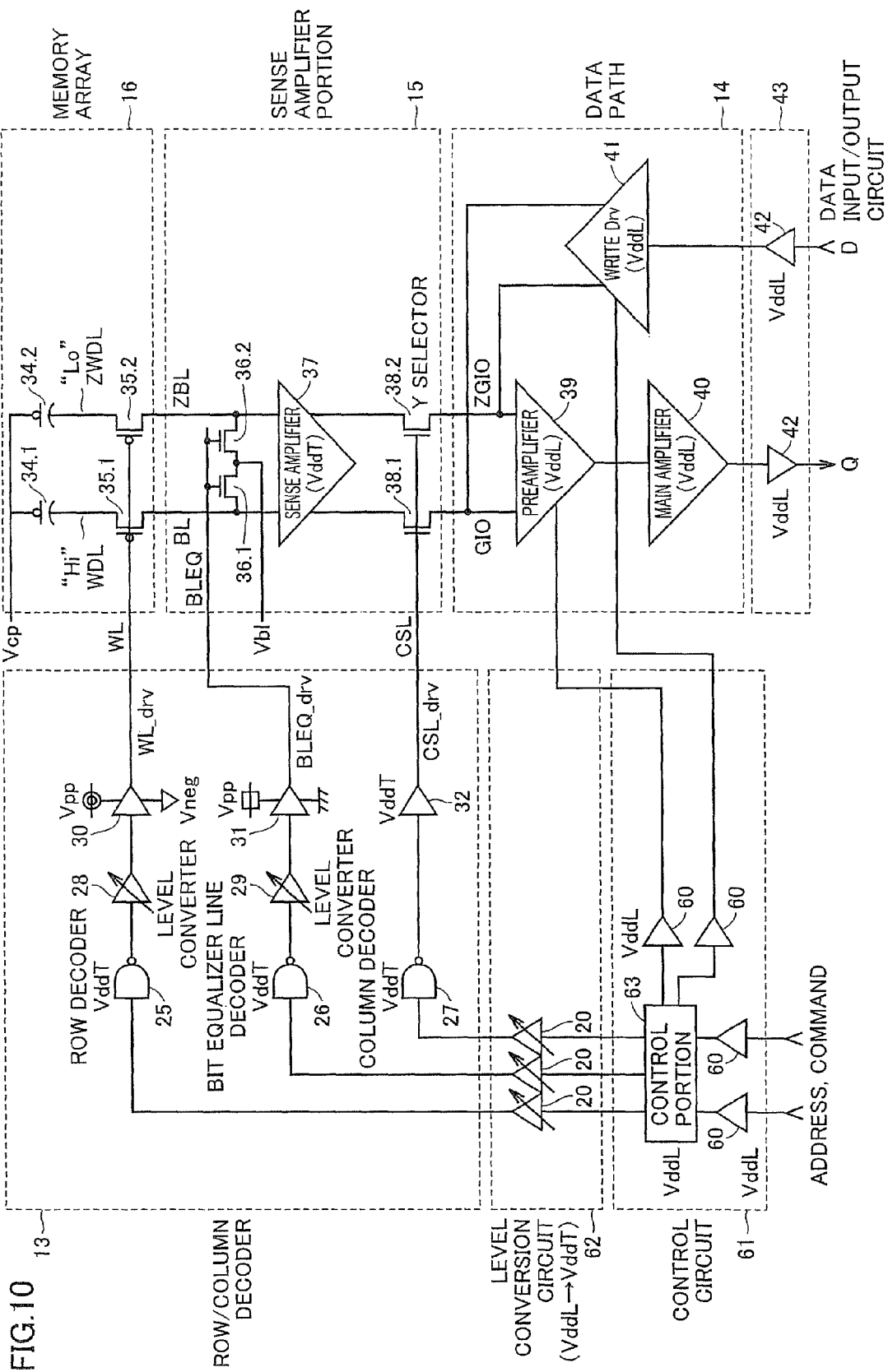
FIG. 10 is a detailed configuration diagram illustrating the memory macro according to the third embodiment.

With reference to FIG. 10, control circuit 61 includes a control portion 63 and buffer circuits 60.

Control portion 63 is similar to control portion 22 illustrated in FIG. 5, except that control portion 63 is driven by an external power supply voltage VddL; therefore, detailed description thereof will not be repeated here.

Each buffer circuit 60 is driven by an external power supply voltage VddL, outputs an address signal and a command signal, each received externally, to control portion 63, and outputs a control signal, output from control portion 63, to data path 14.

Level conversion circuit 62 is placed on an output side of control circuit 61 where control circuit 61 outputs a control signal to row/column decoder 13. Level conversion circuit 62 includes a level converter 20. Level converter 20 is similar to that described above; therefore, detailed description thereof will not be repeated here.

Row/column decoder 13, data path 14, sense amplifier portion 1.5, memory array 16 and data input/output circuit 43 are similar to those in memory macro 4.1 illustrated in FIG. 5; therefore, detailed description thereof will not be repeated here.

In the third embodiment, sense amplifier portion 15 and row/column decoder 13 correspond to a first load circuit, and control circuit 12, data path 14 and data input/output circuit 43 correspond to a second load circuit. Level conversion circuit 62 corresponds to a first level conversion circuit. Further, an external power supply voltage VddH corresponds to a first external voltage, and an external power supply voltage VddL corresponds to a second external voltage.

According to the third embodiment of the present invention, a row/column decoder and a sense amplifier, each significantly exerting an influence on a data read speed and a data write speed for a memory cell, are driven by internal power with less variation in voltage, respectively, and a control circuit and a data path are driven by external power, respectively. Therefore, the third embodiment is superior to the first embodiment in the following point: a resultant semiconductor device can further suppress power consumption while maintaining an access speed to a memory.

Fourth Embodiment

In the first embodiment, the description is given of a case that each of a control circuit and a row/column decoder is driven by internal power in a memory macro. On the other hand, in a fourth embodiment, description will be given of a case that only a sense amplifier portion is driven by internal power.

Figure 11:
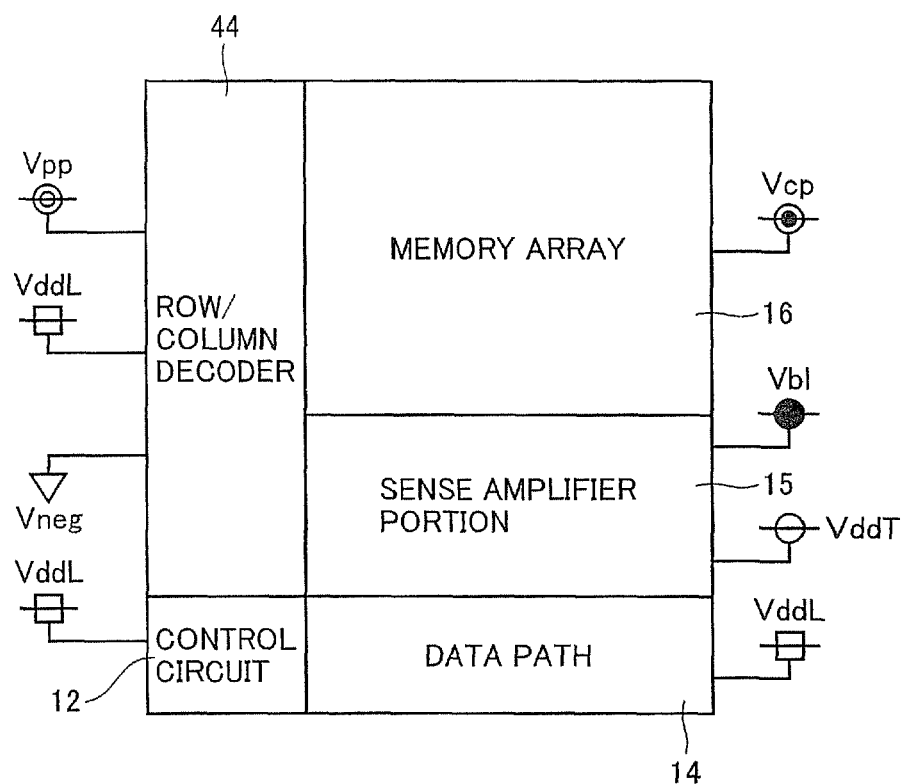
FIG. 11 is a schematic configuration diagram illustrating a memory macro according to a fourth embodiment.

With reference to FIG. 11, a memory macro 89 according to the fourth embodiment includes a control circuit 12, a row/column decoder 44, a data path 14, a sense amplifier portion 1.5 and a memory array 16.

Control circuit 12 receives an address signal indicating a memory cell, to which or from which data is written or read, and a command signal indicating data write or data read, and transmits control signals to row/column decoder 44 and data path 14. Control circuit 12 is supplied with an external power supply voltage VddL to be driven.

In accordance with the control signal from control circuit 12, row/column decoder 44 selects a memory cell, to which or from which data is written or read, from memory cells in memory array 16. Row/column decoder 44 is supplied with an external power supply voltage VddL to be driven.

Control circuit 12, data path 14, sense amplifier portion 15, and memory array 16 are similar to those in the first embodiment; therefore, detailed description thereof will not be repeated here.

From among the constituent elements of memory macro 89, as described above, sense amplifier portion 15 is supplied with an internal buck voltage VddT serving as internal power to be driven, but each of row/column decoder 44, control circuit 12 and data path 14 is supplied with an external power supply voltage VddL serving as external power to be driven.

Figure 12:
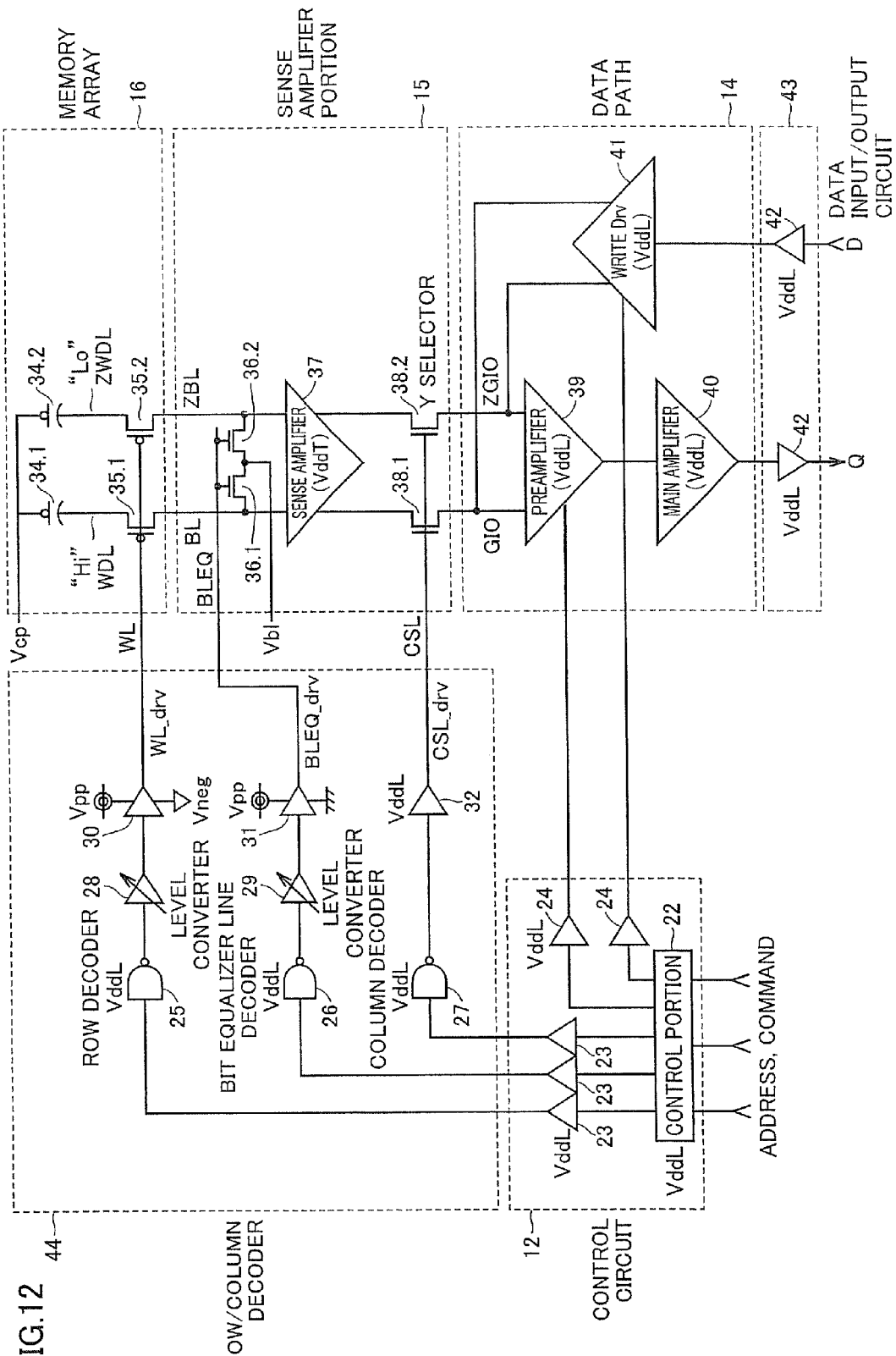
FIG. 12 is a detailed configuration diagram illustrating the memory macro according to the fourth embodiment.

With reference to FIG. 12, control circuit 12 includes a control portion 22 and buffer circuits 23 and 24.

Row/column decoder 44 is similar to row/column decoder 13 illustrated in FIG. 5, except that row/column decoder 44 is driven by an external power supply voltage VddL; therefore, detailed description thereof will not be repeated here.

Control circuit 12, data path 14, sense amplifier portion 15, memory array 16, and data input/output circuit 43 are similar to those in memory macro 4.1 illustrated in FIG. 5; therefore, detailed description thereof will not be repeated here.

In the fourth embodiment, sense amplifier portion 15 corresponds to a first load circuit, and row/column decoder 44, control circuit 12, data path 14, and data input/output circuit 43 correspond to a second load circuit. In addition, an external power supply voltage VddH corresponds to a first external voltage, and an external power supply voltage VddL corresponds to a second external voltage.

According to the fourth embodiment of the present invention, a sense amplifier, significantly exerting an influence on a data read speed and a data write speed for a memory cell, is driven by internal power with less variation in voltage, and a control circuit, a row/column decoder and a data path are driven by external power, respectively. In addition, a voltage level of an external power supply voltage VddL is approximately coincident with a voltage level of an internal buck voltage VddT; therefore, it is unnecessary to convert a voltage level of a signal to be output from a sense amplifier to a data path. Therefore, it is possible to realize a semiconductor device capable of maintaining an access speed to a memory, suppressing power consumption and reducing a circuit area.

Fifth Embodiment

In a fifth embodiment, description will be given of a case that low power consumption is realized by suppressing an amount of current to be fed to a memory macro and the like in accordance with an external standby instruction.

Figure 13:
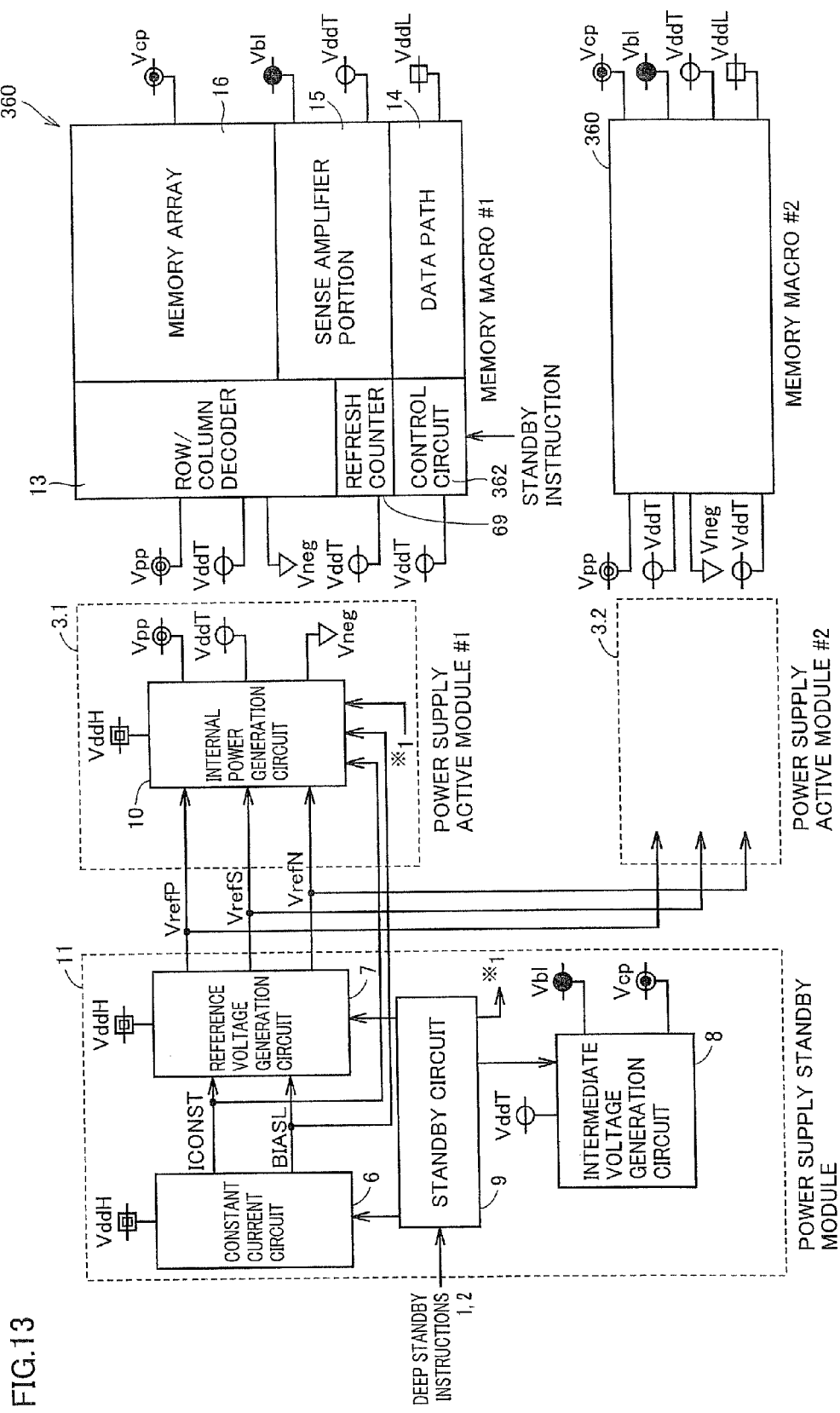
FIG. 13 is a schematic configuration diagram illustrating main parts of a semiconductor memory device according to a fifth embodiment.

With reference to FIG. 13, a semiconductor device according to the fifth embodiment is different from semiconductor device 1 illustrated in FIG. 2 in the following point. In the semiconductor device according to the fifth embodiment, a standby circuit 9 is added to power supply standby module 2 of semiconductor device 1 illustrated in FIG. 2 and a memory macro 360 is provided in place of memory macro 4.1.

In accordance with external deep standby instructions 1 and 2, standby circuit 9 shifts to two deep standby modes (to be described later) in addition to a normal standby mode. In accordance with a shifted deep standby mode, standby circuit 9 transmits control signals to a constant current circuit 6, a reference voltage generation circuit 7, an intermediate voltage generation circuit 8, and an internal power generation circuit 10 to allow these components to execute standby processing (to be described later).

Herein, the normal standby mode is a mode where written data is ensured (hereinafter, the term "standby mode" simply indicates the normal standby mode unless otherwise specified). In contrast, each of the two deep standby modes (deep standby modes 1 and 2) is a mode where data written to a memory macro is not ensured, but power consumption is suppressed significantly.

Memory macro 360 is different from memory macro 4.1 illustrated in FIG. 2 in the following point: a control circuit 362 is provided in place of control circuit 12 and a refresh counter 69 is additionally provided.

In accordance with an external standby instruction, control circuit 362 transmits an activation signal to a refresh counter 69.

Upon reception of the activation signal from control circuit 362, refresh counter 69 drives a row/column decoder 13 and refreshes data held by a memory array 16.

Upon reception of the standby instruction, deep standby instruction 1 or deep standby instruction 2, a logic circuit portion 5 (see FIG. 1) stops input/output of data to/from memory macro 360.

Row/column decoder 13, a memory array 16, a sense amplifier portion 15, and a data path 14 are similar to those in memory macro 4.1; therefore, detailed description thereof will not be repeated here.

The other components are similar to those in semiconductor device 1 illustrated in FIG. 2; therefore, detailed description thereof will not be repeated here.

In the fifth embodiment, refresh counter 362 corresponds to a refresh circuit. The standby instruction corresponds to a first standby instruction signal, deep standby instruction 1 corresponds to a second standby instruction signal, and deep standby instruction 2 corresponds to a third standby instruction signal. Further, an external power supply voltage VddH corresponds to an external high voltage, and an external power supply voltage VddL corresponds to an external low voltage.

Figure 14:
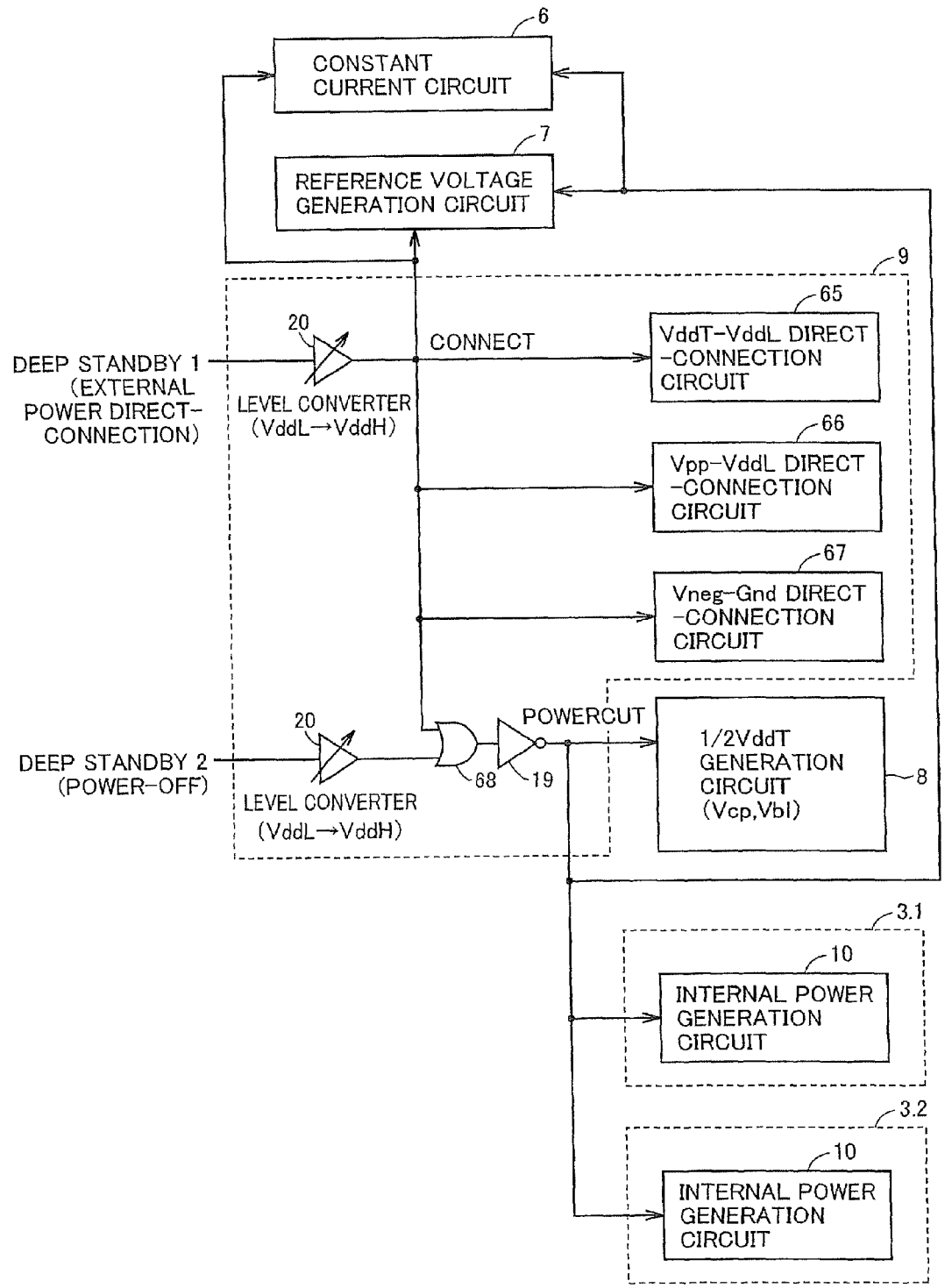
FIG. 14 illustrates main parts of the semiconductor device according to the fifth embodiment.

With reference to FIG. 14, standby circuit 9 includes a level converter 20, a VddT-VddL direct-connection circuit 65, a Vpp-VddL direct-connection circuit 66, a Vneg-Gnd direct-connection circuit 67, an OR circuit 68, and an inverter 19. Standby circuit 9 shifts to deep standby mode 1 and, then, outputs CONNECT signals of H level to VddT-VddL direct-connection circuit 65, Vpp-VddL direct-connection circuit 66, Vneg-Gnd direct-connection circuit 67, constant current circuit 6, and reference voltage generation circuit 7. Alternatively, standby circuit 9 shifts to deep standby mode 2 and, then, outputs POWERCUT signals to intermediate voltage generation circuit 8 and internal power generation circuit 10.

Level converter 20 receives deep standby instructions 1 and 2, each having a voltage level of external power supply voltage VddL, externally, and converts the voltage level to an external power supply voltage VddH.

OR circuit 68 receives deep standby instructions 1 and 2 output from level converter 20 to implement an logical OR operation, and outputs a result of the operation as a POWERCUT signal. More specifically, upon reception of at least one of deep standby instructions 1 and 2, OR circuit 68 outputs a POWERCUT signal.

Inverter 19 receives an output from OR circuit 68, and makes a conversion between H level and L level mutually. Therefore, in a state of receiving no deep standby instruction 1 and 2, inverter 19 outputs a POWERCUT signal of H level.

With reference to FIGS. 14 and 15, deep standby mode 1 is a mode for stopping supply of internal power from internal power generation circuit 10 and supplying external power. That is, in deep standby mode 1, standby circuit 9 internally generates a CONNECT signal in order to supply an external power supply voltage VddL to a load in place of an internal buck voltage VddT and a boost voltage Vpp and to supply a ground voltage Gnd to a load such as data input/output circuit 43 illustrated in FIG. 5 in place of a negative voltage Vneg. Further, standby circuit 9 blocks a power supply line from intermediate voltage generation circuit 8 to the load, and makes an intermediate voltage Vbl/Vcp floating. The reason therefor is that intermediate voltage Vbl/Vcp made floating tends to be recovered to a specific voltage (0.75 V) earlier than intermediate voltage Vbl/Vcp fixed at an external power supply voltage VddL or a ground voltage Gnd.

Since internal power generation circuit 10 interrupts supply of internal power, standby circuit 9 performs processing on a reference voltage and a constant current for generating internal power. More specifically, standby circuit 9 supplies an internal buck voltage VddT to internal power generation circuit 10 in place of reference voltages VrefS and VrefP, blocks a power supply line of a reference voltage VrefN, and makes reference voltage VrefN floating. In a recovery from deep standby mode 1 or 2, reference voltage VrefN connected to a ground voltage Gnd becomes smaller than a negative voltage division voltage VnegDiv. Consequently, an unintentionaly pumping operation is performed, so that a potential of a negative voltage Vneg becomes deep excessively (e.g., about −1.0 V), resulting in a problem of reliability. In addition, if reference voltage VrefN is connected to an external power supply circuit VddH, a leak current (e.g., 15 μA) is generated at a VrefN buffer circuit during a period of deep standby mode 1 or 2, so that a standby current increases.

Further, standby current 9 supplies an external power supply voltage VddH as a constant current ICONST, and supplies a ground voltage Gnd as a bias voltage BIASL.

In a recovery to an active mode, reference voltages VrefS and VrefP must be boosted to 1.5 V and 2.0 V, respectively. Therefore, in deep standby mode 1, an internal buck voltage VddT is precharged, so that a recovery time is reduced.

On the other hand, deep standby mode 2 is a mode for interrupting supply of power from internal power generation circuit 10 to a load. More specifically, in deep standby mode 2, standby circuit 9 outputs a POWERCUT signal, blocks a power supply line from internal power generation circuit 10 to a load still further from the state in deep standby mode 1, and makes an internal buck voltage VddT, a boost voltage Vpp and a negative voltage Vneg floating. Therefore, an off-leak current is not generated at a transistor.

In addition, standby circuit 9 blocks power supply lines of reference voltages VrefS and VrefP, and makes reference voltages VrefS and VrefP floating.

As a result of this, deep standby mode 1 is recovered to the standby mode at about 15 μsec, and power consumption in memory macros 4.1 and 4.2 is suppressed to that due to an off-leak current (up to about 180 μA). Deep standby mode 2 is recovered to the standby mode at about 200 μsec which is longer than a time required in deep standby mode 1; however, an off-leak current is not generated at a component supplied with internal power to be driven. Further, in deep standby modes 1 and 2, power consumption by power supply active modules 3.1 and 3.2 is restricted to that due to an off-leak current. Thus, power consumption can be suppressed considerably in comparison with the normal standby mode.

In the fifth embodiment, Vpp-VddL direct-connection circuit 66 and Vneg-Gnd direct-connection circuit 67 correspond to a first direct-connection circuit and a second direct-connection circuit, respectively. Further, the standby mode, deep standby mode 1 and deep standby mode 2 correspond to a first standby mode, a second standby mode and a third standby mode, respectively.

Hereinafter, description will be given of configurations of respective components for realizing a deep standby mode.
(VddT-VddL Direct-Connection Circuit)

Figure 16:
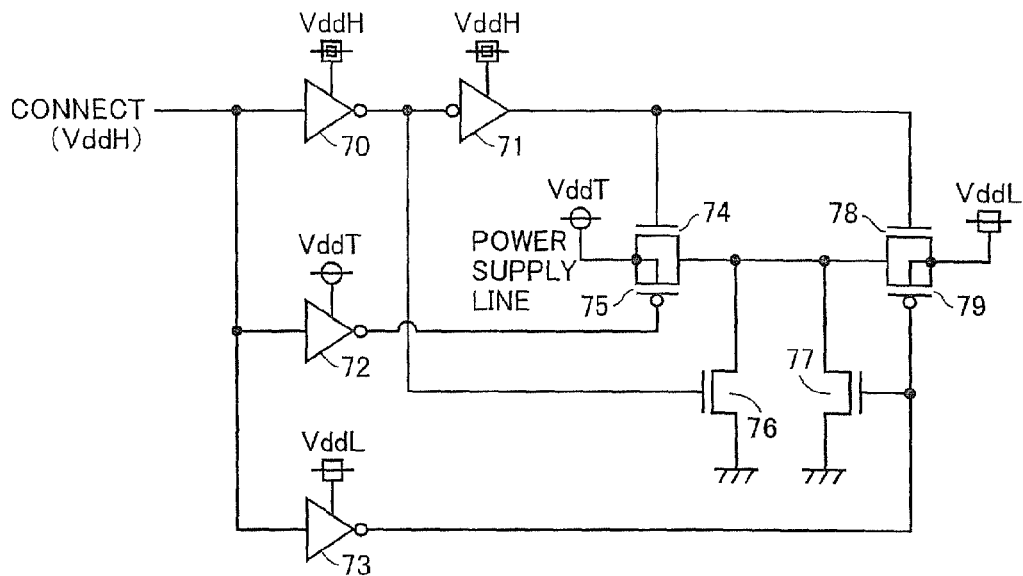
FIG. 16 is a schematic configuration diagram illustrating a VddT-VddL direct-connection circuit.

With reference to FIG. 16, in deep standby mode 1, VddT-VddL direction connection circuit 65 receives a CONNECT signal, having a voltage level of an external power supply voltage VddH, from level converter 20 (see FIG. 14), and applies an external power supply voltage VddL to a power supply line of an internal buck voltage VddT. VddT-VddL direct-connection circuit 65 includes inverters 70, 71, 72, and 73, N-channel MOS transistors 74, 76, 77, and 78, and P-channel MOS transistors 75 and 79.

Inverter 70 is driven by an external power supply voltage VddH, receives a CONNECT signal, and outputs an inversion signal of the received CONNECT signal.

Inverter 71 is connected to inverter 70 in series, receives the inversion signal output from inverter 70, inverts the received inversion signal, and outputs a resultant. That is, inverter 71 outputs a signal having a level equal to that of the CONNECT signal received by inverter 70.

Inverter 72 is driven by an internal buck voltage VddT, receives a CONNECT signal, and outputs an inversion signal of the received CONNECT signal.

Inverter 73 is driven by an external power supply voltage VddL, receives a CONNECT signal, and outputs an inversion signal of the received CONNECT signal.

N-channel MOS transistor 74 and P-channel MOS transistor 75 are connected in parallel between a power supply line of external power supply voltage VddL and a power supply line of internal buck voltage VddT to configure a transfer gate. N-channel MOS transistor 74 has a gate connected to an output of inverter 71, and P-channel MOS transistor 75 has a gate connected to an output of inverter 72.

Similarly, N-channel MOS transistor 78 and P-channel MOS transistor 79 are connected in parallel between the power supply line of external power supply voltage VddL and the power supply line of internal buck voltage VddT to configure a transfer gate. N-channel MOS transistor 78 has a gate connected to the output of inverter 71, and P-channel MOS transistor 79 has a gate connected to an output of inverter 73.

N-channel MOS transistors 76 and 77 are interposed between the power supply line of external power supply voltage VddL and ground voltage Gnd. N-channel MOS transistor 76 has a gate connected to an output of inverter 70, and N-channel MOS transistor 77 has a gate connected to the output of inverter 73.

Hereinafter, description will be given of operations of VddT-VddL direct-connection circuit 65. Upon reception of a CONNECT signal of H level externally, the gates of N-channel MOS transistors 74 and 78 receive signals of H level via inverters 70 and 71, so that N-channel MOS transistors 74 and 78 are activated and enter a conductive state. In addition, the gates of P-channel MOS transistors 75 and 79 receive signals of L level via inverters 72 and 73, so that P-channel MOS transistors 75 and 79 are activated and enter a conductive state.

Further, the gates of N-channel MOS transistors 76 and 77 receive signals of L level via inverters 70 and 73, so that N-channel MOS transistors 76 and 77 enter a non-conductive state without being activated.

Accordingly, both the transfer gate configured by N-channel MOS transistor 74 and P-channel MOS transistor 75 and the transfer gate configured by N-channel MOS transistor 78 and P-channel MOS transistor 79 are made conductive; therefore, the power supply line of internal buck voltage VddT is supplied with external power supply voltage VddL.

On the other hand, upon reception of a CONNECT signal of L level externally, the gates of N-channel MOS transistors 74 and 78 receive signals of L level via inverter 71, so that N-channel MOS transistors 74 and 78 enter a non-conductive state without being activated. In addition, the gates of P-channel MOS transistors 75 and 79 receive signals of H level via inverters 72 and 73, so that N-channel MOS transistors 75 and 79 enter a non-conductive state without being activated.

Further, the gates of N-channel MOS transistors 76 and 77 receive inversion signals of H level via inverters 70 and 73 respectively, so that N-channel MOS transistors 76 and 77 are activated and enter a conductive state. Thus, ground voltage Gnd is applied to N-channel MOS transistors 74 and 78 and P-channel MOS transistors 75 and 79, respectively.

Accordingly, both the transfer gate configured by N-channel MOS transistor 74 and P-channel MOS transistor 75 and the transfer gate configured by N-channel MOS transistor 78 and P-channel MOS transistor 79 are not made conductive; therefore, the power supply line of internal buck voltage VddT and the power supply line of external power supply voltage VddL are disconnected from each other.

As described above, in accordance with a CONNECT signal received externally, VddT-VddL direct-connection circuit 65 directly connects between internal buck voltage VddT and external power supply voltage VddL.

(Vpp-VddL Direct-Connection Circuit)

Figure 17:
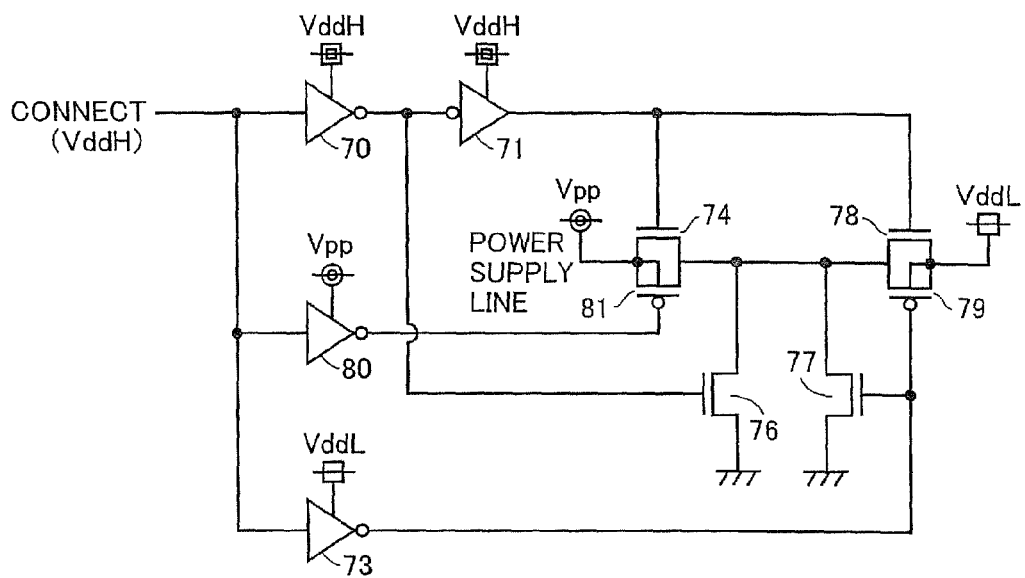
FIG. 17 is a schematic configuration diagram illustrating a Vpp-VddL direct-connection circuit.

With reference to FIG. 17, Vpp-VddL direct-connection circuit 66 receives a CONNECT signal, having a voltage level of an external power supply voltage VddH, from level converter 20, and applies an external power supply voltage VddL to a power supply line of a boost voltage Vpp. Herein, Vpp-VddL direct-connection circuit 66 is different from VddT-VddL direct-connection circuit 65 illustrated in FIG. 16 in the following point: an inverter 80 is provided in place of inverter 72 and a P-channel MOS transistor 81 is provided in place of P-channel MOS transistor 75.

Inverter 80 is driven by a boost voltage Vpp, receives a CONNECT signal, and outputs an inversion signal of the received CONNECT signal. The other configurations of inverter 80 are similar to those of inverter 72.

P-channel MOS transistor 81 has a gate connected to an output of inverter 80. The other configurations of P-channel MOS transistor 81 are similar to those of P-channel MOS transistor 75.

Operations of Vpp-VddL direct-connection circuit 66 are similar to those of VddT-VddL direct-connection circuit 65; therefore, detailed description thereof will not be repeated here.

(Vneg-Gnd Direct-Connection Circuit)

Figure 18:
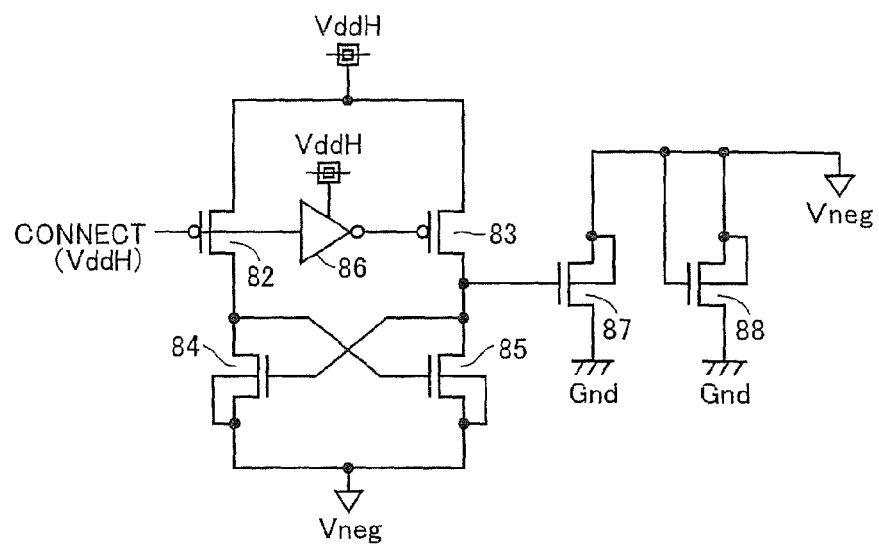
FIG. 18 is a schematic configuration diagram illustrating a Vneg-Gnd direct-connection circuit.

With reference to FIG. 18, Vneg-Gnd direct-connection circuit 67 receives a CONNECT signal, having a voltage level of an external power supply voltage VddH, from level converter 20, and applies a ground voltage Gnd to a power supply line of a negative voltage Vneg. Vneg-Gnd direct-connection circuit 67 includes P-channel MOS transistors 82 and 83, N-channel MOS transistors 84, 85, 87 and 88, and an inverter 86.

P-channel MOS transistor 82 and N-channel MOS transistor 84 are connected in series between external power supply voltage VddH and the power supply line of negative voltage Vneg. P-channel MOS transistor 83 and N-channel MOS transistor 85 are connected in series between external power supply voltage VddH and the power supply line of negative voltage Vneg.

Inverter 86 is driven by an external power supply voltage VddH, receives a CONNECT signal, and outputs an inversion signal of the received CONNECT signal.

P-channel MOS transistor 82 has a gate receiving a CONNECT signal, and P-channel MOS transistor 83 has a gate receiving an inversion signal of a CONNECT signal via inverter 86.

N-channel MOS transistor 84 has a gate connected to a drain of P-channel MOS transistor 83, and N-channel MOS transistor 85 has a gate connected to a drain of P-channel MOS transistor 82.

N-channel MOS transistor 87 is connected between the power supply line of negative voltage Vneg and ground voltage Gnd, and has a gate connected to the drain of P-channel MOS transistor 83. N-channel MOS transistor 88 is connected between the power supply line of negative voltage Vneg and ground voltage Gnd, and has a gate connected to a drain thereof.

Hereinafter, description will be given of operations of Vneg-Gnd direct-connection circuit 67. Upon reception of a CONNECT signal of H level externally, P-channel MOS transistor 82 enters a non-conductive state without being activated. P-channel MOS transistor 83 receives an inversion signal of L level via inverter 86 and, therefore, is activated and enters a conductive state. Since P-channel MOS transistor 83 enters a conductive state, the gate of N-channel MOS transistor 84 is supplied with an external power supply voltage VddH. Then, N-channel MOS transistor 84 is activated and enters a conductive state. Further, since N-channel MOS transistor 84 enters a conductive state, the gate of N-channel MOS transistor 85 is supplied with a negative voltage Vneg. Then, N-channel MOS transistor 85 enters a non-conductive state without being activated.

Since P-channel MOS transistor 83 enters a conductive state and N-channel MOS transistor 85 enters a non-conductive state, an external power supply voltage VddH is caused at the drain of P-channel MOS transistor 83, so that N-channel MOS transistor 87 is activated. Thus, N-channel MOS transistor 87 is made conductive, and the power supply line of negative voltage Vneg is supplied with a ground voltage Gnd. N-channel MOS transistor 88 has a gate and a source supplied with same voltage and, therefore, enters a non-conductive state without being activated.

On the other hand, upon reception of a CONNECT signal of L level externally, P-channel MOS transistor 82 is activated and enters a conductive state. P-channel MOS transistor 83 receives an inversion signal of H level via inverter 86 and, therefore, enters a non-conductive state without being activated. Since P-channel MOS transistor 82 enters a conductive state, the gate of N-channel MOS transistor 85 is supplied with an external power supply voltage VddH. Then, N-channel MOS transistor 85 is activated and enters a conductive state. Further, since N-channel MOS transistor 85 enters a conductive state, the gate of N-channel MOS transistor 84 is supplied with a negative voltage Vneg. Then, N-channel MOS transistor 84 enters a non-conductive state without being activated.

Since P-channel MOS transistor 83 enters a non-conductive state and N-channel MOS transistor 85 enters a conductive state, a negative voltage Vneg is applied at the drain of P-channel MOS transistor 83, so that N-channel MOS transistor 87 is not activated. Thus, N-channel MOS transistor 87 enters a non-conductive state, so that the power supply line of negative voltage Vneg is supplied with no ground voltage Gnd.

As described above, Vneg-Gnd direct-connection circuit 67 can directly connect between negative voltage Vneg and ground voltage Gnd in accordance with a CONNECT signal received externally.

(Internal Power Generation Circuit)

As illustrated in FIG. 15, in order to supply an external power supply voltage VddL or a ground voltage Gnd as an internal buck voltage VddT, a boost voltage Vpp and a negative voltage Vneg each serving as internal power, it is necessary to block an output line of internal power generation circuit 10, that is, to make the output line of internal power generation circuit 10 floating.

Figure 19:
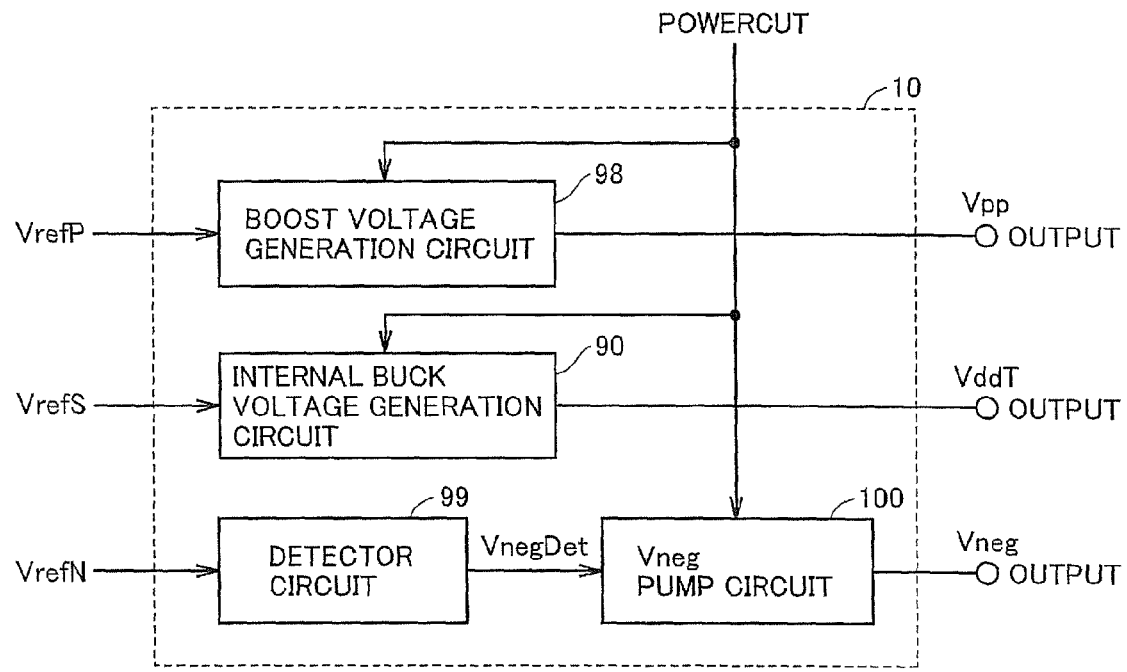
FIG. 19 is a schematic configuration diagram illustrating an internal power generation circuit.

With reference to FIG. 19, internal power generation circuit 10 includes an internal buck voltage generation circuit 90, a boost voltage generation circuit 98, a detector circuit 99 and a Vneg pump circuit 100. Each of internal buck voltage generation circuit 90, boost voltage generation circuit 98 and Vneg pump circuit 100 receives a POWERCUT signal from standby circuit 9, and makes an output circuit floating.

Figure 20:
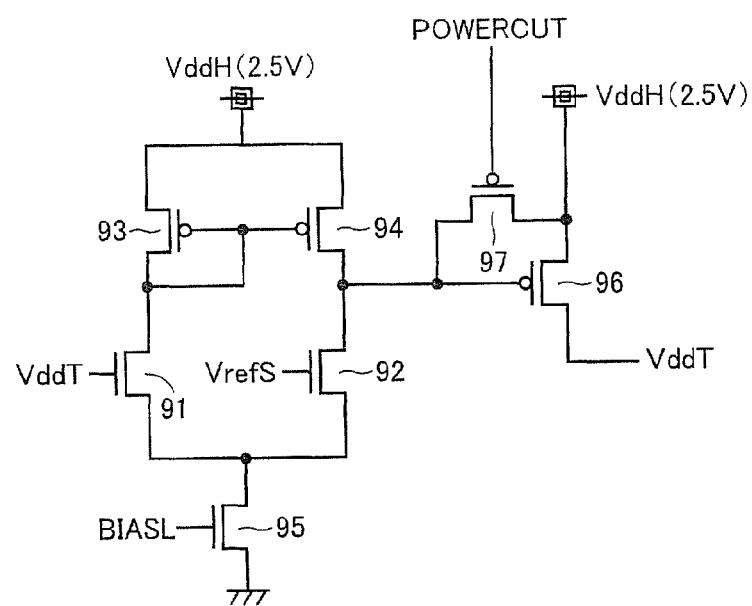
FIG. 20 is a circuit diagram illustrating an internal buck voltage generation circuit.

With reference to FIG. 20, internal buck voltage generation circuit 90 generates an internal buck voltage VddT in accordance with a reference voltage VrefS supplied from reference voltage generation circuit 7. Internal buck voltage generation circuit 90 includes N-channel MOS transistors 91, 92 and 95, and P-channel MOS transistors 93, 94, 96, and 97.

N-channel MOS transistor 91 and P-channel MOS transistor 93 are connected in series 91. N-channel MOS transistor 93 has one end connected to an external power supply voltage VddH. N-channel MOS transistor 92 and P-channel MOS transistor 94 are connected in series. N-channel MOS transistor 94 has one end connected to external power supply voltage VddH. N-channel MOS transistor 95 is connected between ground voltage Gnd and N-channel MOS transistors 91 and 92.

N-channel MOS transistor 91 has a gate supplied with an internal buck voltage VddT, and N-channel MOS transistor 92 has a gate supplied with a reference voltage VrefS. N-channel MOS transistor 95 has a gate supplied with a bias voltage BIASL output from reference voltage generation circuit 7 (see FIG. 13).

P-channel MOS transistors 93 and 94 have gates each connected in common to a drain of P-channel MOS transistor 93.

P-channel MOS transistor 96 is connected to external power supply voltage VddH.

P-channel MOS transistor 97 is connected to a source and a gate of P-channel MOS transistor 96, and has a gate receiving a POWERCUT signal.

Hereinafter, description will be given of operations of internal buck voltage generation circuit 90. N-channel MOS transistors 91 and 92 and P-channel MOS transistors 93 and 94 configure a differential circuit to compare an internal buck voltage VddT supplied to the gate of N-channel MOS transistor 91 with a reference voltage VrefS supplied to the gate of N-channel MOS transistor 92 and to feed a current according to a potential difference, obtained from the comparison, to the gate of P-channel MOS transistor 96. Then, P-channel MOS transistor 96 changes a drain resistance in accordance with a voltage supplied to the gate, and reaches an equilibrium at a point that internal buck voltage VddT is coincident with reference voltage Vref. More specifically, internal buck voltage generation circuit 90 feeds back internal buck voltage VddT output from P-channel MOS transistor 96 and compares internal buck voltage VddT with reference voltage VrefS to thereby generate an internal buck voltage VddT equal to reference voltage Vref.

Further, upon reception of a POWERCUT signal from standby circuit 9, internal power generation circuit 90 blocks an output of an internal buck voltage VddT and makes it floating. Upon reception of a POWERCUT signal of L level, P-channel MOS transistor 97 is activated and enters a conductive state. Hence, a source-gate voltage Vgs of P-channel MOS transistor 96 becomes almost zero, so that P-channel MOS transistor 96 enters a non-conductive state without being activated. Therefore, upon reception of a POWERCUT signal of 1, level, internal buck voltage VddT is blocked and made floating.

On the other hand, upon reception of a POWERCUT signal of H level, P-channel MOS transistor 97 is not activated. Therefore, P-channel MOS transistor 96 generates an internal buck voltage VddT from an external power supply voltage VddH to output internal buck voltage VddT.

As described above, in accordance with a POWERCUT signal received externally, internal buck voltage generation circuit 90 outputs an internal buck voltage VddT or makes internal buck voltage VddT floating.

Figure 21:
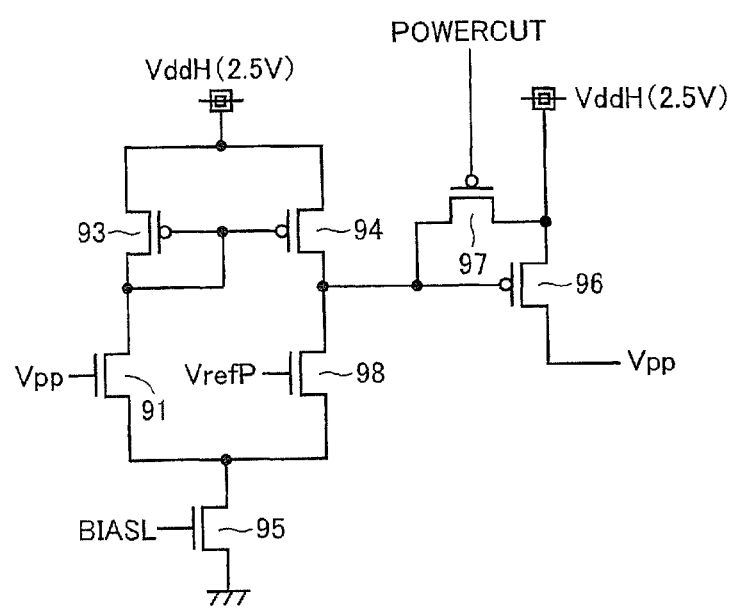
FIG. 21 is a circuit diagram illustrating a boost voltage generation circuit.

With reference to FIG. 21, boost voltage generation circuit 98 generates a boost voltage Vpp in accordance with a reference voltage VrefP supplied from reference voltage generation circuit 7 (see FIG. 13). Boost voltage generation circuit 98 is different from internal buck voltage generation circuit 90 illustrated in FIG. 20 in the following point: an N-channel MOS transistor 98 is provided in place of N-channel MOS transistor 92.

N-channel MOS transistor 98 has a gate supplied with a reference voltage VrefP from reference voltage generation circuit 7.

As in internal buck voltage generation circuit 90, boost voltage generation circuit 98 outputs a boost voltage Vpp or makes boost voltage Vpp floating in accordance with a POWERCUT signal received externally.

The other configurations are similar to those of internal buck voltage generation circuit 90; therefore, detailed description thereof will not be repeated here.

Figure 22:
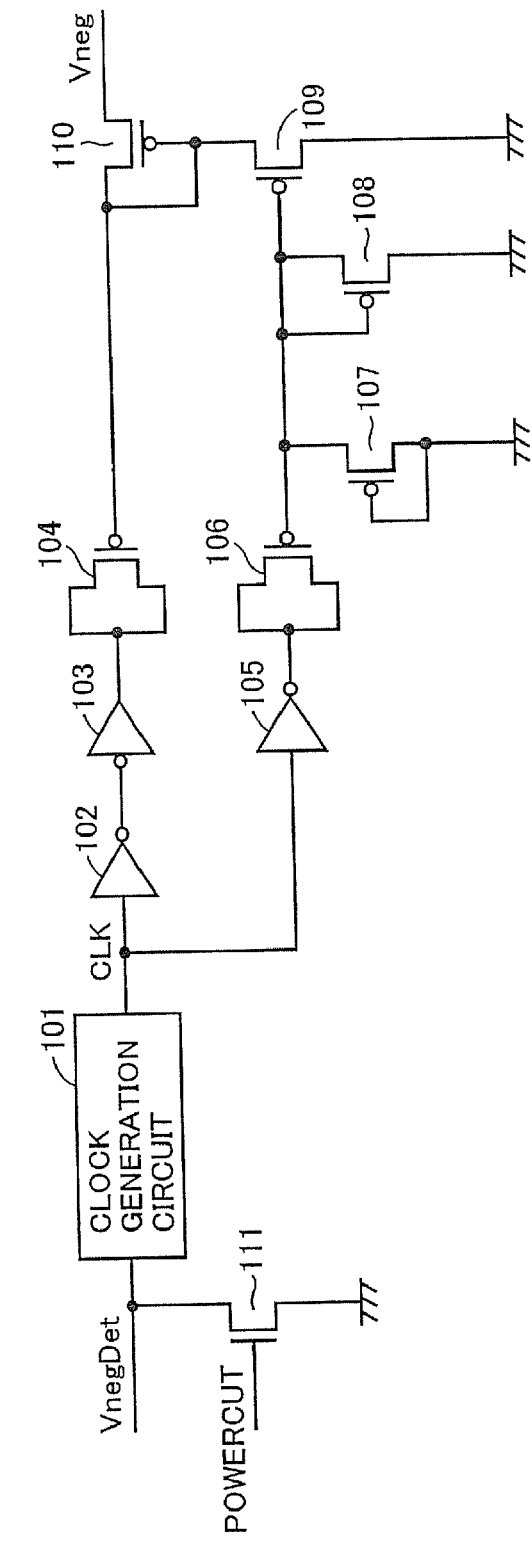
FIG. 22 is a circuit diagram illustrating a negative voltage generation circuit.

With reference to FIG. 22, negative voltage generation circuit 112 receives a negative voltage detection signal VnegDet of H or L level, output from detector circuit 99 (see FIG. 19), and performs a pump operation only during a period that negative voltage detection circuit VnegDet is at H level to generate a negative voltage. Negative voltage generation circuit 112 includes a clock generation circuit 101, inverters 102, 103 and 105, capacitive elements 104 and 106, P-channel MOS transistors 107, 108, 109, and 110, and an N-channel MOS transistor 11.

Clock signal generation circuit 101 receives a negative voltage detection signal VnegDet of H level and, then, generates and outputs a clock signal CLK having a predetermined cycle.

Inverters 102 and 103 are connected in series, amplify clock signal CLK output from clock generation circuit 101, and transmit amplified clock signal CLK to capacitive element 104.

Inverter 105 amplifies clock signal CLK output from clock generation circuit 101 in an inversion manner, and transmits amplified clock signal CLK to capacitive element 106.

Capacitive element 104 is connected between inverter 103 and P-channel MOS transistor 110.

Capacitive 106 is connected between inverter 105 and a gate of P-channel MOS transistor 109.

P-channel MOS transistors 107 and 108 are connected between a gate of capacitive element 106 and a ground voltage Gnd. P-channel MOS transistor 107 has a gate connected to a drain thereof. P-channel MOS transistor 108 has a gate connected to a drain thereof.

P-channel MOS transistor 110 is connected between capacitive element 104 and an output node of a negative voltage Vneg. P-channel MOS transistor 110 has a gate connected to a source of P-channel MOS transistor 109.

N-channel MOS transistor 111 is connected between an input node of clock generation circuit 101 and a ground voltage Gnd, and has a gate receiving a POWERCUT signal.

In negative voltage generation circuit 112, capacitive elements 104 and 106 are alternately turned on and off in a repetition manner in accordance with clock signal CLK to pull out an electric charge toward a ground voltage Gnd. As a result, a voltage output from P-channel MOS transistor 110 becomes negative. Detector circuit 99 controls a period for outputting a negative voltage detection signal VnegDet of H level in such a manner that a negative voltage Vneg output from P-channel MOS transistor 110 has a predetermined value.

Further, upon reception of a POWERCUT signal from standby circuit 9 (see FIG. 13), negative voltage generation circuit 112 forcibly places a negative voltage detection signal VnegDet in L level to make negative voltage detection signal VnegDet floating. Upon reception of a POWERCUT signal of L level, N-channel MOS transistor 111 is activated and enters a conductive state. Thus, clock generation circuit 101 is set at L level and, therefore, generates no clock signal CLK. Accordingly, upon reception of the POWERCUT signal of L level, negative voltage Vneg is blocked and made floating.

On the other hand, upon reception of a POWERCUT signal of H level, N-channel MOS transistor 111 is not activated. Therefore, clock generation circuit 101 generates a clock signal CLK, so that a negative voltage Vneg is output.

As described above, negative voltage generation circuit 112 outputs a negative voltage Vneg or makes negative voltage Vneg floating in accordance with a POWERCUT signal received externally.

(Intermediate Voltage Generation Circuit)

Figure 23:
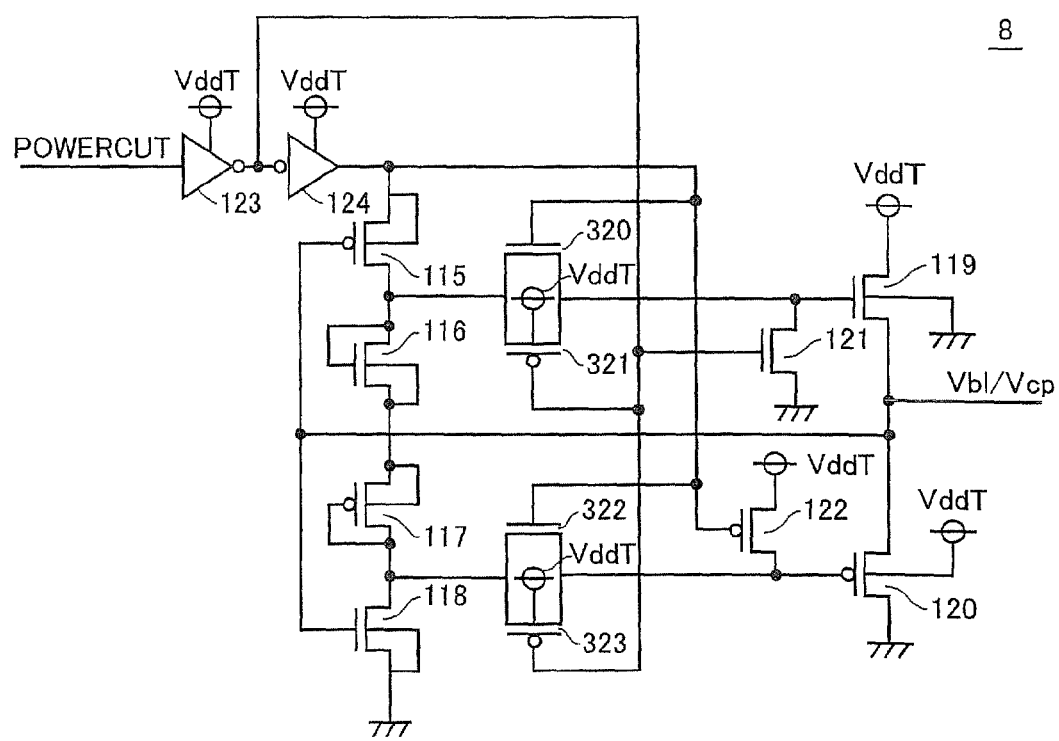
FIG. 23 is a circuit diagram illustrating an intermediate voltage generation circuit.

With reference to FIG. 23, intermediate voltage generation circuit 8 is a source-follower type push-pull circuit, and includes P-channel MOS transistors 115, 117, 120, 122, 321, and 323, N-channel MOS transistors 116, 118, 119, 121, 320, and 322, and inverters 123 and 124.

P-channel MOS transistor 115, N-channel MOS transistor 116, P-channel MOS transistor 117, and N-channel MOS transistor 118 are connected in series between an output of inverter 124 and a ground voltage Gnd. Herein, each of P-channel MOS transistor 115 and N-channel MOS transistor 118 functions as a feedback resistor, and each of N-channel MOS transistor 116 and P-channel MOS transistor 117 functions as a threshold transistor. In case of a P-channel MOS transistor, a threshold transistor has a gate and a drain equal in potential to each other.

Inverters 123 and 124 are connected at two stages, amplify a POWERCUT signal received from standby circuit 9 to a level of an internal buck voltage VddT, and output amplified POWERCUT signal.

N-channel MOS transistor 119 and P-channel MOS transistor 120 are connected in series between an internal buck voltage VddT and a ground voltage Gnd, and an intermediate voltage Vbl/Vcp is output from a node therebetween.

Each of P-channel MOS transistor 115 and N-channel MOS transistor 118 has a gate supplied with intermediate voltage Vbl/Vcp.

N-channel MOS transistor 116 has a gate connected to a drain of P-channel MOS transistor 115 and, also, connected to a gate of N-channel MOS transistor 119. P-channel MOS transistor 117 has a gate connected to a source of N-channel MOS transistor 118 and, also, connected to a gate of P-channel MOS transistor 120.

N-channel MOS transistor 320 and P-channel MOS transistor 321 are interposed in parallel between a node between P-channel MOS transistor 115 and N-channel MOS transistor 116 and the gate of N-channel MOS transistor 119 to configure a transfer gate.

N-channel MOS transistor 322 and P-channel MOS transistor 323 are interposed in parallel between a node between P-channel MOS transistor 117 and N-channel MOS transistor 118 and the gate of P-channel MOS transistor 120 to configure a transfer gate.

N-channel MOS transistor 121 is connected between the gate of N-channel MOS transistor 119 and a ground voltage Gnd, and P-channel MOS transistor 122 is connected between P-channel MOS transistor 120 and an internal buck voltage VddT.

P-channel MOS transistor 122, and N-channel MOS transistors 320 and 322 receive POWERCUT signals, output from standby circuit 9, via inverters 123 and 124. Each of N-channel MOS transistor 121, and P-channel MOS transistors 321 and 323 has a gate receiving an inversion signal of a POWERCUT signal via inverter 123.

In intermediate voltage generation circuit 8, an intermediate voltage Vbl/Vcp corresponding to a half of an internal buck voltage VddT is output from a connection node between N-channel MOS transistor 119 and P-channel MOS transistor each connected in series between internal buck voltage VddT and ground voltage Gnd, Each of P-channel MOS transistor 115 and N-channel MOS transistor 118 is supplied with intermediate voltage Vbl/Vcp at their gates, so that a through current passes from internal buck voltage VddT toward ground voltage Gnd.

Further, upon reception of a POWERCUT signal from standby circuit 9, intermediate voltage generation circuit 8 blocks intermediate voltage Vbl/Vcp and makes intermediate voltage Vbl/Vcp floating. Upon reception of a POWERCUT signal of L level, inverter 124 outputs L level (ground voltage Gnd), so that no thorough current passes.

N-channel MOS transistors 320 and 322 receive signals of H level via inverters 123 and 124, and enter a non-conductive state. In addition, P-channel MOS transistors 321 and 323 receive signals of H level via inverter 123, and enter a non-conductive state. Accordingly, upon reception of a POWERCUT signal of L level, intermediate voltage Vbl/Vcp is blocked and made floating.

Further, N-channel MOS transistor 121 and P-channel MOS transistor 122 are activated, the gate of P-channel MOS transistor 119 is supplied with a ground voltage Grid, and the gate of N-channel MOS transistor 120 is supplied with an internal buck voltage VddT.

On the other hand, upon reception of a POWERCUT signal of H level, each of N-channel MOS transistors 320 and 322, and P-channel MOS transistors 321 and 323 is activated and enters a conductive state, so that intermediate voltage generation circuit 8 outputs an intermediate voltage Vbl/Vcp.

As described above, intermediate voltage generation circuit 8 outputs an intermediate voltage Vbl/Vcp or makes intermediate voltage Vbl/Vcp floating in accordance with a POWERCUT signal received externally.

(Reference Voltage Generation Circuit)

As illustrated in FIG. 15, in deep standby mode 1, reference voltage generation circuit 7 outputs an internal buck voltage VddT as reference voltages VrefP and VrefS, and makes a reference voltage VrefN floating. On the other hand, in deep standby mode 2, reference voltage generation circuit 7 makes reference voltages VrefP, VrefS and VrefN floating.

Figure 24:
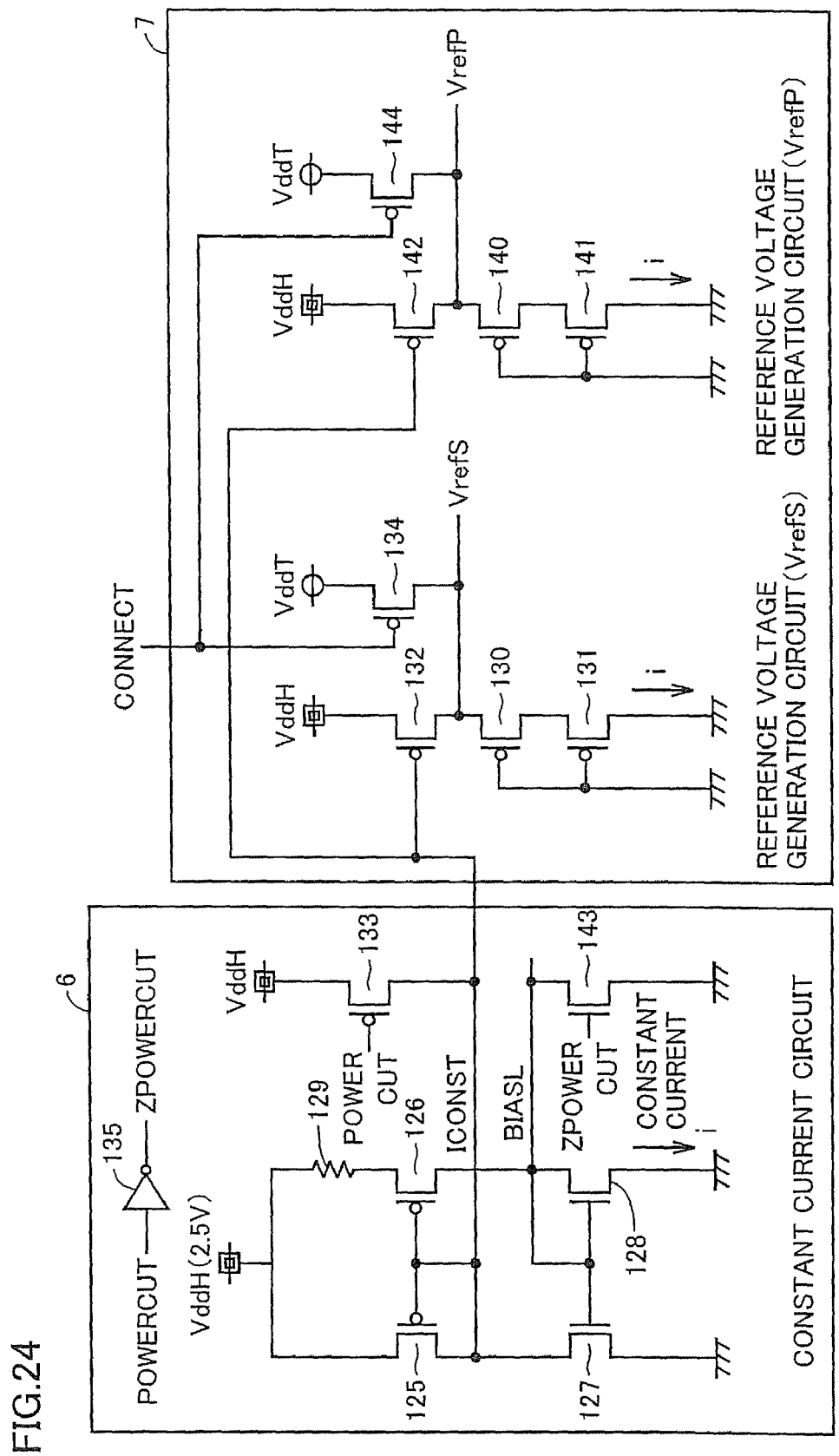
FIG. 24 illustrates main parts of a power supply standby module.

With reference to FIG. 24, reference voltage generation circuit 7 receives a constant current from constant current circuit 6, and generates reference voltages VrefP and VrefS based on the constant current.

Constant current circuit 6 includes P-channel MOS transistors 133, 125 and 1.26, N-channel MOS transistors 143, 127 and 128, a resistor 129, and an inverter 135.

P-channel MOS transistor 125 and N-channel MOS transistor 127 are connected in series between an external power supply voltage VddH and a ground voltage Gnd. Resistor 129, P-channel MOS transistor 126 and N-channel MOS transistor 128 are connected in series between external power supply voltage VddH and ground voltage Gnd.

P-channel MOS transistors 125 and 126 have gates connected in common to a drain of P-channel MOS transistor 125, and a constant current ICONST is output from a node therebetween.

N-channel MOS transistors 127 and 128 have gates connected to each other and, also, connected in common to a drain of N-channel MOS transistor 128. Further, a bias voltage BIASL, is output from a node between N-channel MOS transistors 127 and 128.

Constant current circuit 6 forms a current mirror circuit, and outputs a constant current ICONST generated in accordance with external power supply voltage VddH and resistor 129.

Inverter 135 receives a POWERCUT signal, inverts a level of the POWERCUT signal, and outputs a resultant ZPOWERCUT signal.

P-channel MOS transistor 133 has a drain connected to a constant current ICONST, and a gate receiving a POWERCUT signal. N-channel MOS transistor 143 has a drain connected to a bias voltage BIASL, and a gate receiving a ZPOWERCUT signal.

In case of a POWERCUT signal of L level, the gate of P-channel MOS transistor 133 is set at L level and the gate of N-channel MOS transistor 143 is set at H level. Therefore, P-channel MOS transistor 133 and N-channel MOS transistor 143 are activated and enter a conductive state. Thus, a voltage between a source and a gate of each of P-channel MOS transistors 132 and 142 becomes almost zero; therefore, P-channel MOS transistors 132 and 142 enter a non-conductive state without being activated. Accordingly, upon reception of a POWERCUT signal of L level, reference voltages VrefS and VrefP are blocked and made floating.

On the other hand, in case of a POWERCUT signal of H level, the gate of P-channel MOS transistor 133 is set at H level and the gate of N-channel MOS transistor 143 is set at L level. Therefore, both P-channel MOS transistor 133 and N-channel MOS transistor 143 are not activated; thus, P-channel MOS transistors 132 and 142 output reference voltages VrefS and VrefP, respectively.

Reference voltage generation circuit 7 receives a constant current ICONST from constant current circuit 6, and generates reference voltages VrefS and VrefP. Reference voltage generation circuit 7 includes P-channel MOS transistors 130, 131, 132, 134, 140, 141, 142, and 144.

P-channel MOS transistors 130, 131 and 132 are connected in series between an external power supply voltage VddH and a ground voltage Gnd. P-channel MOS transistors 130 and 131 have gates each connected to a ground voltage Gnd, and P-channel MOS transistor 132 has a gate receiving a constant current ICONST output from constant current circuit 6. P-channel MOS transistor 132 generates a through current in accordance with a constant current ICONST, and a voltage generated by P-channel MOS transistors 130 and 131 is output as a reference voltage VrefS from a node between P-channel MOS transistor 132 and P-channel MOS transistor 130.

Similarly, P-channel MOS transistors 140, 141 and 142 are connected in series between external power supply voltage VddH and ground voltage Gnd. P-channel MOS transistors 140 and 141 have gates each connected to ground voltage Gnd, and P-channel MOS transistor 142 has a gate receiving constant current ICONST output from constant current circuit 6. P-channel MOS transistor 142 generates a through current in accordance with constant current ICONST, and a voltage generated by P-channel MOS transistors 140 and 141 is output as reference voltage VrefP from a node between P-channel MOS transistor 142 and P-channel MOS transistor 140.

Upon reception of a POWERCUT signal from standby circuit 9 (see FIG. 13), reference voltage generation circuit 7 blocks reference voltages VrefS and VrefP and makes reference voltages VrefS and VrefP floating. Upon reception of a CONNECT signal from standby circuit 9, reference voltage generation circuit 7 outputs an internal buck voltage VddT in place of reference voltages VrefS and VrefP.

P-channel MOS transistor 134 is connected between internal buck voltage VddT and an output node of reference voltage VrefS, and P-channel MOS transistor 144 is connected between internal buck voltage VddT and an output node of reference voltage VrefP. P-channel MOS transistors 134 and 144 have gates each receiving the CONNECT signal.

Upon reception of the CONNECT signal of L level, P-channel MOS transistors 134 and 144 are activated and enter a conductive state. Hence, the output nodes of reference voltages VrefS and VrefP receive internal buck voltage VddT.

On the other hand, upon reception of the CONNECT signal of H level, P-channel MOS transistors 134 and 144 are not activated; therefore, the output nodes of reference voltages VrefS and VrefP receive no internal buck voltage VddT.

Figure 25:
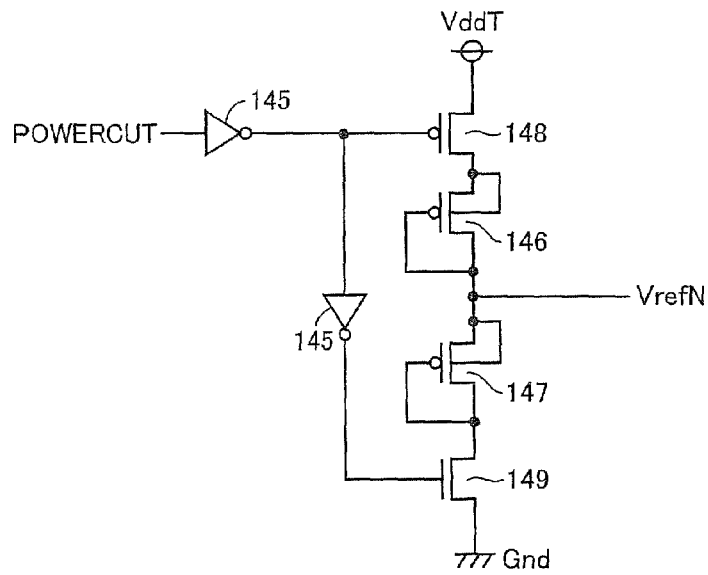
FIG. 25 is a schematic configuration diagram illustrating a reference voltage VrefN generation circuit included in a reference voltage generation circuit.

With reference to FIG. 25, a reference voltage VrefN generation circuit includes P-channel MOS transistors 146, 147 and 148, an N-channel MOS transistor 149, and inverters 145.

P-channel MOS transistors 148, 146 and 147, and N-channel MOS transistor 149 are connected in series between an internal buck voltage VddT and a ground voltage Gnd. P-channel MOS transistors 146 and 147 have gates connected to drains thereof, respectively. Further, a reference voltage VrefN is output from a node between P-channel MOS transistor 146 and P-channel MOS transistor 147.

P-channel MOS transistor 148 has a gate receiving an inversion signal of a POWERCUT signal via inverter 145, and N-channel MOS transistor 149 has a gate receiving a POWERCUT signal via two inverters 145.

Upon reception of a POWERCUT signal of L level from standby circuit 9, P-channel MOS transistor 148 enters a non-conductive state without being activated. N-channel MOS transistor 149 receives a signal of H level via two inverters 145 and, therefore, enters a non-conductive state without being activated. Accordingly, a reference voltage VrefN to be output is blocked and made floating.

On the other hand, upon reception of a POWERCUT signal of H level, P-channel MOS transistor 148 and N-channel MOS transistor 149 are activated and enter a conductive state. Accordingly, an intermediate voltage between internal buck voltage VddT and ground voltage Gnd is output as reference voltage VrefN.

As described above, a reference voltage VrefN generation circuit outputs a reference voltage VrefN or makes reference voltage VrefN floating in accordance with a POWERCUT signal received externally.

As described above, standby circuit 9 realizes deep standby modes 1 and 2 by provision of the CONNECT signal and the POWERCUT signal.

According to the fifth embodiment of the present invention, it is possible to realize deep standby mode 1 for stopping supply of internal power from an internal power generation circuit to a load to thereby suppress power consumption in the internal power generation circuit, and precharging external power in place of internal power to thereby reducing a recovery time. Even upon occurrence of frequent shift to deep standby mode 1, influence on an entire processing speed can be suppressed as much as possible; therefore, it is possible to suppress power consumption to be low and maintain a processing speed simultaneously.

According to the fifth embodiment of the present invention, it is possible to realize deep standby mode 2 for stopping supply of internal power to a load. Therefore, it is possible to limit power consumed by a circuit as a whole to an off-leak current by an internal power generation circuit, and significantly suppress power consumption to be low.

Sixth Embodiment

In each of the first to third embodiments, the description is given of a memory macro including components driven by an external power supply voltage and components driven by internal power. In the fifth embodiment, the description is given of a configuration having a deep standby function. Effects of these configurations are exerted independently, but may be realized at the same time. In a sixth embodiment, description will be given of a case that the deep standby function in the fifth embodiment is added to any one of the configurations in the first to third embodiments.

In the first to third embodiments, level converter 21 illustrated in FIG. 6 is placed to perform transmission/reception of a control signal between components driven by different power supply voltages. When the deep standby mode in the fifth embodiment is added to such a configuration, an internal buck voltage VddT is made floating in deep standby mode 2. In a case of a recovery from deep standby mode 2 to a standby mode, there is a possibility that level converter 21 erroneously outputs H level as an output of level converter 21 in a process that internal buck voltage VddT increases to a specified voltage value. Therefore, it is desired to provide a level conversion circuit for suppressing erroneous output by level converter 21.

Figure 26:
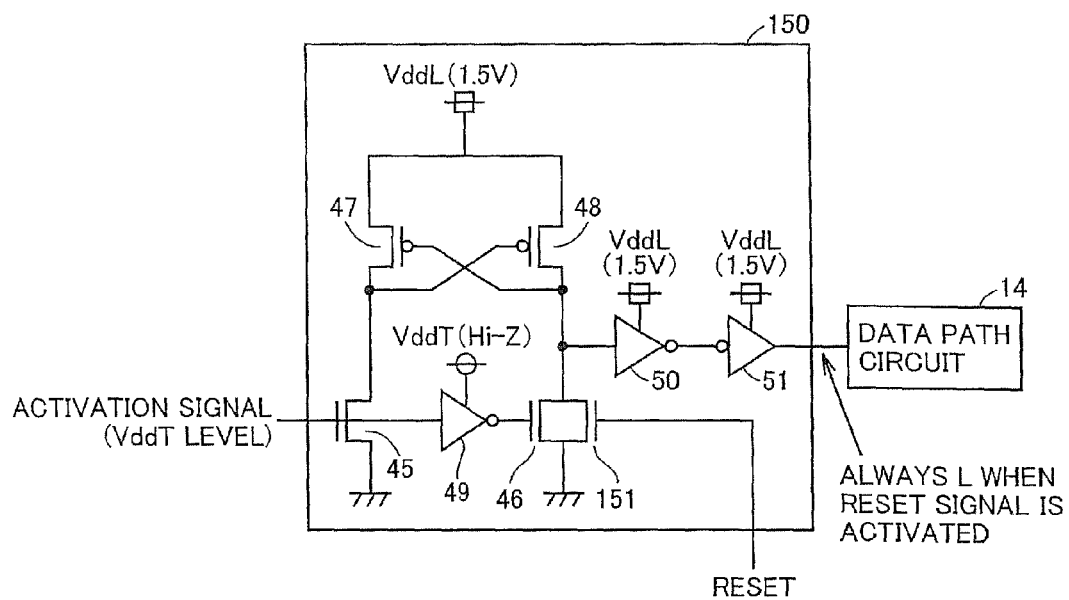
FIG. 26 is a circuit configuration diagram illustrating a level conversion circuit according to a sixth embodiment.

With reference to FIG. 26, a level conversion circuit 150 according to the sixth embodiment is different from level converter 21 illustrated in FIG. 6 in the following point: an N-channel MOS transistor 151 is additionally provided.

N-channel MOS transistor 151 is connected to an N-channel MOS transistor 46 in parallel, and has a gate receiving a RESET signal from a standby circuit 9 (see FIG. 13). In a recovery from a deep standby mode 2 to a standby mode, standby circuit 9 transmits a RESET signal of H level. Then, N-channel MOS transistor 151 receives the RESET signal of H level at its gate, is activated, and enters a conductive state.

Since N-channel MOS transistor 151 enters a conductive state, an inverter 50 is supplied with a ground voltage Gnd (L level), and an activation signal of L level is forcibly output to a data path 14.

The other configurations of level conversion circuit 150 are similar to those of level converter 21 illustrated in FIG. 6; therefore, detailed description thereof will not be repeated here.

As described above, it is possible to avoid such a situation that level conversion circuit 150 erroneously outputs an activation signal of H level in a recovery from deep standby mode 2 to the standby mode.

According to the sixth embodiment of the present invention, it is possible to achieve a stable operation and suppressed power consumption of a memory macro in the first to third embodiments. In addition, it is possible to achieve low power consumption by a deep standby mode in the fifth embodiment. Thus, it is possible to realize a semiconductor device with lower power consumption.

Seventh Embodiment

In the fifth embodiment, the description is given of a shift to two deep standby modes. On the other hand, in a seventh embodiment, description will be given of a recovery from deep standby modes at a higher speed.

Figure 27:
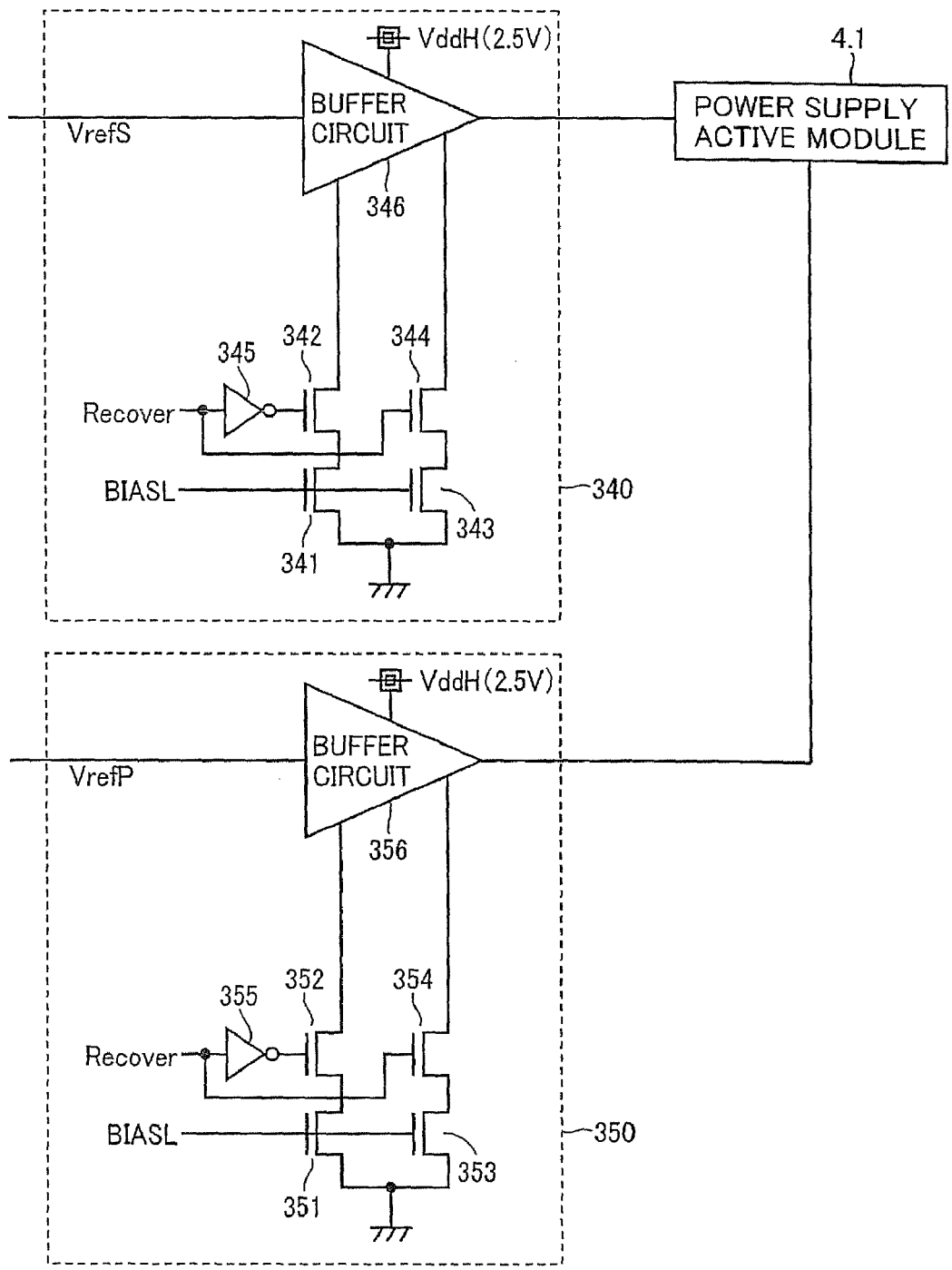
FIG. 27 illustrates main parts of a reference voltage generation circuit according to a seventh embodiment.

With reference to FIG. 27, a reference voltage generation circuit 330 according to the seventh embodiment includes a VrefS buffer circuit 340 and a VrefP buffer circuit 350.

VrefS buffer circuit 340 and VrefP buffer circuit 350 amplify drivability, and output a reference voltage VrefS and a reference voltage VrefP to a power supply active module, respectively. Each of VrefS buffer circuit 340 and VrefP buffer circuit 350 receives a recovery signal Recover from a standby circuit 9 (see FIG. 13) to enhance an amplification gain, and reduces a recovery time from a deep standby mode 1 or 2 to a standby mode or an active mode.

Standby circuit 9 sets recovery signal Recovery at H level only during a period of a recovery from a deep standby mode to a standby mode or an active mode.

VrefS buffer circuit 340 includes a buffer circuit 346, N-channel MOS transistors 341, 342, 343, and 344, and an inverter 345.

N-channel MOS transistors 341 and 342 are connected in series between a ground voltage Gnd and buffer circuit 346. Similarly, N-channel MOS transistors 343 and 344 are connected in series between ground voltage Gnd and buffer circuit 346. N-channel MOS transistors 341 and 343 have gates each supplied with a bias voltage BIASL. N-channel MOS transistor 342 has a gate receiving a recovery signal Recover inverted by inverter 345, and N-channel MOS transistor 344 has a gate receiving a recovery signal Recover.

A size (a ratio between a channel length L and a channel width W; W/L) of each of N-channel MOS transistors 341 and 343 is appropriately selected, so that a through current generated when the gates are supplied with an identical bias voltage BIASL is adjusted. In the seventh embodiment, N-channel MOS transistor 343 is larger in size than N-channel MOS transistor 341. Therefore, a through current fed from N-channel MOS transistor 343 is larger than a through current fed from N-channel MOS transistor 341.

Buffer circuit 346 receives a through current from an external power supply voltage VddH via N-channel transistors 341 and 342 or N-channel MOS transistors 343 and 344. Then, buffer circuit 346 amplifies a reference voltage VrefS with drivability according to the supplied through current, and outputs amplified reference voltage VrefS.

Hereinafter, description will be given of operations of VrefS buffer circuit 340. In one of deep standby modes, a standby mode and an active mode, standby circuit 9 maintains a recovery signal Recovery at L level. Then, N-channel MOS transistor 342 receives at its gate a signal of H level via inverter 345 and, therefore, is activated and enters a conductive state. Hence, buffer circuit 346 is driven by a through current fed from N-channel MOS transistor 341.

On the other hand, in a predetermined period of a recovery from a deep standby mode to a standby mode or an active mode, standby circuit 9 sets a recovery signal Recovery at L level. Then, P-channel MOS transistor 344 receives at its gate a signal of H level and, therefore, enters a conductive state. Hence, N-channel MOS transistor 343 feeds a through current to buffer circuit 346.

As described above, a through current fed from N-channel MOS transistor 343 is larger than a through current fed from N-channel MOS transistor 341. Therefore, buffer circuit 346 obtains a larger amount of driving currents to enhance drivability.

Therefore, reference voltage generation circuit 330 can boost a reference voltage VrefS in a shorter time. In a deep standby mode 1, a reference voltage VrefS is precharged to an internal buck voltage VddT (1.5 V). However, since internal buck voltage VddT largely varies (1.4 to 1.7 V) depending on a temperature, it is necessary to enhance drivability of buffer circuit 346.

On the other hand, VrefP buffer circuit 350 includes a buffer circuit 356, N-channel MOS transistors 351, 352, 353, and 354, and an inverter 355. It is to be noted that operations of VrefP buffer circuit 350 are similar to those of VrefS buffer circuit 340; therefore, detailed description thereof will not be repeated here.

According to the seventh embodiment of the present invention, it is possible to realize a semiconductor device capable of recovering to a standby mode or an active mode in a shorter time, in a configuration having the deep standby function in the fifth or sixth embodiment.

Eighth Embodiment

In the fifth embodiment, the description is given of a case that a semiconductor device has deep standby modes 1 and 2 in addition to a normal standby mode. On the other hand, in an eighth embodiment, description will be given of a semiconductor device capable of achieving further power consumption in the standby mode illustrated in FIG. 15.

Figure 28:
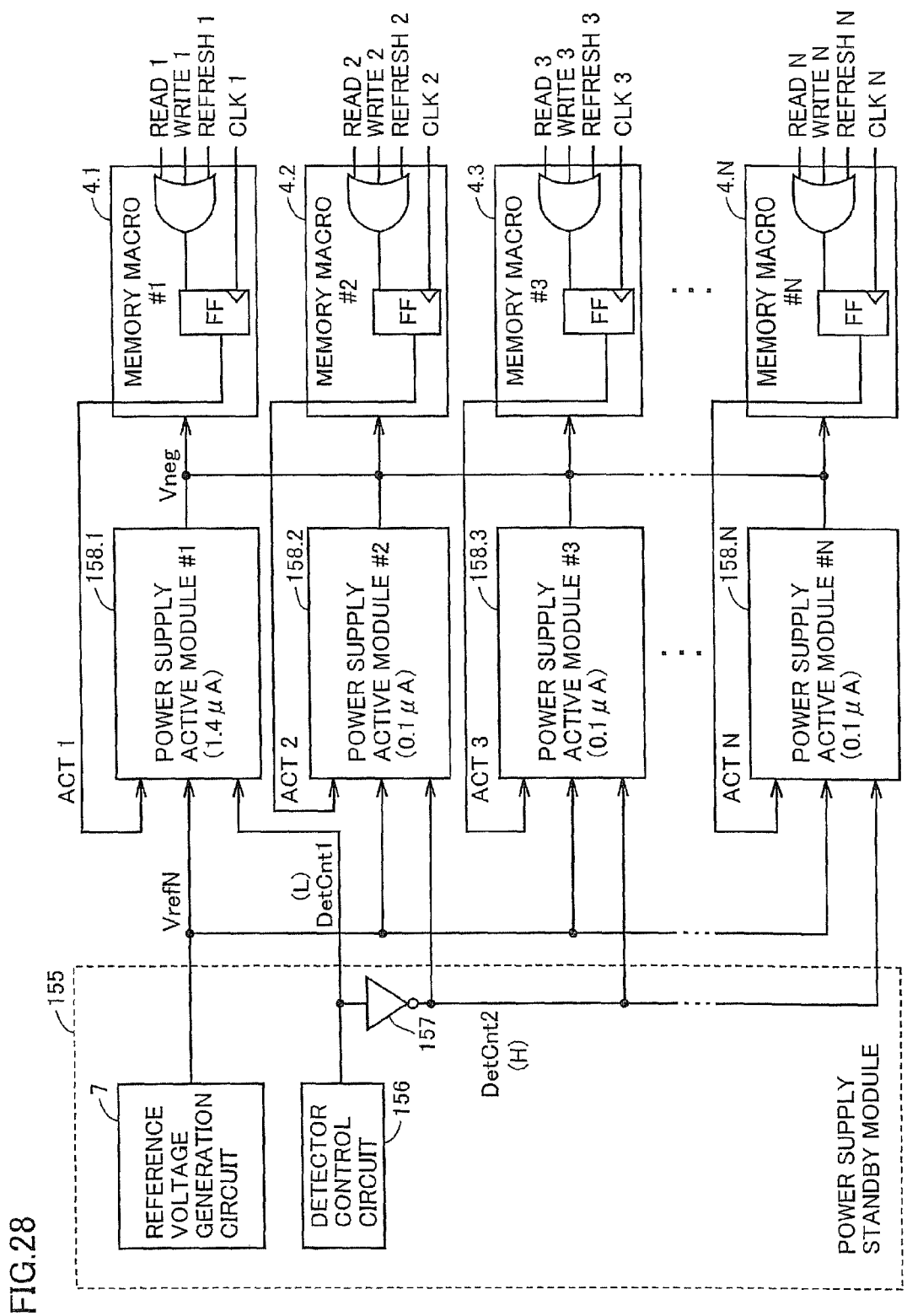
FIG. 28 illustrates main parts of a semiconductor device according to an eighth embodiment.

With reference to FIG. 28, the semiconductor device according to the eighth embodiment includes a power supply standby module 155, power supply active modules 158.1, 158.2, 158.3, . . . , and 158.N, and memory macros 4.1, 4.2, 4.3, . . . , and 4.N.

In a conventional technique, an active/standby switch type detector is used to change a through current in order to achieve both reduction of a standby current and response of an active detector at a high speed. However, also in a standby mode, power supply active modules 158.1, 158.2, 158.3, . . . , and 158.N consume a through current equal in amount each other. Consequently, in a case that the semiconductor device includes a number of memory macros 4.1, 4.2, 4.3, . . . , and 4.N as illustrated in FIG. 28, power consumption in the standby mode increases in proportion to the number of power supply active modules. In order to solve this problem, power consumption in a circuit for generating a negative voltage Vneg, which is especially low in conversion efficiency, is suppressed in the eighth embodiment.

A detector control circuit 156 allows a normal standby current to pass through power supply active module 158.1 so as to supply a stable negative voltage Vneg, and suppresses standby currents for the other power supply active modules to interrupt supply of a negative voltage Vneg; thus, suppression of entire power consumption is realized.

Power supply lines for negative voltages Vneg supplied from power supply active modules 158.1, 158.2, 158.3, . . . , and 158.N are connected in common, and power supply active module 158.1 can supply a negative voltage Vneg to all memory macros 4.1, 4.2, 4.3, . . . , and 4.N.

Power supply standby module 155 outputs a reference voltage VrefN, and a detector control signal DetCnt1 or an inversion signal DetCnt2 of detector control signal DetCnt1 to each of power supply active modules 158.1, 158.2, 158.3, . . . , and 158.N. Power supply standby module 155 includes a reference voltage generation circuit 7, a detector control circuit 156 and an inverter 157.

Reference voltage generation circuit 7 generates a reference voltage VrefN, and outputs reference voltage VrefN to each of power supply active modules 158.1, 158.2, 158.3, . . . , and 158.N. The other configurations of reference voltage generation circuit 7 are similar to those described above; therefore, detailed description thereof will not be repeated here.

Detector control circuit 156 outputs a detector control signal DetCnt1 of L level to power supply active module 158.1 in a stationary manner irrespective of an active mode and a standby state.

Inverter 157 receives detector control signal DetCnt1 output from detector control circuit 1.56, inverts the level of detector control signal DetCnt1, and outputs a resultant detector control signal DetCnt2 of H level to each of power supply active modules 158.2, 158.3, . . . , and 158.N.

Power supply active modules 158.1, 158.2, 158.3, . . . , and 158.N are placed in response to memory macros 4.1, 4.2, 4.3, . . . , and 4.N, and output a negative voltage Vneg in accordance with a reference voltage VrefN, respectively.

Each of memory macros 4.1, 4.2, 4.3, . . . , and 4.N includes a 30R circuit and a flip-flop circuit (FF). When each of memory macros 4.1, 4.2, 4.3, . . . , and 4.N enters an active state, the flip-flop circuit (FF) incorporates a signal as a result of OR of commands (READ, WRITE, REFRESH), to be input to each of memory macros 4.1, 4.2, 4.3, . . . , and 4.N, at a timing of a clock signal (CLK) to output an ACT signal of H level to each of power supply active modules 158.1, 158.2, 158.3, . . . and 158.N. On the other hand, when each of memory macros 4.1, 4.2, 4.3, . . . , and 4.N enters a standby state, the flip-flop circuit (FF) outputs an ACT signal of L level to each of power supply active modules 158.1, 158.2, 158.3, . . . , and 158.N.

Figure 29:
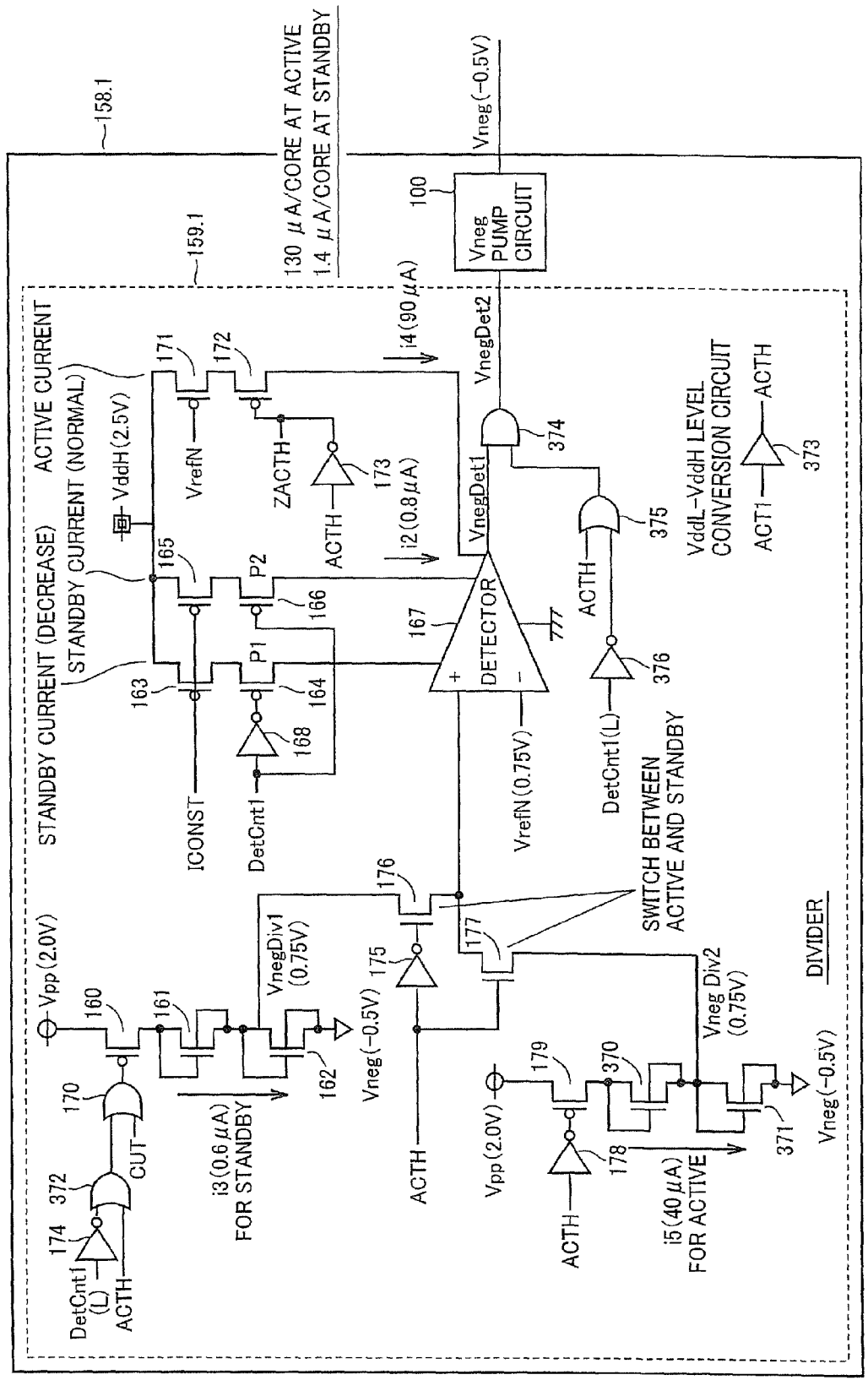
FIG. 29 is a circuit configuration diagram illustrating a power supply active module.

With reference to FIG. 29, power supply active module 158.1 includes a detector circuit 159.1 and a Vneg pump circuit 100.

Detector circuit 159.1 detects a negative voltage Vneg, output from Vneg pump circuit 100, based on a reference voltage VrefN, and outputs a result of the detection as a negative voltage detection signal VnegDet to Vneg pump circuit 100. Detector circuit 159.1 includes P-channel MOS transistors 160, 163, 164, 165, 166, 171, 172, and 179, N-channel MOS transistors 161, 162, 176, 177, 370, and 371, inverters 168, 173, 174, 175, 178, 373, and 376, a detector 167, OR circuits 170, 372 and 375, and an AND circuit 374.

P-channel MOS transistor 160, N-channel MOS transistor 161 and N-channel MOS transistor 162 are connected in series between a boost voltage Vpp and a negative voltage Vneg. P-channel MOS transistor 160 has a gate receiving an output of OR circuit 170 for receiving a detector control signal DetCnt1 from detector control circuit 156, N-channel MOS transistors 161 and 162 have gates connected to drains thereof, respectively. Further, a negative voltage division signal VnegDiv1 as an intermediate voltage between a boost voltage Vpp and a negative voltage Vneg is output from a node between N-channel MOS transistor 161 and N-channel MOS transistor 162.

P-channel MOS transistors 163 and 164 are connected in series between an external power supply voltage VddH and detector 167. Similarly, P-channel MOS transistors 165 and 166 are connected in series between external power supply voltage VddH and detector 167. Similarly, P-channel MOS transistors 171 and 172 are connected in series between external power supply voltage VddH and detector 167. P-channel MOS transistors 163 and 165 have gates each receiving a constant current ICONST. P-channel MOS transistor 164 has a gate receiving a detector control signal DetCnt1 inverted by inverter 168, and P-channel MOS transistor 166 has a gate receiving a detector control signal DetCnt1. P-channel MOS transistor 171 has a gate receiving a reference voltage VrefN, and P-channel MOS transistor 172 has a gate receiving a signal ACTH inverted by inverter 1.73.

A size (a ratio between a channel length L and a channel width W; W/L) of each of P-channel MOS transistors 163 and 165 is appropriately selected, so that a through current generated when the gates receive an identical constant current ICONST is adjusted. In the eighth embodiment, as one example, P-channel MOS transistor 163 is ⅛ in size of P-channel MOS transistor 165. When the size of P-channel MOS transistor 171 is set sufficiently larger than the size of P-channel MOS transistor 165, responsivity in an active mode enhances.

Detector 167 receives a through current from external power supply voltage VddH via P-channel MOS transistors 163 and 164, P-channel MOS transistors 165 and 166, or P-channel MOS transistors 171 and 172. Detector 167 compares a reference voltage VrefN with a negative voltage division signal VnegDiv1 or VnegDiv2, and switches a negative voltage detection signal VnegDet1 between H level and L level in accordance with a result of the comparison.

Vneg pump circuit 100 performs a pump operation in accordance with a negative voltage detection circuit VnegDet1 output from detector circuit 159.1, and generates a negative voltage Vneg. The other operations of Vneg pump circuit 100 are similar to those described above; therefore, detailed description thereof will not be repeated here.

Hereinafter, description will be given of operations of detector circuit 159.1. Detector control circuit 156 (see FIG. 28) fixes a detector control signal DetCnt1 at L level. Therefore, in any of an active mode and a standby mode, the gate of P-channel MOS transistor 160 continuously receives a signal of L level, so that P-channel MOS transistor 160 maintains at its conductive state. In the standby mode, N-channel MOS transistor 176 is made conductive; therefore, a negative voltage division signal VnegDiv1 is output to detector 167. P-channel MOS transistor 164 receives a signal of H level via inverter 168. P-channel MOS transistor 166 receives a signal of L level and, therefore, is activated and enters a conductive state. Accordingly, detector 167 in the standby mode is fed with a through current i2 from P-channel MOS transistor 165. In the active mode, the gate of P-channel MOS transistor 179 continuously receives a signal of L level; therefore, P-channel MOS transistor 179 maintains at its conductive state. Further, since N-channel MOS transistor 177 is made conductive, a negative voltage division signal VnegDiv2 is output to detector 167. Since the gate of P-channel MOS transistor 172 is set at L level, P-channel MOS transistor 172 is activated and enters a conductive state. Accordingly, detector 167 is fed with both through currents i2 and i4.

Figure 30:
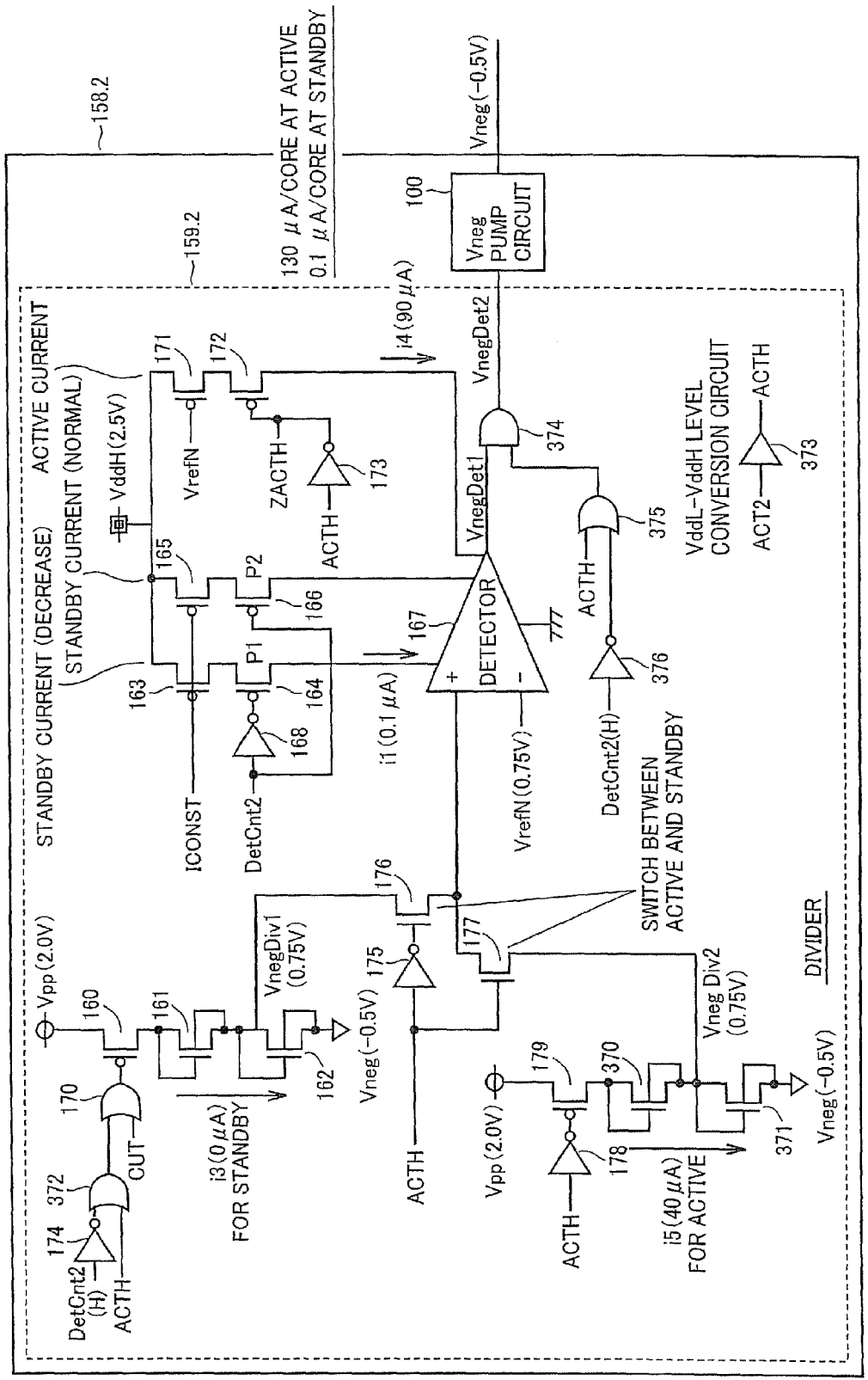
FIG. 30 is a circuit configuration diagram illustrating a power supply active module.

With reference to FIG. 30, power supply active module 158.2 is equivalent to power supply active module 158.1 illustrated in FIG. 29 except a type of a signal to be input.

Hereinafter, description will be given of operations of a detector circuit 159.2. Detector control circuit 156 (see FIG. 28) holds a detector control signal DetCnt2 at H level. Therefore, in the standby mode, the gate of the P-channel MOS transistor 160 receives a signal of H level, so that P-channel MOS transistor 160 enters a non-conductive state. Therefore, a current passing through P-channel MOS transistor 160 is blocked, and a negative voltage division signal VnegDiv1 is not output. In addition, P-channel MOS transistor 164 receives a signal of L level via inverter 168, and P-channel MOS transistor 166 receives a signal of H level. Therefore, P-channel MOS transistor 164 is activated and enters a conductive state. Accordingly, P-channel MOS transistor 163 feeds a through current i1 to detector 167.

In a recovery from a standby mode to an active mode, a signal ACTH is set at H level. Then, the gate of P-channel MOS transistor 179 receives a signal of L level, so that P-channel MOS transistor 179 is activated and enters a conductive state. Therefore, a negative voltage division signal VnegDiv2 is output to detector 167. In addition, P-channel MOS transistor 164 receives a signal of L level via inverter 168, and P-channel MOS transistor 172 receives a signal of L level. Therefore, P-channel MOS transistors 164 and 172 are activated and enter a conductive state. Accordingly, P-channel MOS transistors 163 and 171 feed through currents i1 and i4 to detector 167, respectively.

Each of power supply active modules 158.3, . . . , and 158.N are similar to power supply active module 158.2; therefore, detailed description thereof will not be repeated here.

Herein, a size ratio between P-channel MOS transistor 163 and P-channel MOS transistor 165 is 1:8. Therefore, through current i1 is ⅛ of through current i2.

Table 1 shows statuses of generation and block of a through current in each mode.

TABLE 1

|  | Mode | Through current i1 | Through current i2 | Through current i3 | Through current i4 | Through current i5 |
|---|---|---|---|---|---|---|
| Detector circuit 159.1 | Standby | X | O | O | X | X |
|  | Active | X | O | O | O | O |
| Detector circuits 159.2, . . . , 159.N | Standby | O | X | X | X | X |
|  | Active | O | X | O | O | O |

O: Current is generated
X: Current is blocked

As described above, each of power supply active modules 158.2, 158.3, . . . , and 158.N suppresses an amount of currents to be fed to detector 167 to thereby suppress power consumption, but does not block a through current completely. As a result, a rising speed in a recovery from a standby mode to an active mode can be accelerated. More specifically, in a case that a through current is blocked completely, detector 167 has a rising time of about 15 nsec, so that a high rising speed can not be realized. However, a minute through current is fed to detector 167, so that a high rising speed can be realized sufficiently.

In the standby mode, detector 167 can not receive negative voltage division signals VnegDiv1 and VnegDiv2 and, therefore, can not output a normal negative voltage detection signal VnegDet1. Consequently, Vneg pump circuit 100 can not normally perform a pump operation, so that there is a possibility that a negative voltage Vneg to be output largely varies as compared with a specific value. In order to solve this problem, in the standby mode, by additional provision of AND circuit 374, OR circuit 375 and inverter 376, a negative voltage detection signal VnegDet2 output from detector 167 is forcibly set at L level and the pump operation by Vneg pump circuit 100 is stopped.

Inverter 376 has a gate receiving a detector control signal DetCnt2. In the standby mode, a signal ACTH is set at L level. Then, an output of OR circuit 375 becomes L level; therefore, a negative voltage detection signal VnegDet2 as an output of AND circuit 374 becomes L level irrespective of output of a negative voltage detection signal VnegDet1 and Vneg pump circuit 100 stops the pump operation.

In the eighth embodiment, as illustrated in FIG. 29, power consumed by power supply active module 158.1 in the standby mode is 1.4 µA which is a sum of 0.6 µA consumed for generating a negative voltage division signal VnegDiv and 0.8 µA to be supplied to detector 167. On the other hand, power consumed by power supply active module 158.2 in the standby mode is, for example, 0.1 µA to be supplied to detector 1.67, as illustrated in FIG. 30.

For example, power consumed by a conventional semiconductor device including five power supply active modules is expressed as follows: 1.4 µA×5=7.0 µA. In contrast, power consumed by the semiconductor device according to the present invention is expressed as follows: 1.4 µA+0.1 µA×4=1.8 µA. Therefore, it is possible to considerably suppress power consumption.

In the aforementioned description, current is fed to one detector circuit as in a normal standby state and feed of current is suppressed in remaining detector circuits. However, current may be fed to not less than two detector circuits as in a normal standby state. More specifically, the number of detector circuits, in which feed of current is suppressed, may be determined in accordance with a negative voltage supplying ability of a detector circuit and power consumption in a memory macro.

According to the eighth embodiment of the present invention, in a standby mode, from among a plurality of detector circuits having output sides connected in common, current is fed to only a predetermined number of detector circuits as in a standby state, and feed of current is suppressed in remaining detector circuits. Therefore, it is possible to realize a semiconductor device capable of suppressing power consumption in a standby mode.

Ninth Embodiment

In a ninth embodiment, description will be given of improvement of temperature dependence of internal power.

Internal power generation circuit 10 illustrated in FIG. 2 is configured to generate stable internal power against various disturbances such as a variation in process, a change in temperature, a variation in external power supply voltage, and an intrusion of noise.

However, as a process is made finer, a power supply voltage to be supplied is made lower, Consequently, an influence due to a variation in threshold value of a transistor becomes considerable. Further, as a temperature assurance range becomes wider (between −40 and 125° C.), an influence on a variation in threshold value of a transistor becomes conspicuous.

In order to solve the aforementioned problems, internal power is allowed to have a so-called negative temperature characteristic, i.e., an internal power voltage increases as a temperature lowers so as to realize a more stable operation in a low temperature state where a threshold value of a transistor increases.

In addition, as illustrated in FIG. 5, N-channel MOS transistors 36.1 and 36.2 configuring sense amplifier portion 15 supply an intermediate voltage Vbl to bit line pair BL, ZBL to equalize bit line pair BL, ZBL. The source of N-channel MOS transistor 36.1 is connected to bit line BL supplied with an internal buck voltage VddT, and the gate of N-channel MOS transistor 36.1 is connected to bit equalizer line BLEQ supplied with a boost voltage Vpp. Therefore, a gate-source voltage Vgs of N-channel MOS transistor 36.1 becomes a potential difference ΔV between boost voltage Vpp and internal buck voltage VddT.

Herein, if potential difference ΔV becomes small due to a variation in process or a change in temperature, N-channel MOS transistor 36.1 is not sufficiently made conductive, so that bit line pair BL, ZBL are not sufficiently equalized. On the other hand, if potential difference ΔV becomes large, a leak current (GIDL: Gate Induced Drain Leakage) due to a gate-drain voltage in P-channel MOS transistor 35.2 increases, so that a refresh performance of memory array 16 deteriorates.

That is, if potential difference ΔV between boost voltage Vpp and internal buck voltage VddT varies, an operation becomes unstable and power consumption increases. Hence, potential difference ΔV between boost voltage Vpp and internal buck voltage VddT is made constant, so that it is possible to realize stable operation and low power consumption.

Figure 31:
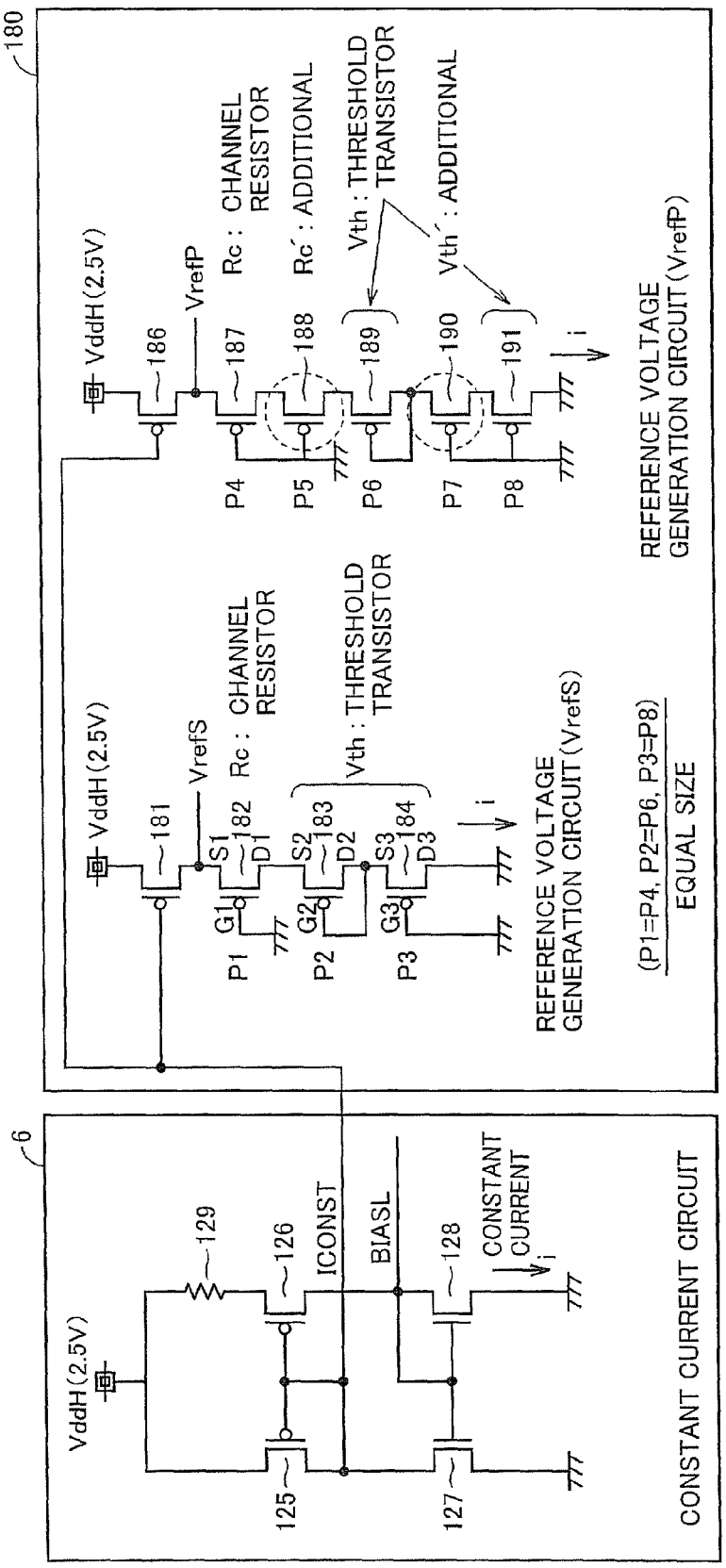
FIG. 31 illustrates main parts of a power supply standby module according to a ninth embodiment.

With reference to FIG. 31, a power supply standby module according to the ninth embodiment includes a constant current circuit 6 and a reference voltage generation circuit 180.

Constant current circuit 6 is similar to constant current circuit illustrated in FIG. 24; therefore, detailed description thereof will not be repeated here.

Reference voltage generation circuit 180 is fed with a constant current ICONST from constant current circuit 6, and generates reference voltages VrefS and VrefP. Reference voltage generation circuit 180 includes P-channel MOS transistors 181, 182, 183, 184, 186, 187, 188, 189, 190, and 191.

Reference voltage generation circuit 180 generates a reference voltage VrefS and a reference voltage VrefP independently. This is because the respective circuits are subjected to trimming independently so that the degree of flexiblility in voltage tuning is improved and the stability of the entire circuit is improved.

P-channel MOS transistors 181, 182, 183, and 184 are connected in series between an external power supply voltage VddH and a ground voltage Gnd. P-channel MOS transistor 181 has a gate fed with a constant current ICONST output from constant current circuit 6. P-channel MOS transistor 182 has a gate G1 connected to ground voltage Gnd. P-channel MOS transistor 183 has a gate G2 connected to a drain D2 thereof. P-channel MOS transistor 184 has a gate G3 connected to a ground voltage Gnd, i.e., a drain D3 thereof.

Then, a through current i1 is generated in accordance with a size (a ratio between a channel length L and a channel width W; W/L) of P-channel MOS transistor 181. A voltage generated at P-channel MOS transistors 182, 183 and 184 is output as a reference voltage VrefS from a node between P-channel MOS transistor 181 and P-channel MOS transistor 182.

P-channel MOS transistor 182 causes certain resistance between a source S1 and a drain D1 so as to function as a channel resistor. On the other hand, P-channel 183 causes certain voltage drop between a source S2 and a drain D2 so as to function as a threshold transistor, and P-channel 184 causes certain voltage buck between a source S3 and a drain D3 so as to function as a threshold transistor. Herein, for example, P-channel MOS transistor 182 is configured in such a manner that a plurality (e.g., 16) of transistors, each having a channel width W of 6 µm and a channel length L of 4 µm, are connected in series. Each of P-channel MOS transistors 183 and 184 has a channel width W of 10 µm and a channel length of 0.4 µm.

In case of a P-channel MOS transistor, a channel resistor type transistor has a gate set at a ground voltage Gnd and a source and a drain each set as a voltage between a power supply voltage and a ground voltage Gnd. In a threshold transistor, a gate and a drain have an identical potential.

When a channel resistance of P-channel MOS transistor 182 is Rc and a threshold value of each of P-channel MOS transistors 183 and 184 is Vth, a reference voltage VrefS is obtained from the following equation: VrefS=Rc×i+Vth.

In the ninth embodiment, P-channel MOS transistor 182 corresponds to a first transistor, and P-channel MOS transistors 183 and 184 correspond to a second transistor.

Figure 32:
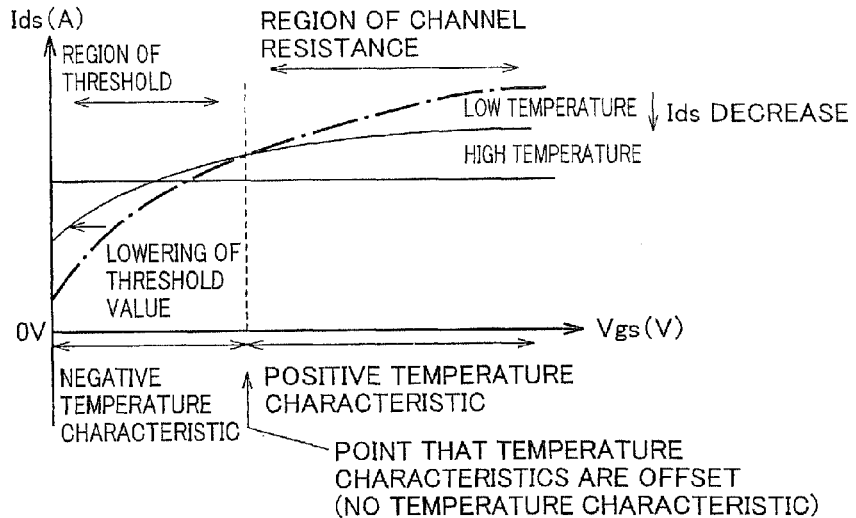
FIG. 32 shows a relation between a gate-source voltage Vgs and a drain current Ids.

With reference to FIG. 32, a broken line indicates a characteristic at a low temperature and a solid line indicates a characteristic at a high temperature. In a region of a channel resistance, drain current Ids decreases due to a rise in temperature. Therefore, a channel resistance value of P-channel MOS transistor 182 increases as a temperature rises, and a potential difference caused at P-channel MOS transistor 182 increases as a temperature rises. On the other hand, in a region of a threshold, drain current Ids increases due to a rise in temperature. Therefore, threshold values of P-channel MOS transistors 183 and 184 increase as a temperature bucks, and potential differences caused at P-channel MOS transistors 183 and 184 increase as a temperature bucks.

Accordingly, reference voltage VrefS becomes constant irrespective of a variation in temperature at a point that a positive temperature characteristic of P-channel MOS transistor 182 and negative temperature characteristics of P-channel MOS transistors 183 and 184 are offset each other.

Figure 33:
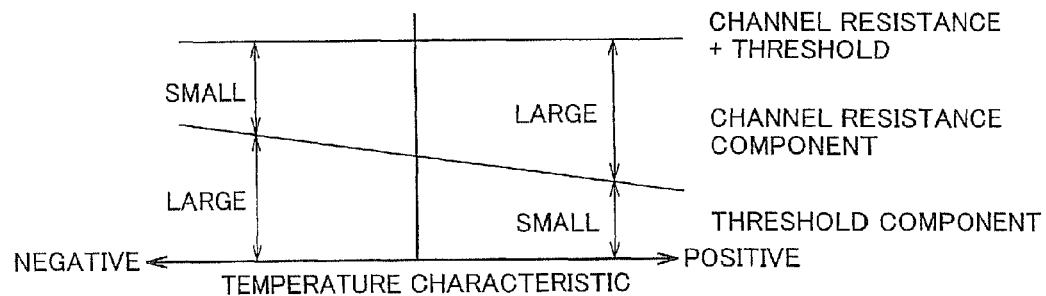
FIG. 33 shows a relation between a channel resistance and a threshold value, and a temperature characteristic.

With reference to FIG. 33, if a channel resistance component increases, a positive temperature characteristic is caused. In contrast, if a threshold component increases, a negative temperature characteristic is caused. To this end, in a conventional reference voltage generation circuit, sizes of P-channel MOS transistors 1.82 and 184 are set in such a manner that a positive temperature characteristic of P-channel MOS transistor 182 by an increase in channel resistance and a negative temperature characteristic of P-channel MOS transistor 184 by an increase in threshold value are offset each other.

With reference to FIG. 31 again, in the ninth embodiment, a P-channel MOS transistor 183 is used a threshold transistor, so that a negative temperature characteristic is caused by an increase in threshold value. That is, reference voltage generation circuit 7 causes a reference voltage VrefS having a negative temperature characteristic.

Similarly, P-channel MOS transistors 186, 187, 188, 189, 190, and 191 are connected in series between external power supply voltage VddH and ground voltage Gnd. P-channel MOS transistor 186 has a gate supplied with a constant current ICONST output from constant current circuit 6. P-channel MOS transistors 187, 188, 190, and 191 have gates each connected to ground voltage Gnd. P-channel MOS transistor 189 has a gate connected to a drain thereof.

P-channel MOS transistor 186 generates a through current in accordance with a size thereof. A voltage generated at P-channel MOS transistors 187, 188, 189, 190 and 191 is output as a reference voltage VrefP from a node between P-channel MOS transistor 186 and P-channel MOS transistor 187.

Each of P-channel MOS transistors 187 and 188 functions as a channel resistor, and each of P-channel MOS transistors 189, 190 and 191 functions as a threshold transistor.

Further, P-channel MOS transistors 187, 189 and 191 are equal in size to P-channel MOS transistors 182, 183 and 184, respectively. Accordingly, a positive temperature characteristic of P-channel MOS transistor 187 by an increase in channel resistance is identical to that of P-channel MOS transistor 182, and negative temperature characteristics of P-channel MOS transistors 189 and 191 by an increase in threshold value are identical to those of P-channel MOS transistors 183 and 184, respectively. That is, a circuit for generating a reference voltage VrefP is equivalent to a circuit which generates a reference voltage VrefS and additionally includes P-channel MOS transistors 188 and 190.

Accordingly, in comparison with a reference voltage VrefS, a reference voltage VrefP increases by a potential difference caused by P-channel MOS transistors 188 and 190. A reference voltage VrefP is used for generating a boost voltage Vpp, and a reference voltage VrefS is used for generating an internal buck voltage VddT. Therefore, a potential difference between reference voltage VrefP and reference voltage VrefS corresponds to potential difference ΔV between boost voltage Vpp and internal buck voltage VddT.

Thus, P-channel MOS transistors 188 and 190 are appropriately selected, so that potential difference ΔV between boost voltage Vpp and internal buck voltage VddT can be made constant irrespective of a variation in temperature. That is, P-channel MOS transistors 188 and 190 are selected in such a manner that a positive temperature characteristic of P-channel MOS transistor 188 by an increase in channel resistance and a negative temperature characteristic of P-channel MOS transistor 190 by an increase in threshold value are offset each other; thus, potential difference ΔV can be maintained at constant.

For example, when a reference voltage VrefP is 1.9 V and a reference voltage VrefS is 1.5 V, a required potential difference ΔV is 0.4 V. P-channel MOS transistors 189 and 191 are selected so as to share a half of potential difference ΔV. A threshold value of a P-channel MOS transistor increases by about 0.2 V if a channel length L thereof increases by 100 times. Therefore, P-channel MOS transistor 190 is selected so as to have a channel length L longer by 100 times than those of P-channel MOS transistors 183 and 184. Herein, a channel width W of P-channel MOS transistor 190 is equal to those of P-channel MOS transistors 183 and 184. Based on a through current (e.g., 0.4 μA) and a potential difference of 0.2 V to be shared, P-channel MOS transistor 188 is selected so as to have a channel resistance obtained from the following equation: 0.2 V/0.4 μA=500 kΩ.

Further, a reference voltage VrefP has a constitution that a constant potential difference ΔV having no temperature characteristic is superimposed on a reference voltage VrefS having a negative temperature characteristic. Therefore, reference voltage VrefP also has a negative temperature characteristic, as in reference voltage VrefS.

Figure 34:
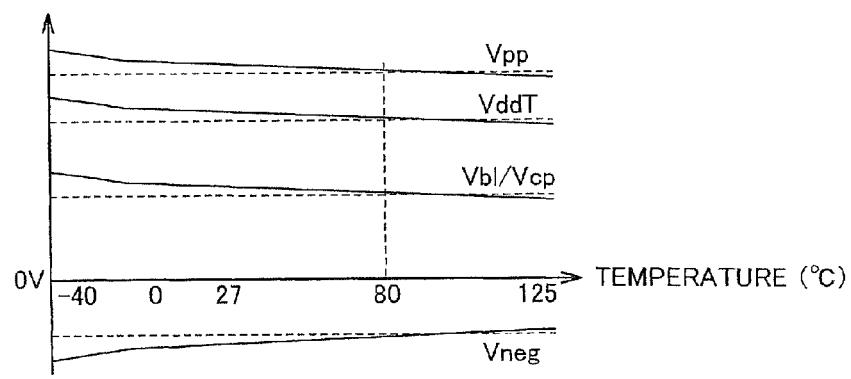
FIG. 34 shows a temperature characteristic of internal power generated based on a reference voltage output from a reference voltage generation circuit.

With reference to FIG. 34, internal power is generated in accordance with a reference voltage having a negative temperature characteristic and, therefore, has a negative temperature characteristic. As a temperature increases, a voltage value of the internal power decreases. As for a negative voltage Vneg, as a temperature increases, an absolute value of a voltage value thereof decreases.

If P-channel MOS transistors 188 and 190 are appropriately selected, potential difference ΔV between boost voltage Vpp and internal buck voltage VddT has a positive temperature characteristic or a negative temperature characteristic.

Figure 35A:
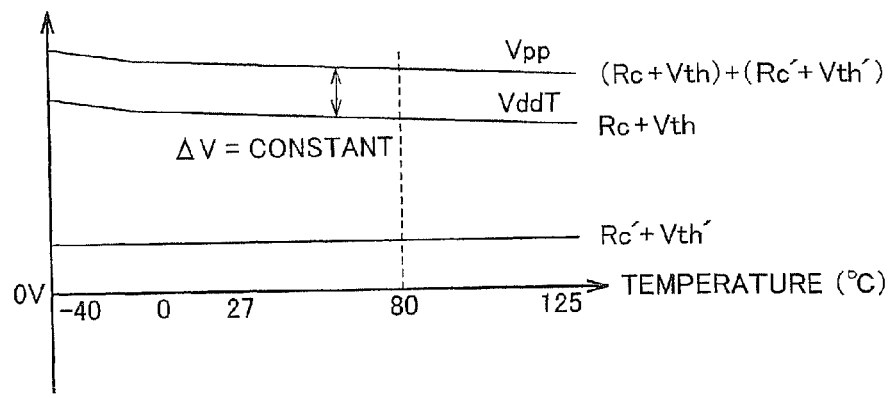
FIGS. 35A to 35C respectively show a temperature characteristic of a potential difference ΔV between a boost voltage Vpp and an internal buck voltage VddT.

FIG. 35A shows a case that potential difference ΔV has no temperature characteristic.

Figure 35B:
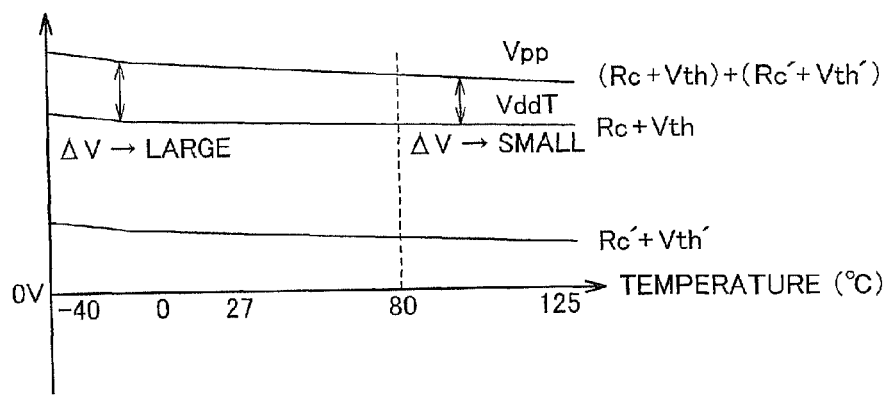

FIG. 35B shows a case that potential difference ΔV has a negative temperature characteristic.

Figure 35C:
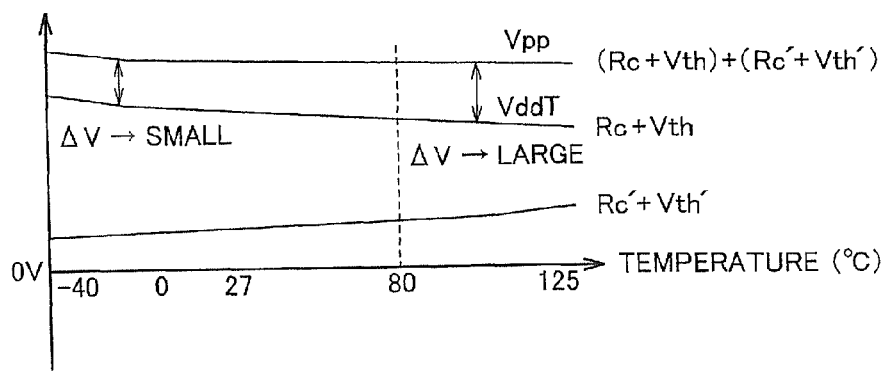

FIG. 35C shows a case that potential difference ΔV has a positive temperature characteristic.

With reference to FIG. 35A, when P-channel MOS transistors 188 and 190 are selected in such a manner that respective temperature characteristics are offset each other, internal buck voltage VddT and boost voltage Vpp have an identical negative temperature characteristic because potential difference ΔV has no temperature characteristic.

With reference to FIG. 35B, when P-channel MOS transistor 190 has a size larger than that of P-channel MOS transistor 188, an effect by a variation in threshold value becomes superior and potential difference ΔV has a negative temperature characteristic; therefore, boost voltage Vpp has a negative temperature characteristic larger than that of internal buck voltage VddT.

With reference to FIG. 35C, when P-channel MOS transistor 188 has a size larger than that of P-channel MOS transistor 190, an effect by a channel resistance becomes superior and potential difference ΔV has a positive temperature characteristic; therefore, boost voltage Vpp has a negative temperature characteristic smaller than that of internal buck voltage VddT.

According to the ninth embodiment of the present invention, an internal power generation circuit generates internal power having a negative temperature characteristic. Therefore, the internal power can compensate a variation in threshold value of a transistor greater in influence than a power supply voltage. Thus, it is possible to realize a semiconductor device which stably operates especially in a low temperature state that a threshold value of a transistor increases.

According to the ninth embodiment of the present invention, an internal power generation circuit generates a boost voltage and an internal buck voltage that a potential difference therebetween is constant irrespective of a temperature. As a result, it is possible to stably drive an equalization transistor connected between a bit line pair of a memory cell, and suppress an increase in leak current. Thus, it is possible to realize a semiconductor device capable of achieving stable operation and low power consumption.

Tenth Embodiment

In the ninth embodiment, the description is given of a reference voltage generation circuit generating two reference voltages independently. On the other hand, in a tenth embodiment, description will be given of a case that two reference voltages are generated by a channel resistor and a threshold transistor common to each other.

Figure 36:
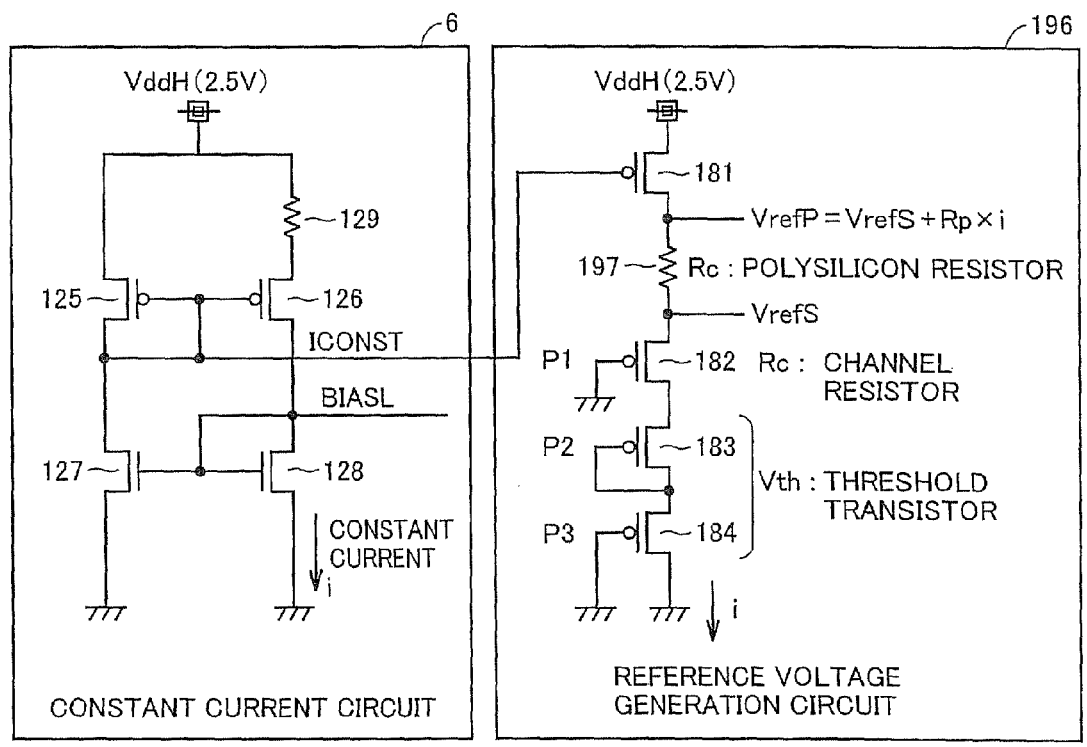
FIG. 36 illustrates main parts of a power supply standby module according to a tenth embodiment.

With reference to FIG. 36, a power supply standby module according to the tenth embodiment includes a constant current circuit 6 and a reference voltage generation circuit 196.

Constant current circuit 6 is similar to constant current circuit 6 illustrated in FIG. 24; therefore, detailed description thereof will not be repeated here.

Reference voltage generation circuit 196 is supplied with a constant current ICONST from constant current circuit 6, and generates reference voltages VrefS and VrefP. Herein, reference voltage generation circuit 196 is obtained in such a manner that a polysilicon resistor 197 is additionally provided in the circuit, illustrated in FIG. 31, for generating a reference voltage VrefS. The other configurations of reference voltage generation circuit 196 are similar to those of the circuit illustrated in FIG. 31; therefore, detailed description thereof will not be repeated here.

Polysilicon resistor 197 is supplied with a through current i from a P-channel MOS transistor 181, superimposes a potential difference, generated in accordance with a resistance value thereof, on reference voltage VrefS, and outputs a resultant voltage as a reference voltage VrefP. That is, polysilicon resistor 197 generates a potential difference ΔV between reference voltage VrefP and reference voltage VrefS.

In polysilicon resistor 197, a variation in resistance due to a change in temperature is small. For example, an N-type polysilicon resistor having no Co-silicide layer of 130-nm generation has a value of about 61Ω (per unit area) at 0° C. and, in contrast, has a value of about 63Ω (per unit area) at 100° C. Thus, it is possible to generate a potential difference ΔV having a considerably small variation in temperature.

Further, polysilicon resistor 197 has an occupied area smaller than a reference voltage VrefP generation circuit in reference voltage generation circuit 180 according to the ninth embodiment illustrated in FIG. 31; therefore, a circuit configuration can be further simplified. In addition, an amount of through current i passing through the circuit can be reduced by half; therefore, power consumption can be further suppressed.

According to the tenth embodiment of the present invention, a reference voltage generation circuit allows a common through current to pass through a resistor and a threshold transistor to thereby generate two reference voltages. Thus, it is possible to simplify a circuit configuration in comparison with a case that reference voltages are generated independently, and reduce an occupied area of a circuit. In addition, it is possible to reduce an amount of through current in comparison with a case that through current passes through independent circuits. Therefore, it is possible to realize a semiconductor device with small occupied area and low power consumption.

Eleventh Embodiment

In the ninth and tenth embodiments, the description is given of a configuration that a temperature characteristic is given to a reference voltage such that each of internal buck voltage VddT and boost voltage Vpp has a negative temperature characteristic. On the other hand, in an eleventh embodiment, description will be given of a configuration that a negative voltage Vneg is generated by a generated internal buck voltage VddT.

Figure 37:
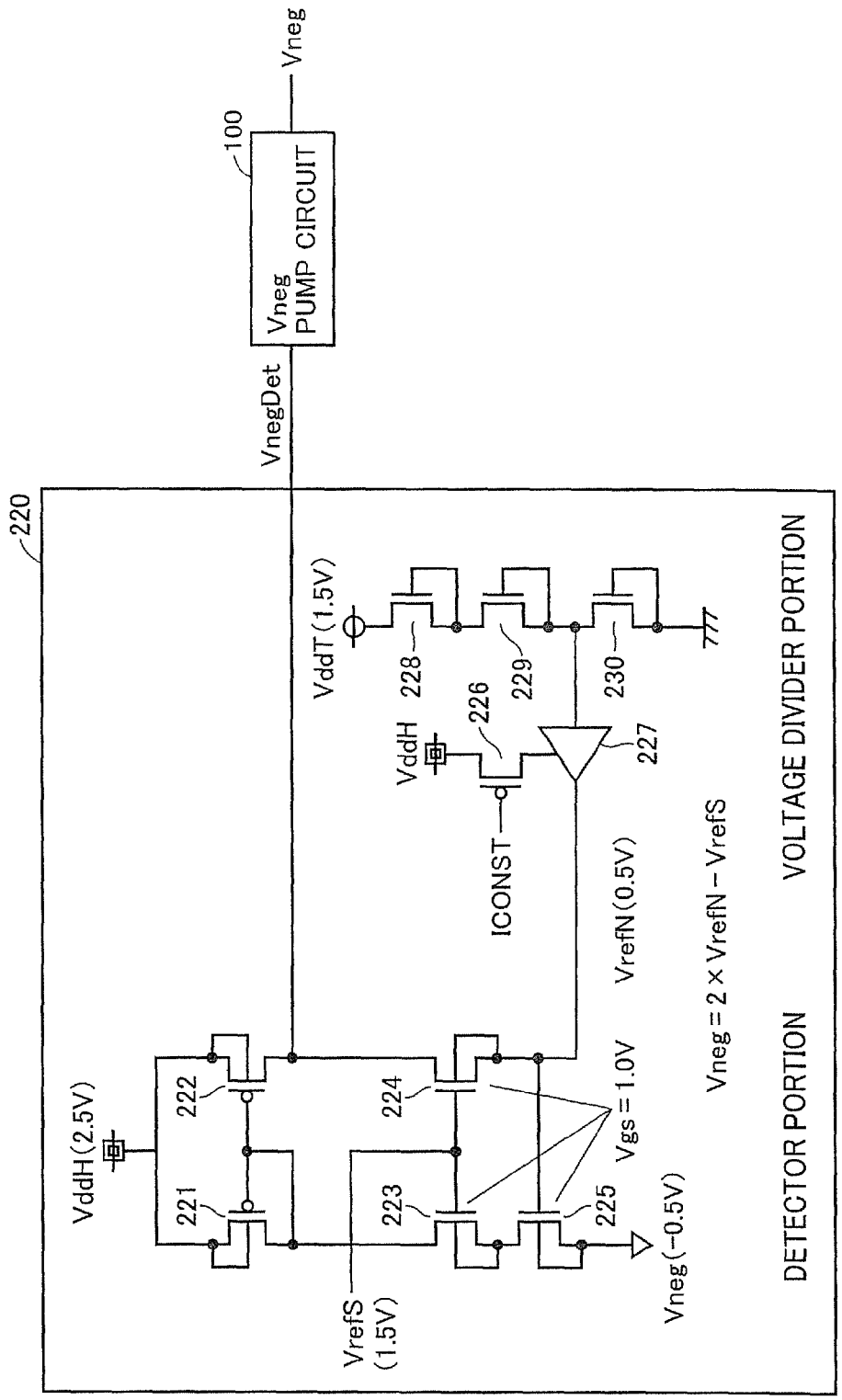
FIG. 37 illustrates main parts of an internal power generation circuit according to an eleventh embodiment.

With reference to FIG. 37, an internal power generation circuit according to the eleventh embodiment includes a detector circuit 220 and a Vneg pump circuit 100.

Vneg pump circuit 100 is similar to that in the fifth embodiment; therefore, detailed description thereof will not be repeated here.

Detector circuit 220 includes P-channel MOS transistors 221, 222 and 226, N-channel MOS transistors 223, 224, 225, 228, 229, and 230, and a buffer circuit 227.

P-channel MOS transistors 228, 229 and 230 are connected in series between an internal buck voltage VddT and a reference voltage, and have gates connected to drains thereof, respectively. A node between P-channel MOS transistor 229 and P-channel MOS transistor 230 is connected to buffer circuit 227. That is, P-channel MOS transistors 228, 229 and 230 supply a voltage, which is one-third of internal buck voltage VddT, to buffer circuit 227.

P-channel MOS transistor 226 is connected to an external power supply voltage VddH, has a gate supplied with a constant current ICONST, and supplies a current to buffer circuit 227 in accordance with constant current ICONST.

Buffer circuit 227 is supplied with a voltage, which is one-third of internal buck voltage VddT, increases a current capacity of the voltage, and outputs a resultant voltage as a reference voltage VrefN.

P-channel MOS transistor 221 and N-channel MOS transistors 223 and 225 are connected in series between external power supply voltage VddH and a negative voltage Vneg. P-channel MOS transistor 222 and N-channel MOS transistor 224 are connected in series between external power supply voltage VddH and buffer circuit 227.

P-channel MOS transistors 221 and 222 have gates each connected in common to a drain of P-channel MOS transistor 221. N-channel MOS transistors 223 and 224 have gates each connected in common to a reference voltage VrefS. N-channel MOS transistor 225 has a gate connected to an output of buffer circuit 227.

A negative voltage detection signal VnegDet is output from a node between P-channel MOS transistor 222 and N-channel MOS transistor 224.

P-channel MOS transistors 221 and 222, and N-channel MOS transistors 223, 224 and 225 form a current mirror circuit. The current mirror circuit compares negative voltage Vneg, connected to N-channel MOS transistor 225, with reference voltage VrefS, supplied to gates of N-channel MOS transistors 223 and 224, and reference voltage VrefN, supplied from buffer circuit 227, and outputs a negative voltage detection signal VnegDet of H or L level.

That is, detector circuit 220 outputs a negative voltage detection signal VnegDet so as to satisfy the following equation: Vneg=2×VrefN−VrefS, and controls a pump operation of pump circuit 100.

Herein, reference voltage VrefN is obtained by dividing internal buck voltage VddT into three. As described in the eighth and ninth embodiments, if internal buck voltage VddT has a negative temperature characteristic, reference voltage VrefN also has a negative temperature characteristic. In addition, internal buck voltage VddT is generated in accordance with reference voltage VrefS having a negative temperature characteristic and, therefore, has a negative temperature characteristic. Accordingly, a reference voltage VrefN generated by detector circuit 220 has a negative temperature characteristic, and a negative voltage Vneg generated in accordance with reference voltage VrefN also has a negative temperature characteristic.

Further, since a gate-source voltage Vgs in each of N-channel MOS transistors 223, 224 and 225 is 1 V, a gain and responsivity can be enhanced.

In the eleventh embodiment, it is unnecessary to generate a reference voltage VrefN in a reference voltage generation circuit.

According to the eleventh embodiment of the present invention, a detector circuit generates a reference voltage, for controlling a negative voltage, from an internal buck voltage and a boost voltage. Therefore, it is unnecessary to generate a reference voltage for controlling a negative voltage in a reference voltage generation circuit. Thus, it is possible to simplify a configuration of a reference voltage generation circuit.

According to the eleventh embodiment of the present invention, further, a gate-source voltage of 1 V can be ensured in each transistor. Therefore, it is possible to enhance a gain and responsivity of each transistor, and to realize a high-speed operation.

Twelfth Embodiment

In the eleventh embodiment, the description is given of a configuration that a negative voltage Vneg is generated by a generated internal buck voltage VddT. On the other hand, in a twelfth embodiment, description will be given of another configuration that a negative voltage Vneg is generated by a generated internal buck voltage Vddt and a generated boost voltage Vpp.

Figure 38:
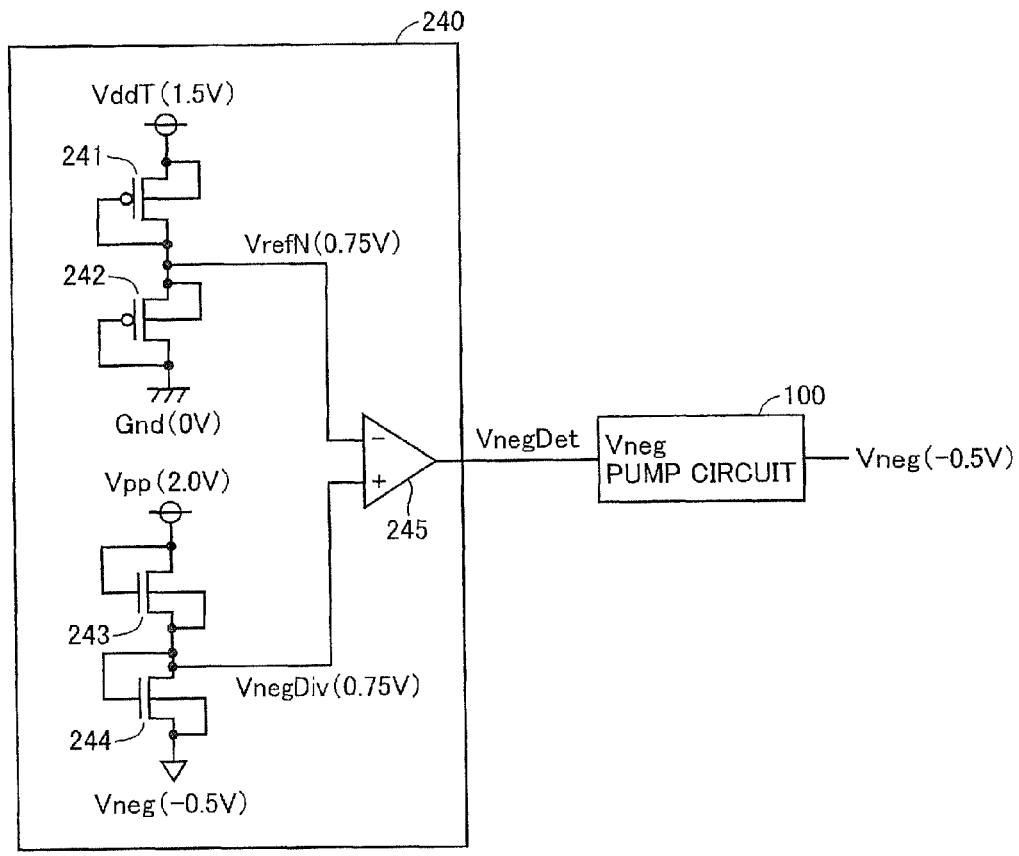
FIG. 38 illustrates main parts of an internal power generation circuit according to a twelfth embodiment.

With reference to FIG. 38, an internal power generation circuit according to the twelfth embodiment includes a detector circuit 240 and a Vneg pump circuit 100.

Vneg pump circuit 100 is similar to that in the fifth embodiment; therefore, detailed description thereof will not be repeated here.

Detector circuit 240 includes P-channel MOS transistors 241 and 242, N-channel MOS transistors 243 and 244, and a differential amplifier 245.

P-channel MOS transistors 241 and 242 are connected in series between an internal buck voltage VddT and a ground voltage Gnd, and have gates connected to drains thereof, respectively. A reference voltage VrefN is output from a node between P-channel MOS transistor 241 and P-channel MOS transistor 242. That is, P-channel MOS transistors 241 and 242 output, as reference voltage VrefN, an intermediate voltage between internal buck voltage VddT and ground voltage Gnd.

N-channel MOS transistors 243 and 244 are connected in series between a boost voltage Vpp and ground voltage Gnd, and have gates connected to drains thereof, respectively. A negative voltage division signal VnegDiv is output from a node between N-channel MOS transistor 243 and N-channel MOS transistor 244. That is, N-channel MOS transistors 243 and 244 output, as negative voltage division signal VnegDiv, an intermediate voltage between boost voltage Vpp and negative voltage Vneg.

Differential amplifier 245 amplifies a difference between negative voltage division signal VnegDiv and reference voltage VrefN, and outputs a negative voltage detection signal VnegDet of H or L level to pump circuit 100.

As described above, detector circuit 240 outputs negative voltage detection signal VnegDet in such a manner that negative voltage division signal VnegDiv, which is an intermediate voltage between boost voltage Vpp and negative voltage Vneg, is coincident with reference voltage VrefN generated from internal buck voltage VddT. Therefore, negative voltage Vneg has a temperature characteristic equal to that of a temperature difference between boost voltage Vpp and internal buck voltage VddT.

Figure 39:
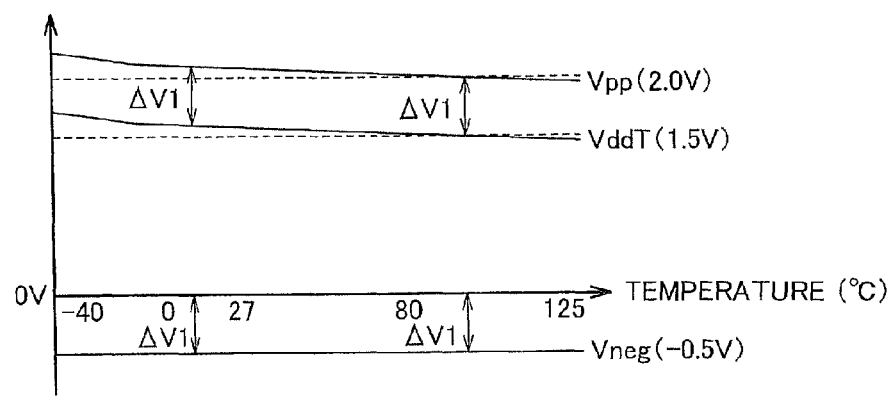
FIG. 39 shows a voltage of internal power in a case that a potential difference between a boost voltage Vpp and an internal buck voltage VddT is constant irrespective of a temperature.

With reference to FIG. 39, an absolute value of negative voltage Vneg is coincident with a potential difference between boost voltage Vpp and internal buck voltage VddT. Therefore, even in a case that each of boost voltage Vpp and internal buck voltage VddT has a negative temperature characteristic, if the potential difference between boost voltage Vpp and internal buck voltage VddT is ΔV1 irrespective of a temperature, the absolute value of negative voltage Vneg also becomes ΔV1 irrespective of a temperature.

Figure 40:
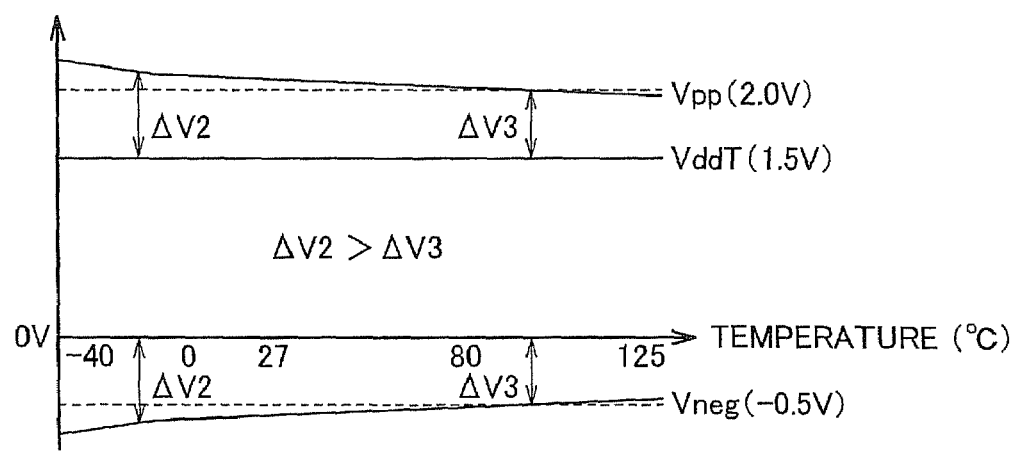
FIG. 40 shows a voltage of internal power in a case that a potential difference between a boost voltage Vpp and an internal buck voltage VddT has a negative temperature characteristic.

With reference to FIG. 40, as described above, the absolute value of negative voltage Vneg is coincident with the potential difference between boost voltage Vpp and internal buck voltage VddT. If a potential difference between boost voltage Vpp and internal buck voltage VddT on a low temperature side is ΔV2 and a potential difference between boost voltage Vpp and internal buck voltage VddT on a high temperature side is ΔV3 (ΔV2>ΔV3), the absolute value of negative voltage Vneg increases at the low temperature side, and negative voltage Vneg has a negative temperature characteristic.

Since negative voltage Vneg has a negative temperature characteristic, an absolute value of a negative voltage Vneg supplied to write data line ZWDL in the memory array illustrated in FIG. 5 can be increased in accordance with an increase in threshold value of a memory cell at a low temperature; thus, there arises an advantage that data write at L level can be surely performed.

A reference voltage generation circuit including the threshold transistor and the channel resistor each illustrated in FIG. 31 generally has a large occupied area, and requires much time for adjustment of a temperature characteristic. Herein, detector circuit 240 is configured to reduce an occupied area, improve design efficiency, and enhance precision.

Figure 41A:
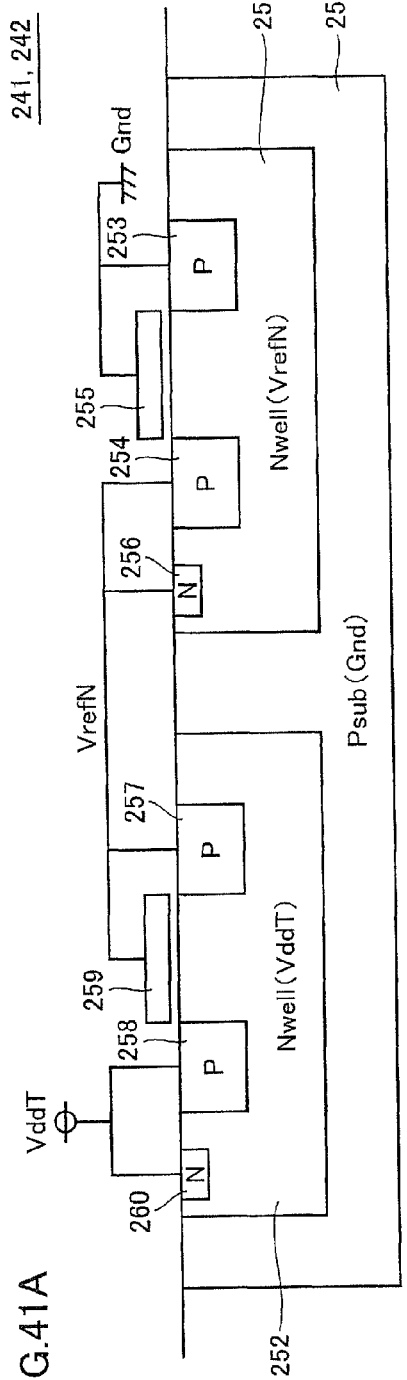
FIGS. 41A and 41B are schematic diagrams each illustrating a portional structure of a transistor configuring a detector circuit.

FIG. 41A illustrates a portional structure of P-channel MOS transistors 241 and 242.

Figure 41B:
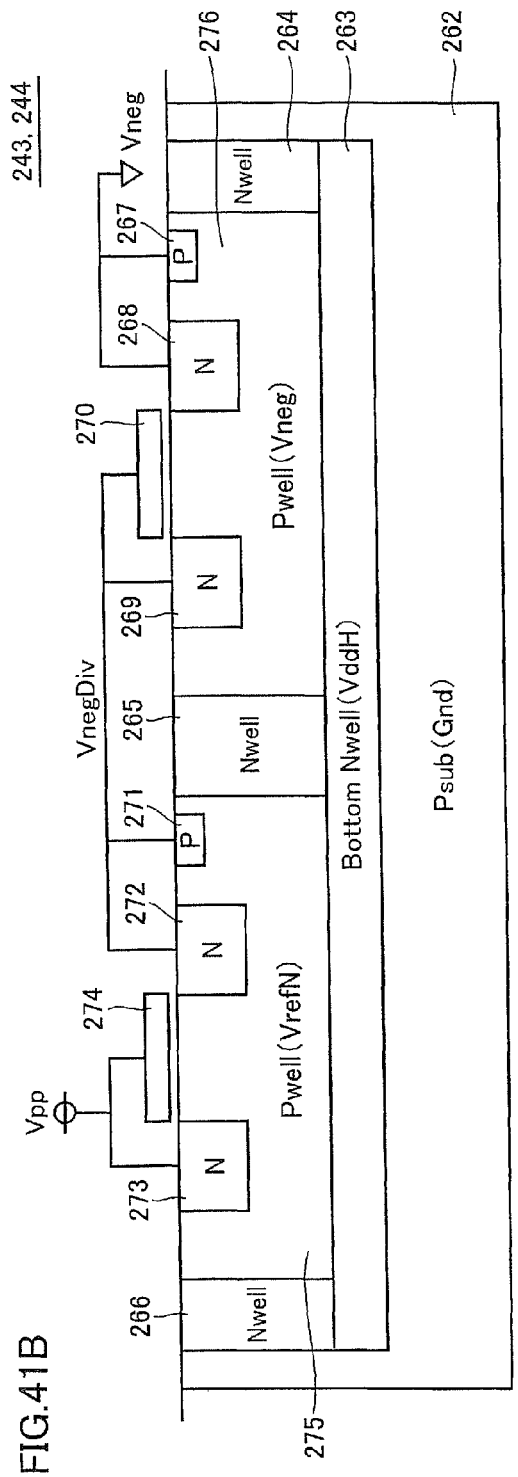

FIG. 41B illustrates a portional structure of N-channel MOS transistors 243 and 244.

With reference to FIG. 41A, P-channel MOS transistor 241 is formed in an N-type well region 252 formed on a P-type semiconductor substrate 250. On the other hand, P-channel MOS transistor 242 is formed in an N-type well region 251 formed on P-type semiconductor substrate 250.

P-channel MOS transistor 241 includes a P-type impurity region 258, a P-type impurity region 257 and an N-type impurity region 260 each formed in N-type well region 252. Herein, P-type impurity region 258, P-type impurity region 257 and N-type impurity region 260 are formed with a space interposed therebetween. Further, P-channel MOS transistor 241 includes a gate electrode 259 mounted on a surface of N-type well region 252 between P-type impurity region 258 and P-type impurity region 257 via a gate insulating film (not illustrated).

P-channel MOS transistor 242 includes a P-type impurity region 253, a P-type impurity region 254 and an N-type impurity region 256 each formed in N-type well region 251. Herein, P-type impurity region 253, P-type impurity region 254 and N-type impurity region 256 are formed with a space interposed therebetween. Further, P-channel MOS transistor 242 includes a gate electrode 255 mounted on a surface of N-type well region 251 between P-type impurity region 253 and P-type impurity region 254 via a gate insulating film (not illustrated).

N-type well region 252 is biased to an internal buck voltage VddT via N-type impurity region 260. Then, P-type impurity region 258 is connected to internal buck voltage VddT.

N-type well region 251 is biased to a reference voltage VrefN via N-type impurity region 256. Then, each of P-type impurity regions 253 and 254, and gate electrode 259 is connected to reference voltage VrefN. Each of P-type impurity region 253 and gate electrode 255 is connected to a ground voltage Gnd.

With reference to FIG. 41B, N-channel MOS transistor 243 is formed in an N-type well region 275 formed on a P-type semiconductor substrate 262 via an N-type well region 263. On the other hand, N-channel MOS transistor 244 is formed in a P-type well region 276 formed on P-type semiconductor substrate 262 via N-type well region 263. P-type well region 275 and P-type well region 276 are formed via an N-type well region 265 formed on an N-type well region 263. N-type well regions 266 and 264 are formed on N-type well region 263 at both ends of P-type well regions 275 and 276.

N-channel MOS transistor 243 includes an N-type impurity region 273, an N-type impurity region 272 and a P-type impurity region 271 each formed in P-type well region 275. N-type impurity region 273, N-type impurity region 272 and P-type impurity region 271 are formed with a space interposed therebetween. Further, N-channel MOS transistor 243 includes a gate electrode 274 formed on a surface of P-type well region 275 between N-type impurity region 273 and N-type impurity region 272 via a gate insulating film (not illustrated).

N-channel MOS transistor 244 includes an N-type impurity region 269, an N-type impurity region 268 and a P-type impurity region 267 each formed in P-type well region 276. N-type impurity region 269, N-type impurity region 268 and P-type impurity region 267 are formed with a space interposed therebetween. Further, N-channel MOS transistor 244 includes a gate electrode 270 formed on a surface of P-type well region 276 between N-type impurity region 269 and N-type impurity region 268 via a gate insulating film (not illustrated).

P-type well region 275 is biased to a negative voltage division signal VnegDiv via P-type impurity region 271. Each of N-type impurity regions 269 and 272, P-type impurity region 271, and gate electrode 270 is connected to negative voltage division signal VnegDiv.

P-type well region 276 is biased to a negative voltage Vneg via P-type impurity region 267. N-type impurity region 268 is connected to negative voltage Vneg.

Each of N-type impurity region 273 and gate electrode 274 is connected to a boost voltage Vpp.

With reference to FIG. 38, immediately after power-on, each of an internal buck voltage VddT and a boost voltage Vpp is boosted from a ground voltage Gnd with a predetermined time constant. However, depending on a potential difference between internal buck voltage VddT and boost voltage Vpp, there is a possibility that detector circuit 280 is erroneously operated. As a result, Vneg pump circuit 100 excessively performs a pump operation, so that a negative voltage Vneg having a larger negative value is generated. More specifically, negative voltage Vneg is obtained by the following equation: negative voltage Vneg=internal buck voltage VddT−boost voltage Vpp. Therefore, in a case of establishment of the following inequality: boost voltage Vpp≧internal buck voltage VddT+0.5 V, negative voltage Vneg becomes not more than −0.5 V, so that there is a possibility that detector circuit 280 is erroneously operated. In order to avoid such an erroneous operation under any situations, it is preferable that an internal power generation circuit generates internal power so as to establish the following inequality: boost voltage Vpp<internal buck voltage VddT+0.5 V.

In the twelfth embodiment, it is unnecessary to generate a reference voltage VrefN in a reference voltage generation circuit.

According to the twelfth embodiment of the present invention, a circuit for generating a reference voltage is not provided with a channel resistor and a threshold transistor each of which has a large occupied area and requires much time for adjustment of a temperature characteristic; therefore, it is possible to suppress an occupied area, improve design efficiency and enhance precision.

Thirteenth Embodiment

In the detector circuit described in the twelfth embodiment, a reference voltage VrefN is uniquely determined in accordance with a difference between an internal buck voltage VddT and a boost voltage Vpp. On the other hand, in a thirteenth embodiment, description will be given of a detector circuit capable of changing a voltage level of a reference voltage VrefN and enhancing a degree of flexibility.

Figure 42:
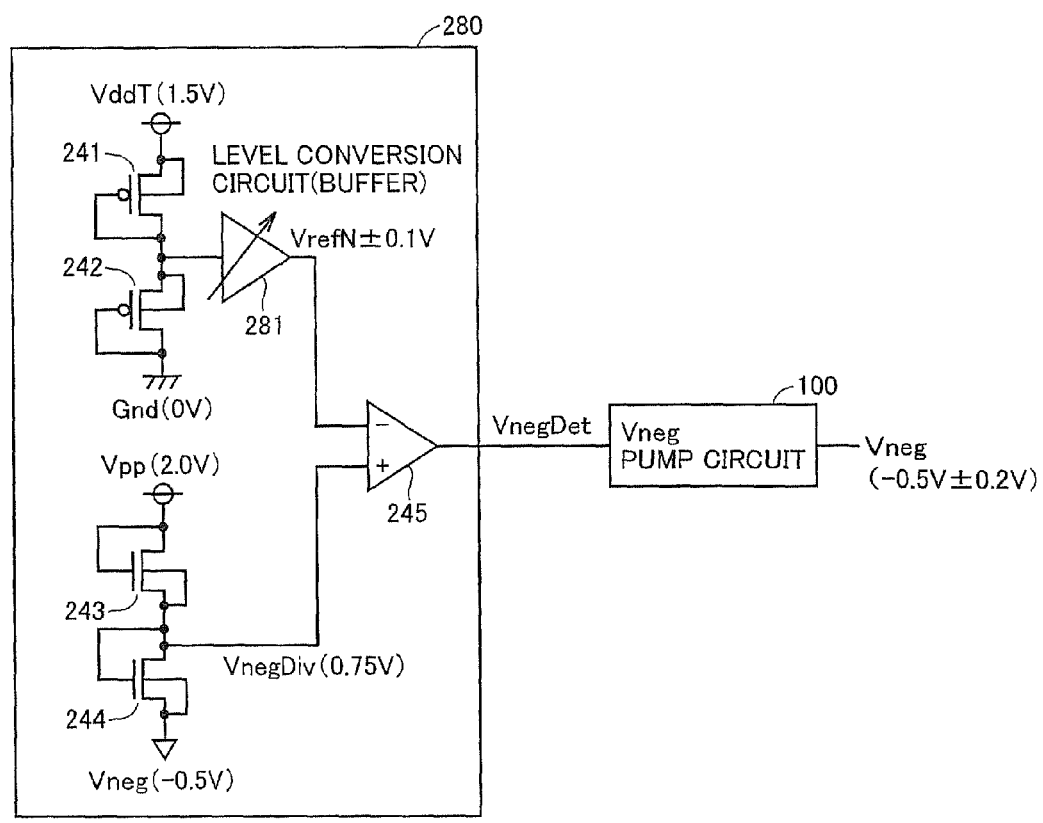
FIG. 42 illustrates main parts of an internal power generation circuit according to a thirteenth embodiment.

With reference to FIG. 42, an internal power generation circuit according to the thirteenth embodiment of the present invention includes a detector circuit 280 and a Vneg pump circuit 100.

Vneg pump circuit 100 is similar to that in the fifth embodiment; therefore, detailed description thereof will not be repeated here.

Detector circuit 240 is different from detector circuit 240 illustrated in FIG. 38 in the following point: a level conversion circuit 281 is interposed on an output node of a reference voltage VrefN.

Level conversion circuit 281 is supplied with reference voltage VrefN generated by P-channel MOS transistors 241 and 242, adds or subtracts a predetermined potential difference to or from a voltage level of reference voltage VrefN, and outputs a resultant.

The other configurations of level conversion circuit 281 are similar to those of detector circuit 240; therefore, detailed description thereof will not be repeated here.

Figure 43:
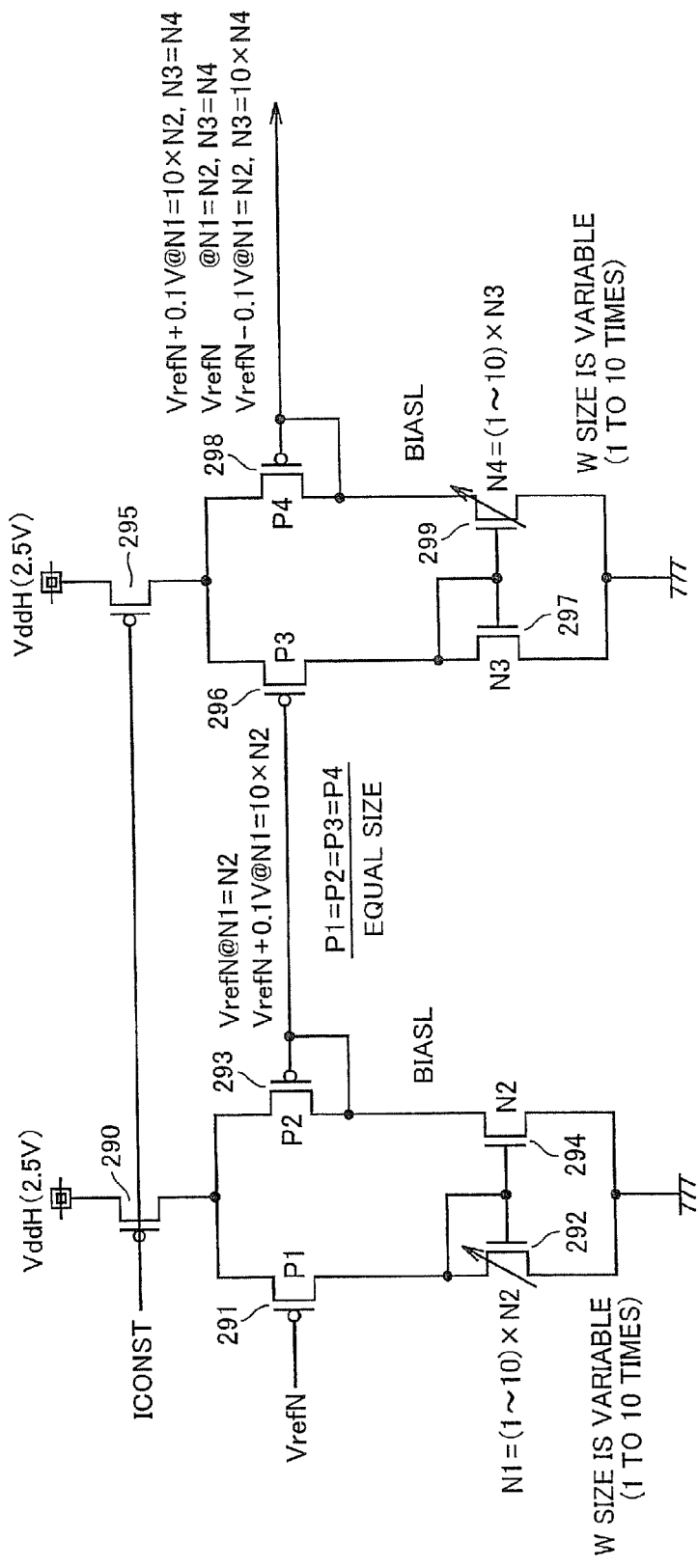
FIG. 43 is a schematic configuration diagram illustrating a level conversion circuit.

With reference to FIG. 43, level conversion circuit 281 includes P-channel MOS transistors 290, 291, 293, 295, 296, and 298, and N-channel MOS transistors 292, 294, 297, and 299.

P-channel MOS transistor 290 has a size identical to that of P-channel MOS transistor 295. P-channel MOS transistors 290 and 295 are connected to an external power supply voltage VddH. P-channel MOS transistors 290 and 295 have gates each supplied with a common constant current ICONST, and are supplied with the same current from external power supply voltage VddH.

P-channel MOS transistor 291 and N-channel MOS transistor 292 are connected in series between P-channel MOS transistor 290 and a ground voltage Gnd. P-channel MOS transistor 293 and N-channel MOS transistor 294 are connected in series between P-channel MOS transistor 290 and ground voltage Gnd.

P-channel MOS transistor 291 has a gate supplied with a reference voltage VrefN, and N-channel MOS transistors 292 and 294 have gates each connected in common to a drain of N-channel MOS transistor 292.

P-channel MOS transistor 296 and N-channel MOS transistor 297 are connected in series between P-channel MOS transistor 295 and ground voltage Gnd. P-channel MOS transistor 298 and N-channel MOS transistor 299 are connected in series between P-channel MOS transistor 295 and ground voltage Gnd.

P-channel MOS transistor 296 has a gate connected to a gate of P-channel MOS transistor 293 and, also, connected to a drain of P-channel MOS transistor 293. N-channel MOS transistors 297 and 299 have gates each connected in common to a drain of N-channel MOS transistor 297.

P-channel MOS transistor 298 has a gate connected to an output node and, also, connected to a drain of P-channel MOS transistor 298.

P-channel MOS transistors 192, 293, 296 and 298 are equal in size. P-channel MOS transistors 291 and 293, and N-channel MOS transistors 292 and 294 form a current mirror transistor. P-channel MOS transistors 296 and 298, and N-channel MOS transistors 297 and 299 form a current mirror transistor.

Each of N-channel MOS transistors 292 and 299 has a changeable channel width W. Channel width W is changed in accordance with a characteristic to be required. In the thirteenth embodiment, for example, channel width W of N-channel MOS transistor 292 is changeable within a range between one to ten times larger than a channel width W of N-channel MOS transistor 294. Similarly, channel width W of N-channel MOS transistor 299 is changeable within a range between one to ten times larger than a channel width W of N-channel MOS transistor 297.

In general, when a ratio between channel widths W of transistors is about ten times, an output potential is changed within about ±0.1 V. Therefore, by changing channel widths W of N-channel MOS transistors 292 and 299, a mirror ratio in each of the current mirror circuits is changed. For example, when channel width W of N-channel MOS transistor 292 is ten times larger than channel width W of N-channel MOS transistor 294, a voltage obtained by adding 0.1 V to a voltage supplied to the gate of P-channel MOS transistor 291 is supplied to the gate of P-channel MOS transistor 296. When channel width W of N-channel MOS transistor 299 is ten times larger than channel width W of N-channel MOS transistor 297, a voltage obtained by subtracting 0.1 V from a voltage supplied to the gate of P-channel MOS transistor 291 is output.

More specifically, N-channel MOS transistor 292 increases a reference voltage VrefN to be input within a range between 0 to 0.1 V, and N-channel MOS transistor 299 decreases a reference voltage VrefN to be input within a range between 0 to 0.1 V. Accordingly, level conversion circuit 281 can change a reference voltage VrefN to be input within a range of ±0.1 V.

With reference to FIG. 42 again, differential amplifier 245 compares a reference voltage VrefN with a negative voltage division signal VnegDiv. Herein, since the following equation: negative voltage division signal VnegDiv=(boost voltage Vpp+negative voltage Vneg)/2 is established, a change of reference voltage VrefN within a range of ±0.1 V refers to a change of negative voltage Vneg to be output within a range of ±0.2 V.

Accordingly, an internal power generation circuit according to the thirteenth embodiment can output an optimal value of negative voltage Vneg within a range of −0.5±0.2 V.

According to the thirteenth embodiment of the present invention, in addition to the effects in the twelfth embodiment, a desired negative voltage can be generated by adjustment of a reference voltage. Thus, it is possible to enhance a degree of flexibility, and apply this embodiment to various circuits.

Fourteenth Embodiment

In the ninth to thirteenth embodiments, the description is given of a case that a reference voltage has one temperature characteristic determined in advance. On the other hand, in a fourteenth embodiment, description will be given of a case that a reference voltage has a plurality of temperature characteristics.

In general, it is possible to generate internal power having a negative temperature characteristic to thereby improve a stable operation of a circuit and a lower limit characteristic of a voltage. In some cases, however, different temperature characteristics are required in accordance with specification conditions (e.g., an operation speed, an operation voltage, power consumption) of a memory. In order to design a power supply circuit, also, it is necessary to accumulate sophisticated design and simulation know-how. In order to determine an optimal temperature characteristic, it is necessary to perform large-scale SPICE simulation, resulting in prolonged time for design.

In this embodiment, there is provided power having a plurality of changeable temperature characteristics so as to satisfy various demands.

Figure 44:
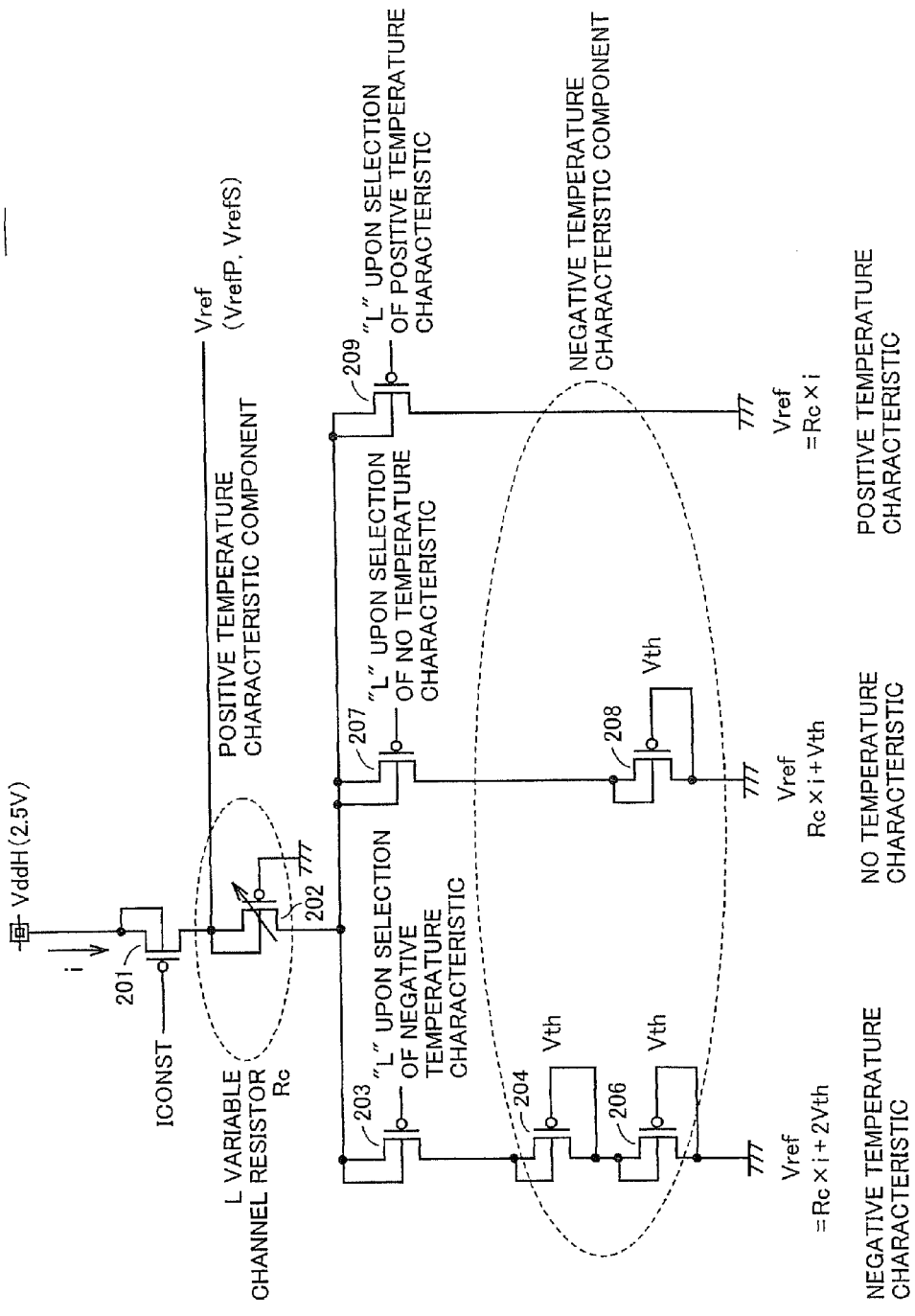
FIG. 44 is a schematic configuration diagram illustrating a reference voltage generation circuit according to a fourteenth embodiment.

With reference to FIG. 44, a reference voltage generation circuit 200 according to the fourteenth embodiment of the present invention includes P-channel MOS transistors 201, 202, 203, 204, 205, 206, 207, 208, and 209.

P-channel MOS transistor 201 is connected to an external power supply voltage VddH, and supplies a through current in accordance with a constant current ICONST supplied to a gate thereof from a constant current circuit (see FIGS. 2, 13).

P-channel MOS transistor 202 is connected to P-channel MOS transistor 201, and has a gate connected to a ground voltage Gnd. P-channel MOS transistor 202 functions as a channel resistor, and generates a potential difference between a resistance value thereof and a through current. P-channel MOS transistor 202 outputs a reference voltage VrefS or VrefP (hereinafter, VrefS or VrefP is collectively described as Vref) from a node with P-channel MOS transistor 201. Further, P-channel MOS transistor 202 has a changeable channel length L, and channel resistance is changed in accordance with a characteristic to be required.

P-channel MOS transistors 203, 207 and 209 are connected in common to a drain of P-channel MOS transistor 202. In addition, each of P-channel MOS transistors 203, 207 and 209 has a gate receiving a signal of L level in accordance with a characteristic to be required.

P-channel MOS transistors 204 and 206 are connected in series between P-channel MOS transistor 203 and ground voltage Gnd. P-channel MOS transistor 208 is connected between P-channel MOS transistor 207 and ground voltage Gnd. P-channel MOS transistors 204, 206 and 208 have sources connected drains thereof, respectively, and each function as a threshold transistor.

Hereinafter, description will be given of operations of reference voltage generation circuit 200. P-channel MOS transistor 202 functions as a channel transistor and, therefore, has a positive temperature characteristic. On the other hand, each of P-channel MOS transistors 204, 206 and 208 functions as a threshold transistor and, therefore, has a negative temperature characteristic. Accordingly, entire temperature characteristics are changed by switch of a path through which a current passes.

For example, if a reference voltage having no temperature characteristic is required, a user transmits a signal of L level to the gate of P-channel MOS transistor 207. Then, a through current supplied from P-channel MOS transistor 201 passes through P-channel MOS transistors 202, 207 and 208. Therefore, reference voltage generation circuit 200 outputs a reference voltage Vref in accordance with P-channel MOS transistors 202 and 208. Accordingly, reference voltage Vref is obtained by the following equation: reference voltage Vref=Rc×i+Vth, wherein i represents a through current, Rc represents a channel resistance of P-channel MOS transistor 202, and Vth represents threshold values of P-channel MOS transistors 204, 206 and 208.

Herein, P-channel MOS transistors 202 and 208 are selected in such a manner that a positive temperature characteristic of P-channel MOS transistor 202 and a negative temperature characteristic of P-channel MOS transistor 208 are offset each other. As a result, reference voltage generation circuit 200 outputs a reference voltage Vref having no temperature characteristic.

Next, if a reference voltage having a negative temperature characteristic is required, the user transmits a signal of L level to the gate of P-channel MOS transistor 203. Then, a through current supplied from P-channel MOS transistor 201 passes through P-channel MOS transistors 202, 203, 204, and 206. Therefore, reference voltage generation circuit 200 outputs a reference voltage Vref in accordance with P-channel MOS transistors 202, 204 and 206. Thus, reference voltage Vref is obtained by the following equation: reference voltage Vref=Rc×i+2Vth.

Herein, P-channel MOS transistors 204 and 206, each of which is identical to P-channel MOS transistor 208 are selected. As a result, since a positive temperature characteristic of each of P-channel MOS transistors 204 and 206 becomes superior, reference voltage generation circuit 200 outputs a reference voltage Vref having a negative temperature characteristic.

Similarly, if a reference voltage having a positive temperature characteristic is required, the user transmits a signal of L level to the gate of P-channel MOS transistor 209. Then, a through current supplied from P-channel MOS transistor 201 passes through P-channel MOS transistors 202 and 209. Therefore, reference voltage generation circuit 200 outputs a reference voltage Vref in accordance with P-channel MOS transistor 202. Accordingly, reference voltage Vref is obtained by the following equation: reference voltage Vref=Rc×i.

Herein, since there is no threshold transistor having a positive temperature characteristic, reference voltage generation circuit 200 outputs a reference voltage Vref having a negative temperature characteristic.

For example, when a reference voltage having a negative temperature characteristic is selected, the sense amplifier illustrated in FIG. 5 can increase a boost voltage Vpp, to be supplied to a gate, in accordance with an increase in threshold value of a transistor interposed between bit line pair BL, ZBL at a low temperature. Therefore, there arises an advantage that a margin can be ensured.

In addition, when a reference voltage having a negative temperature characteristic is selected, a boost voltage Vpp to be supplied to a memory cell can be increased in accordance with an increase in off-leak current of a memory cell at a high temperature. Therefore, there arises an advantage that excess power consumption due to an increase in refresh cycle can be suppressed.

According to the fourteenth embodiment of the present invention, since various temperature characteristics of internal power can be selected, a required temperature characteristic can be obtained in accordance with a characteristic of a circuit to be applied. Thus, this embodiment can be applied to any circuit requiring internal power.

Fifteenth Embodiment

In a fifteenth embodiment, description will be given of an intermediate voltage generation circuit with suppressed power consumption.

With reference to FIG. 23 again, intermediate voltage generation circuit 8 generates a through current passing through P-channel MOS transistor 115 and N-channel MOS transistor 118, each of which is a feedback resistor, and N-channel MOS transistor 116 and P-channel MOS transistor 117 each of which is a threshold transistor. P-channel MOS transistor 115 and N-channel MOS transistor 118 have the gates each supplied with internal voltage Vbl/Vcp to control the through current. However, the through current varies largely due to a variation in process, a change in temperature and a variation in voltage. For example, in a 130-nm generation, a through current varies within a range between 0.1 μA and 10 μA, and its variation width is about 100 times. Consequently, excess through current is generated, so that power consumption can not be suppressed in some cases.

Figure 45:
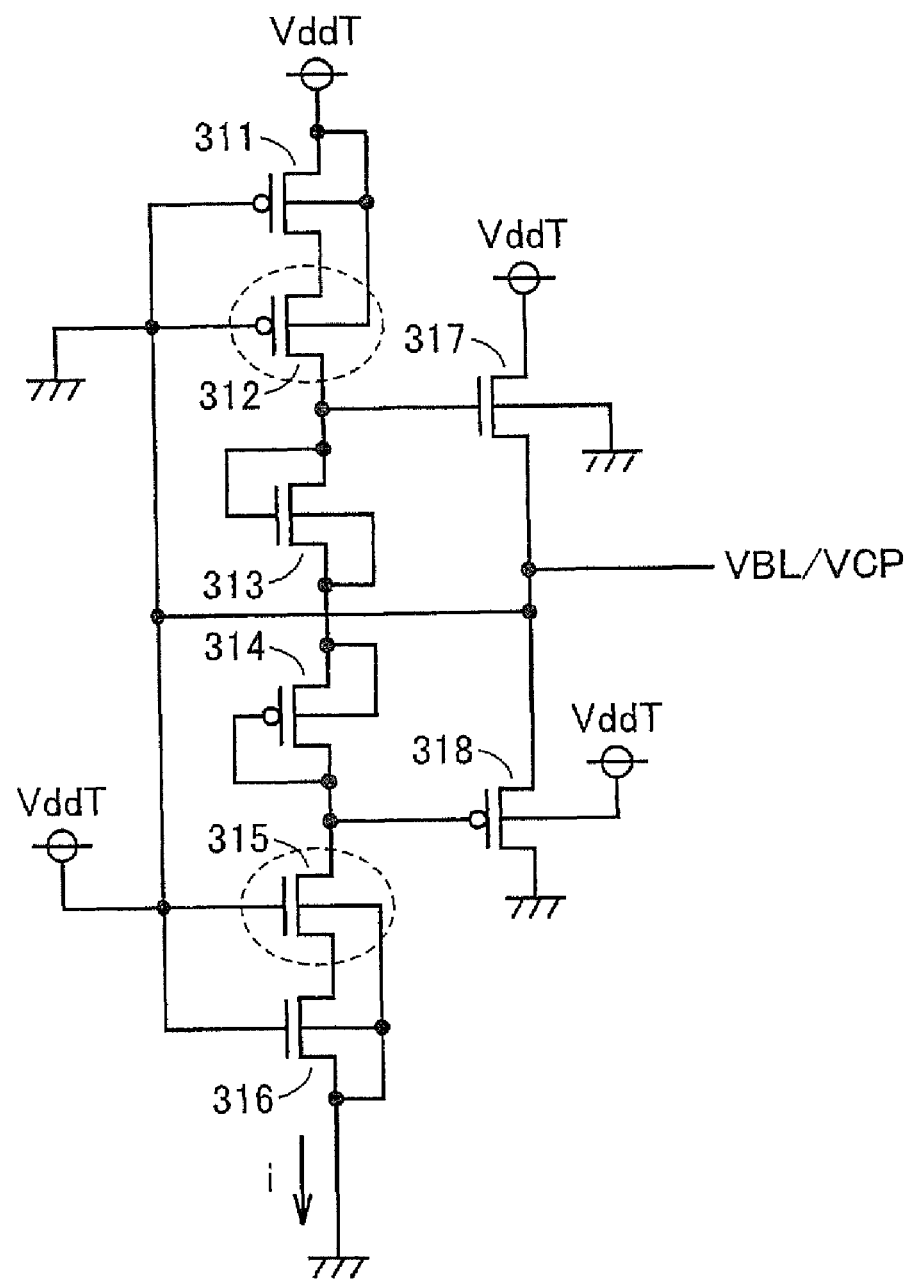
FIG. 45 illustrates an intermediate voltage generation circuit according to a fifteenth embodiment.

With reference to FIG. 45, an intermediate voltage generation circuit 310 includes P-channel MOS transistors 311, 312, 314, and 318, and N-channel MOS transistors 313, 315, 316, and 317. In intermediate voltage generation circuit 310, P-channel MOS transistor 312 serving as a constant resistor is interposed between P-channel MOS transistor 311 serving as a feedback resistor and N-channel MOS transistor 313 serving as a threshold transistor. Further, N-channel MOS transistor 315 serving as a constant resistor is interposed between N-channel MOS transistor 316 serving as a feedback resistor and P-channel MOS transistor 314 serving as a threshold transistor.

P-channel MOS transistor 312 has a gate connected to a ground voltage Gnd, and N-channel MOS transistor 315 has a gate connected to an internal buck voltage VddT. Therefore, each of P-channel MOS transistor 312 and N-channel MOS transistor 315 forms a constant channel resistance, and functions as a constant resistor.

In P-channel MOS transistor 312, further, a potential difference between an internal buck voltage VddT and an internal voltage Vbl/Vcp, that is, an intermediate voltage Vbl/Vcp becomes a maximum application voltage. In N-channel MOS transistor 315, a potential difference between an intermediate voltage Vbl/Vcp and a ground voltage Gnd, that is, an intermediate voltage Vbl/Vcp becomes a maximum application voltage. Therefore, a through current is limited to a maximum current value determined in accordance with constant resistance components of P-channel MOS transistor 312 and N-channel MOS transistor 315, and intermediate voltage Vbl/Vcp.

Thus, it is possible to suppress generation of an excess through current, and to realize low consumption of power.

According to the fifteenth embodiment of the present invention, an intermediate voltage generation circuit can limit, to a predetermined value, a through current which varies due to a variation in process, a change in temperature and a variation in voltage. Thus, it is possible to suppress an increase in power consumption against disturbances such as a variation in process, a change in temperature and a variation in voltage, and to realize low consumption of power.

In the aforementioned embodiments, the description is given of a semiconductor device including a constant current circuit; however, the present invention is not limited to this configuration. A constant current may be supplied externally, e.g., a constant current is generated by another chip by SIP (System In Package).

The aforementioned embodiments are appropriately combined for their realization.

Respective voltage values of external power supply voltages VddH and VddL, an internal buck voltage VddT, a boost voltage Vpp, a negative voltage Vneg, and intermediate voltages Vbl and Vcp are examples in the aforementioned embodiments. Therefore, it is needless to say that another voltage value is adopted as long as a relation in voltage value between external power supply voltage VddH and external power supply voltage VddL, a relation in voltage value between internal buck voltage VddT and boost voltage Vpp, a relation in voltage value between ground voltage Gnd and negative voltage Vneg, and relation in voltage value among reference voltages Vref, VrefP, VrefS, and VrefN are similar to one another.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
a first power supply pad, externally supplying a first external voltage;
a second power supply pad, externally supplying a second external voltage lower than said first external voltage;
a third power supply pad, externally supplying a ground voltage lower than said second external voltage;
a power supply module for stepping down said first external voltage to supply an internal voltage;
a logic circuit portion for performing a logical operation based on data to be input; and
a memory macro, wherein
said memory macro includes:
a memory array having a plurality of memory cells, each holding data to be used in said logic circuit portion, arranged in a matrix;
a first load circuit having a sense amplifier for sensing data on a bit line connected to a memory cell, said first load circuit being supplied with said internal voltage; and
a second load circuit having a data input/output circuit for performing data input/output between said logic circuit portion and a memory cell, said second load circuit being supplied with said second external voltage.

2. The semiconductor device according to claim 1, wherein said memory macro further includes a first level conversion circuit for converting an input signal having a voltage level of said second external voltage to a first signal having a voltage level of said internal voltage to output the first signal, and
said first load circuit further includes a row/column decoder for selecting one of the rows and one of the columns in said memory array.

3. The semiconductor device according to claim 2, wherein said memory macro further includes a second level conversion circuit for converting an input signal having a voltage level of said internal voltage to a second signal having a voltage level of said second external voltage to output the second signal,
said first level conversion circuit receives, as said input signal, an address signal indicating a row address and a column address in the memory array, and a command signal indicating an operation of said memory macro, each supplied to said memory macro, and outputs said first signal,
said first load circuit further includes a control circuit for receiving said first signal and outputting a signal to said row/column decoder and said second level conversion circuit, respectively,
said second load includes a data path connected between said sense amplifier and said data input/output circuit, and
said second level conversion circuit receives an output signal from said control circuit as said input signal, and outputs said second signal to said data path.

4. The semiconductor device according to claim 2, wherein said memory macro further includes a third level conversion circuit for converting an input signal having a voltage level of said internal voltage to a third signal having a voltage level of said second external voltage to output the third signal, and converting an input signal having a voltage level of said second external voltage to a fourth signal having a voltage level of said internal voltage to output the fourth signal,
said first level conversion circuit receives an address signal indicating a row address and a column address in the memory array and a command signal indicating an operation of said memory macro, each supplied to said memory macro, as said input signal, and outputs said first signal,
said first load circuit further includes:
a control circuit for receiving said first signal, and outputting a signal to said row/column decoder; and
a data path connected between said sense amplifier and said third level conversion circuit, and said third conversion level circuit outputs said third signal to said data input/output circuit and outputs said fourth signal to said data path.

5. The semiconductor device according to claim 2, wherein said first level conversion circuit is supplied with said internal voltage supplied from said power supply module to drive said first level conversion circuit, said power supply module includes a standby circuit for receiving a standby instruction signal for stopping input/output of data to/from said logic circuit portion via said data input/output circuit, and blocking the supply of said internal voltage, and upon blocking the supply of said internal voltage and, then, restarting the supply of said internal voltage, said standby circuit restricts said first level conversion circuit to output said first signal until said internal voltage to be supplied to said first level conversion circuit is recovered to a predetermined voltage value.

6. The semiconductor device according to claim 2, wherein said second load circuit includes:

a control circuit for receiving an address signal indicating a row address and a column address in the memory array and a command signal indicating an operation of said memory macro, each supplied to said memory macro, as an input signal, and outputting the input signal to said first level conversion circuit; and a data path connected between said sense amplifier and said data input/output circuit, and said first level conversion circuit receives an output signal from said control circuit as said input signal and outputs said first signal to said row/column decoder.

7. A semiconductor device supplied a first external voltage and a second external voltage, supplied externally, comprising;

a power supply module supplied with said first external voltage;

a logic circuit portion for performing a logical operation based on data to be input, said logic circuit portion supplied with said second external voltage; and a memory macro, wherein said memory macro includes:

a memory array having a plurality of memory cells, each holding data to be used in said logic circuit portion, arranged in a matrix;

a first load circuit having a sense amplifier for sensing data on a bit line connected to a memory cell; and a second load circuit having a data input/output circuit for performing data input/output between said logic circuit portion and a memory cell, said second load circuit being supplied with said second external voltage, wherein said power supply module for stepping down said first external voltage to supply said memory array and said first load circuit with a internal voltage lower than said first internal voltage.

8. A semiconductor device comprising:

a first power supply pad, externally supplying a first external voltage;

a second power supply pad, externally supplying a second external voltage lower than said first external voltage;

a third power supply pad, externally supplying a ground voltage lower than said second external voltage;

a power supply module for bucking said first external voltage to supply an internal buck voltage;

a logic circuit portion for performing a logical operation based on data to be input; and a memory macro, wherein said memory macro includes:

a memory array having a plurality of memory cells, each holding data to be used in said logic circuit portion, arranged in a matrix;

a first load circuit having a sense amplifier for sensing data on a bit line connected to a memory cell, said first load circuit being supplied with said internal buck voltage; and a second load circuit having a data input/output circuit for performing data input/output between said logic circuit portion and a memory cell, said second load circuit being supplied with said second external voltage, wherein said second load circuit further includes a row decoder for selecting one of rows in said memory array, a column decoder for selecting one of columns in said memory array, a data path connected between said sense amplifier and said data input/output circuit, and a control circuit for receiving a first signal and outputting control signals to said row decoder, said column decoder and said data path, respectively.

* * * * *